US00RE41228E

(19) United States
(12) Reissued Patent
Kodosky et al.

(10) Patent Number: US RE41,228 E
(45) Date of Reissued Patent: Apr. 13, 2010

(54) SYSTEM AND METHOD FOR CONFIGURING A PROGRAMMABLE HARDWARE INSTRUMENT TO PERFORM MEASUREMENT FUNCTIONS UTILIZING ESTIMATION OF THE HARDWARE IMPLEMENTATION AND MANAGEMENT OF HARDWARE RESOURCES

(75) Inventors: Jeffrey L. Kodosky, Austin, TX (US); Hugo Andrade, Austin, TX (US); Brian Keith Odom, Georgetown, TX (US); Cary Paul Butler, Austin, TX (US); Andrew Mihal, San Jose, CA (US)

(73) Assignee: National Instruments Corporation, Austin, TX (US)

(21) Appl. No.: 11/801,107

(22) Filed: May 7, 2007

Related U.S. Patent Documents

Reissue of:
(64) Patent No.: 6,608,638
Issued: Aug. 19, 2003
Appl. No.: 09/499,503
Filed: Feb. 7, 2000

U.S. Applications:
(63) Continuation-in-part of application No. 08/912,427, filed on Aug. 18, 1997, now Pat. No. 6,219,628.

(51) Int. Cl.
*G06F 3/048* (2006.01)

(52) U.S. Cl. ..... 715/771; 715/773; 715/839; 717/130; 717/133; 702/1; 702/57

(58) Field of Classification Search ..... 715/711, 715/772, 773, 839; 702/1, 57; 717/130, 133; 709/224
See application file for complete search history.

(56) References Cited

U.S. PATENT DOCUMENTS 5,555,201 A * 9/1996 Dangelo et al. ..... 716/1
5,603,043 A * 2/1997 Taylor et al. ..... 712/1
5,673,198 A * 9/1997 Lawman et al. ..... 716/11

(Continued)

OTHER PUBLICATIONS

"Signal ProcessingWorkSystem, Hardware Design System User's Guide"; May 1996; 10 pages; Alta Group of Cadence Design Systems, Inc.

(Continued)

*Primary Examiner*—Tadeese Hailu
(74) *Attorney, Agent, or Firm*—Meyertons Hood Kivlin Kowert & Goetzel, P.C.; Jeffrey C. Hood

(57) ABSTRACT

A computer-implemented system and method for generating a hardware implementation of graphical code. The method may operate to configure an instrument to perform measurement functions, wherein the instrument includes a programmable hardware element. The method comprises first creating a graphical program, wherein the graphical program may implement a measurement function. A portion of the graphical program may optionally be compiled into machine code for execution by a CPU, and another portion of the graphical program may be converted into a hardware implementation on a programmable hardware element. The programmable hardware element is configured utilizing a hardware description to produce a configured hardware element. The configured hardware element thus implements a hardware implementation of the second portion of the graphical program. During generation of the hardware implementation, the computer system may operate to estimate and/or display one or more of size and cost of a hardware implementation of the graphical program. In one embodiment, the graphical program manipulates one or more hardware resources of an instrument, and an indication of usage of the one or more hardware resources are displayed during creation of the graphical program. Probes may also be inserted into the graphical program, wherein corresponding probe elements are placed in the hardware implementation to implement the probe function.

87 Claims, 38 Drawing Sheets

U.S. PATENT DOCUMENTS

| | | | | | |
|---|---|---|---|---|---|
| 5,732,277 | A | * | 3/1998 | Kodosky et al. | |
| 5,987,246 | A | * | 11/1999 | Thomsen et al. | 717/109 |
| 6,044,211 | A | | 3/2000 | Jain | |
| 6,212,566 | B1 | * | 4/2001 | Vanhoof et al. | 709/231 |
| 6,219,628 | B1 | * | 4/2001 | Kodosky et al. | 703/2 |
| 6,226,776 | B1 | * | 5/2001 | Panchul et al. | 716/3 |
| 6,230,307 | B1 | * | 5/2001 | Davis et al. | 716/16 |

OTHER PUBLICATIONS

"Signal ProcessingWorkSystem, Designer/BDE User's Guide"; Feb. 1996; 2 pages; Alta Group of Cadence Design Systems, Inc.

"Signal ProcessingWorkSystem, HDS Library Reference"; May 1996; 6 pages; Alta Group of Cadence Design Systems, Inc.

Wayne H. Wolf, "How to Build a Hardware Description and Measurement System on an Object–Oriented Programming Language," IEEE, 1989, pp. 288–301.*

Ade, M; Lauwereins, R; Peperstraete, J.A.; Hardware–Software Codedesign with Grape, Proceedings of the Sixth IEEE International Workshop on Rapid System Prototyping, pp. 40–47, Jun. 1995.*

De Coster, Grape–II: An Introductiona1[online].Automatic Control and Computer Architectures Department. Katholieke Universiteit Leuven, Belgium, Feb. 22, 1996 [retrieved Oct. 6, 1999] Retrieved from the Internet @ http://www.e–sat.kuleuven.ac.be/acca.*

Wenban et al., A software Development System for FPGA—based Data Acquisition Systems, Proceedings of the IEEE Symposium on FPGAs for Custom Computing Machines, pp. 28–37, Apr. 1996.*

Collamati et al. "Induction Machine Stator Fault On–line Diagnosis Based on LabVIEW Environment", Mediterranean Electrotechnical Conference, vol. 1, p. 495–498, May 1996.*

Spoelder et al., "Virtual Instrumentation: A Survey of Standards and Their Interrelation", Proc. IEEE Instr. And Measurement Tech. Conf., vol. 1, pp. 676–681, May 1997.*

Srinivasan et al., "LabVIEW program Design for On–Line Data Acquisition and Predictive Maintenance", Proc. Of the 30th Southeastern Symp. On System Theory, pp. 520–524, Mar. 1998.*

Wahidanabanu et al., "Virtual Instrumentation with Graphical Programming for Enhanced Detection and Monitoring of Partial Descharges", Proc. Electrical Insulation Conf. 1997, pp. 291–296, Sep. 1997.*

* cited by examiner exampleI.vi
example1_vi
example1.vi

SYSTEM AND METHOD FOR CONFIGURING A PROGRAMMABLE HARDWARE INSTRUMENT TO PERFORM MEASUREMENT FUNCTIONS UTILIZING ESTIMATION OF THE HARDWARE IMPLEMENTATION AND MANAGEMENT OF HARDWARE RESOURCES

Matter enclosed in heavy brackets [ ] appears in the original patent but forms no part of this reissue specification; matter printed in italics indicates the additions made by reissue.

*This application is a continuation-in-part of U.S. patent application Ser. No. 08/912,427 titled "System and Method for Configuring an Instrument to Perform Measurement Functions Utilizing Conversion of Graphical Programs into Hardware Implementations", filed on Aug. 18, 1997, whose inventors are Jeffrey L. Kodosky, Hugo Andrade, Brian Keith Odom and Cary Paul Butler, which is now U.S. Pat. No. 6,219,628.*

FIELD OF THE INVENTION

The present invention relates to graphical programming, and in particular to a system and method for converting a graphical program into a hardware implementation. The present invention further relates to a system and method for configuring an instrument to perform measurement functions, wherein the instrument includes a programmable hardware element

DESCRIPTION OF THE RELATED ART

Traditionally, high level text-based programming languages have been used by programmers in writing applications programs. Many different high level programming languages exist, including BASIC, C, FORTRAN, Pascal, COBOL, ADA, APL, etc. Programs written in these high level languages are translated to the machine language level by translators known as compilers or interpreters. The high level programming languages in this level, as well as the assembly language level, are referred to as text-based programming environments.

Increasingly computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, mathematical steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptually model a system and then to program a computer to model that system. Since a user often is not fully proficient in techniques for programming a computer system in a text-based environment to implement his model, the efficiency with which the computer system can be utilized to perform such modeling often is reduced.

Examples of fields in which computer systems are employed to model and/or control physical systems are the fields of instrumentation, process control, industrial automation, and simulation. Computer modeling or control of devices such as instruments or industrial automation hardware has become increasingly desirable in view of the increasing complexity and variety of instruments and devices available for use. However, due to the wide variety of possible testing/control situations and environments, and also the wide array of instruments or devices available, it is often necessary for a user to develop a program to control a desired system. As discussed above, computer programs used to control such systems had to be written in conventional text-based programming languages such as, for example, assembly language, C, FORTRAN, BASIC, or Pascal. Traditional users of these systems, however, often were not highly trained in programming techniques and, in addition, traditional text-based programming languages were not sufficiently intuitive to allow users to use these languages without training. Therefore, implementation of such systems frequently required the involvement of a programmer to write software for control and analysis of instrumentation or industrial automation data. Thus, development and maintenance of the software elements in these systems often proved to be difficult.

U.S. Pat. Nos. 4,901,221; 4,914,568; 5,291,587; 5,301,301; and 5,301,336; among others, to Kodosky et al disclose a graphical system and method for modeling a process, i.e., a graphical programming environment which enables a user to easily and intuitively model a process. The graphical programming environment disclosed in Kodosky et al can be considered the highest and most intuitive way in which to interact with a computer. A graphically based programming environment can be represented at a level above text-based high level programming languages such as C, Pascal, etc. The method disclosed in Kodosky et al allows a user to construct a diagram using a block diagram editor, such that the diagram created graphically displays a procedure or method for accomplishing a certain result, such as manipulating one or more input variables to produce one or more output variables. In response to the user constructing a data flow diagram or graphical program using the bock diagram editor, data structures are automatically constructed which characterize an execution procedure which corresponds to the displayed procedure. The graphical program may be compiled or interpreted by a computer. Therefore, a user can create a computer program solely by using a graphically based programming environment. This graphically based programming environment may be used for creating virtual instrumentation systems, industrial automation systems, modeling processes, and simulation, as well as for any type of general programming.

Therefore, Kodosky et al teaches a graphical programming environment wherein a user places or manipulates icons in a block diagram using a block diagram editor to create a data flow "program." A graphical program for controlling or modeling devices, such as instruments, processes or industrial automation hardware, may be referred to as a virtual instrument (VI). In creating a virtual instrument, a user may create a front panel or user interface panel. The front panel includes various user interface elements or front panel objects, such as controls or indicators, that represent or display the respective input and output that will be used by the graphical program or VI, and may include other icons which represent devices being controlled. The front panel may be comprised in a single window of user interface elements, or may comprise a plurality of individual windows each having a user interface element, wherein the individual windows may optionally be tiled together. When the controls and indicators are created in the front panel, corresponding icons or terminals may be automatically created in the block diagram by the block diagram editor. Alternatively, the user can place terminal icons in the block diagram which may cause the display of corresponding front panel objects in the front panel, either at edit time or later at run time. As another example, the front panel objects may be embedded in the block diagram.

During creation of the graphical program, the user may selects various function nodes or icons that accomplish his desired result and connects the function nodes together. For example, the function nodes may be connected in a data flow or control flow format. The function nodes may be connected between the terminals of the respective controls and indicators. Thus the user may create or assemble a data flow program, referred to as a block diagram, representing the graphical data flow which accomplishes his desired process. The assembled graphical program may then be compiled or interpreted to produce machine language that accomplishes the desired method or process as shown in the block diagram.

A user may input data to a virtual instrument using front panel controls. This input data may propagate through the data flow block diagram or graphical program and appear as changes on the output indicators. In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators. Alternatively, the front panel may be used merely to view the input and output, and the input may not be interactively manipulable by the user during program execution.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, simulation, and machine vision applications, among others.

A primary goal of graphical programming, including virtual instrumentation, is to provide the user the maximum amount of flexibility to create his/her own applications and/or define his/her own instrument functionality. In this regard, it is desirable to extend the level at which the user is able to program a device, e.g., extend the level at which a user of instrumentation or industrial automation hardware is able to program an instrument. The evolution of the levels at which the user has been able to program an instrument is essentially as follows.

1. User level software (LabVIEW, LabWindows CVI, Visual Basic, etc.)
2. Kernel level software
3. Auxiliary kernel level software (a second kernel running along side the main OS, e.g., InTime, VentureCom, etc.)
4. Embedded kernel level software
5. Hardware level software (FPGA—the present patent application)

In general, going down the above list, the user is able to create software applications which provide a more deterministic real-time response. Currently, most programming development tools for instrumentation or industrial automation provide an interface at level 1 above. In general, most users are unable and/or not allowed to program at the kernel level or auxiliary kernel level. The user level software typically takes the form of software tools that can be used to create software which operates at levels 1 and/or 4.

Current instrumentation solutions at level 5 primarily exist as vendor-defined solutions, i.e., vendor created modules. However, it would be highly desirable to provide the user with the ability to develop user level software which operates at the hardware level. More particularly, it would be desirable to provide the user with the ability to develop high level software, such as graphical programs, which can then be readily converted into hardware level functionality. This would provide the user with the dual benefits of being able to program device functionality at the highest level possible (text-based or graphical programs), while also providing the ability to have the created program operate directly in hardware for increased speed and efficiency.

SUMMARY OF THE INVENTION

The present invention comprises a computer-implemented system and method for automatically generating hardware level functionality, e.g., programmable hardware such as FPGAs or CPLDs, in response to a graphical program created by a user. This provides the user the ability to develop or define desired functionality using graphical programming techniques, while enabling the resulting program to operate directly in hardware.

The user first creates a graphical program which performs or represents the desired functionality. The graphical program may include one or more modules or a hierarchy of subprograms. In the preferred embodiment, the user may place various constructs in portions of the graphical program to aid in conversion of these portions into hardware form. As the user creates or assembles the graphical program on the display, data structures are automatically created and stored in memory corresponding to the graphical program being created.

The user may then select an option to convert the graphical program into executable form, wherein at least a portion of the graphical program is converted into a hardware implementation. According to one embodiment of the present invention, the user can select which portions of modules (or sub-VIs) are to be translated into hardware form, either during creation of the graphical program or when selecting the option to convert the graphical program into executable form. Thus the user can select a first portion of the graphical program, preferably comprising the supervisory control and display portion of the program, to be compiled into machine language for execution on a CPU. The user can select a second portion of the graphical program which is desired for hardware implementation. Alternatively, the selection of portions of the graphical program to be compiled for execution by the host CPU or to be provided for hardware implementation may be automatically performed by the system.

The portion of the graphical program selected for hardware implementation may first be converted to an abstract hardware graph, also referred to as a VDiagram tree. More specifically, the data structures corresponding to the graphical program may be converted into the abstract hardware graph or VDiagram tree. Thus the conversion may not be a one-step process of generating a hardware description directly from graphical program internal data structures, but rather preferably involves the VDiagram intermediate format. The VDiagram tree comprises data structures representing the functional objects of the graphical program and the data flow between them. VDiagrams are described in detail below.

The VDiagram tree may be parsed by a back end program module which generates a specific hardware description from the tree, such as a VHDL or EDIF hardware description. The hardware description may then converted into a hardware netlist. Netlists for various types of hardware devices may be created from a hardware description (e.g., FPGA-specific netlists, CPLD-specific netlists, etc.). As used herein, the term "netlist" comprises various intermediate hardware-specific description formats comprising information regarding the particular hardware elements required to implement a hardware design and the relationship among those elements. For example, the back end may generate a VHDL file containing a hardware description of the graphical program. An FPGA-specific netlist may then be created from the VHDL file, wherein the netlist comprises information regarding the various FPGA components (and the logical relationship among those components) necessary to implement the hardware design described in the VHDL file.

The process of converting a hardware description such as a VHDL file into a netlist may be performed by readily available synthesis tools, as is well known in the art. The netlist may then be compiled into a hardware program file (also called a software bit stream) which may be used to program a programmable logic device (PLD) such as an FPGA or a CPLD, or other types of (re)configurable hardware devices. In the preferred embodiment, the hardware description is converted into an FPGA program file.

The step of compiling the resulting netlist into a PLD program file preferably uses a library of pre-compiled function blocks to aid in the compilation, as well as hardware target specific information. The library of pre-compiled function blocks includes netlist libraries for programmatic structures, such as for/next loops, while/do loops, case structures, and sequence structures, among others. This allows the user to program with high-level programming constructs, such as iteration, looping, and case structures, while allowing the resulting program to execute directly in hardware.

The resulting bit stream is then transferred to a PLD or other (re)configurable hardware device such as an FPGA to produce a programmed hardware device equivalent to the graphical program or block diagram.

The preferred embodiment of the invention comprises a general purpose computer system which includes a CPU and memory, and an interface card or device coupled to the computer system which includes programmable hardware or logic, such as an FPGA. The computer system includes a graphical programming system which is used to develop the graphical program. The computer system also includes software according to the present invention which is operable to convert the graphical program into an abstract hardware graph, and then convert the abstract hardware graph into a hardware description. The computer system further includes a synthesis tool which is used to compile the hardware description into a netlist, as well as other tools for converting the netlist into a PLD program file for uploading into the PLD. The computer system further includes a library of pre-compiled function blocks according to the present invention which are used by the synthesis tool to aid in creating the netlist.

As described above, in the preferred embodiment, a user creates a graphical program and then uses the system and method of the present invention to convert at least a portion of the graphical program into a hardware description. The hardware description may then be converted to a hardware program which executes on a PLD. The present invention thus extends the traditional model of software development to include the possibility of running at least a portion of a program on hardware created specifically for the program instead of running the entire program on the general-purpose processor.

However, it is noted that the use of the present invention is not limited to the creation of application programs as described above. The present invention comprises a system and method to create an abstract hardware graph from a graphical program. Various back end programs may be called to generate disparate types of hardware descriptions from the abstract hardware graph. These hardware descriptions may be used for purposes other than creating a bit stream for programming a PLD. For example, a hardware description may be used in the process of creating and printing a traditional circuit board which may be produced in mass quantities.

It is also noted that various back end programs may be called to generate software source code, such as C language code, from the abstract hardware graph. As described in detail below, the abstract hardware graph (VDiagram tree) generated by the present invention contains information regarding the execution order and data flow of the graphical program. This information may be used to establish a procedural order in a traditional programming language. Also, since the execution order for portions of a graphical program may be inherently parallel, the system and method of the present invention are well-suited for creating a program in a text-based parallel programming language.

In one embodiment, the target device including the reconfigurable hardware or PLD being programmed comprises a measurement device or card in the computer system, such as a data acquisition device or card, a GPIB interface card, a VXI interface card, or other measurement device. In an alternate embodiment, the target device being programmed comprises an instrument or device connected to the computer, such as through a serial connection. It is noted that the target instrument or device being programmed, which includes a PLD or other (re)configurable hardware element, can take any of various forms, as desired.

Thus the method may operate to configure an instrument to perform measurement functions, wherein the instrument includes a programmable hardware element. First, the method creates a graphical program, wherein the graphical program implements a measurement function. The computer system may then estimate and then optionally display one or more of the size and cost of a hardware implementation of the graphical program.

In one embodiment, for example where the graphical program implements a measurement function, the graphical program manipulates one or more hardware resources of the instrument. Examples of hardware resources include A/D converters, D/A converters, timers, counters, clocks, etc. In this embodiment, creating the graphical program includes displaying an indication of usage, or the status of usage, of the one or more hardware resources during creation of the graphical program.

In another embodiment, the user may insert a probe at a location in the graphical program, wherein the probe is operable to display data generated at the location during execution of the graphical program. In this embodiment, the configured hardware element includes the probe element for implementing probing in the configured hardware element.

It is noted that non real-time clock cycle observations are possible in current FPGA's, such as Xilinx FPGAs, without external/explicit hooks. However, explicit probes/probe interfaces on the program of the FPGA allow external visibility and real-time performance.

The method then generates a hardware description based on at least a portion of the graphical program, wherein the hardware description describes a hardware implementation of the at least a portion of the graphical program. The programmable hardware element is then configured in the instrument utilizing the hardware description to produce a configured hardware element, wherein the configured hardware element implements a hardware implementation of the at least a portion of the graphical program. After the hardware element has been configured, the system may be executed. During execution, the instrument acquires a signal from an external source, and the programmable hardware element in the instrument executes to perform the measurement function on the signal.

BRIEF DESCRIPTION OF THE DRAWINGS

A better understanding of the present invention can be obtained when the following detailed description of the preferred embodiment is considered in conjunction with the following drawings, in which:

FIGS. 30 and 31 illustrate a simple example of operation of the present invention, wherein FIG. 30 illustrates a simple graphical program and FIG. 31 is a conceptual diagram of the hardware description of the graphical program of FIG. 30;

FIGS. 32–34 illustrate another example of operation of the present invention, wherein FIG. 32 illustrates a graphical program, FIG. 33 illustrates a tree of data structures created in response to the graphical program of FIG. 32, and FIG. 34 is a conceptual diagram of the hardware description of the graphical program of FIG. 32.

Figure 1:
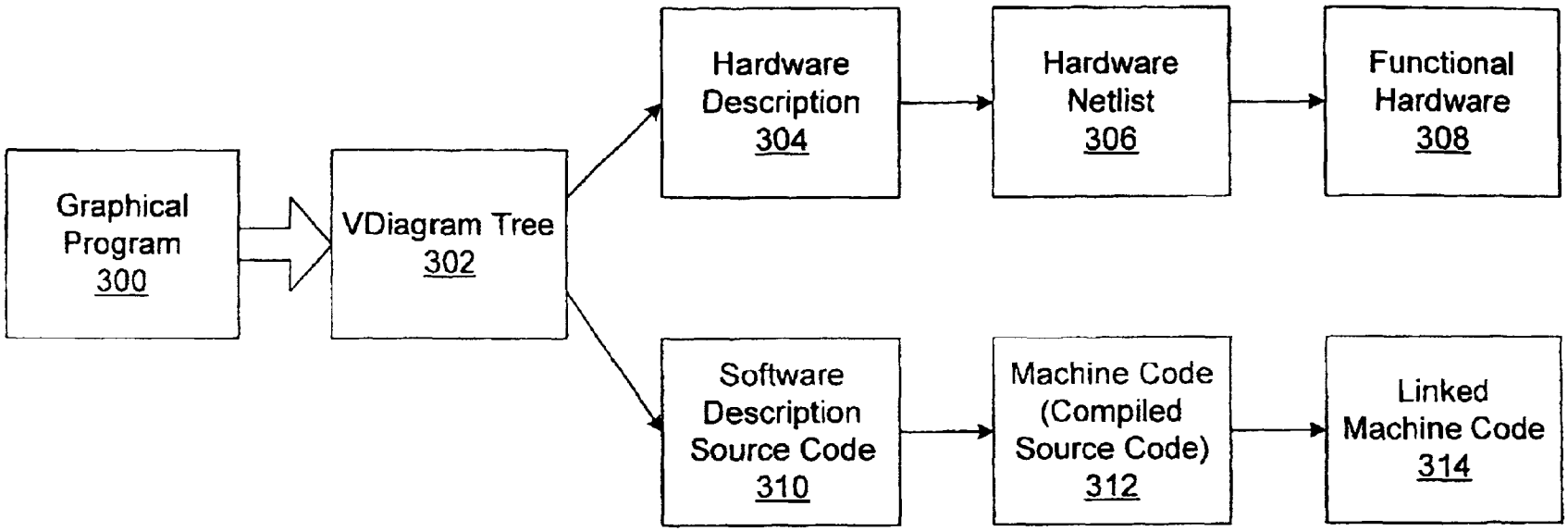
FIG. 1 illustrates the conversion of a graphical program to hardware and software implementations.

While the invention is susceptible to various modifications and alternative forms specific embodiments are shown by way of example in the drawings and will herein be described in detail. It should be understood however, that drawings and detailed description thereto are not intended to limit the invention to the particular form disclosed. But on the contrary the invention is to cover all modifications, equivalents and alternative following within the spirit and scope of the present invention as defined by the appended claims.

DETAILED DESCRIPTION OF THE PREFERRED EMBODIMENT

Incorporation by Reference

The following U.S. Patents and patent applications are hereby incorporated by reference in their entirety as though fully and completely set forth herein.

U.S. Pat. No. 4,901,221 titled "Graphical System for Modeling a Process and Associated Method," issued on Feb. 13, 1990.

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. patent application Ser. No. 08/292,091 filed Aug. 17, 1994, titled "Method and Apparatus for Providing Improved Type Compatibility and Data Structure Organization in a Graphical Data Flow Diagram".

U.S. Pat. No. 5,475,851 titled "Method and Apparatus for Improved Local and Global Variable Capabilities in a Graphical Data Flow Program".

U.S. Pat. No. 5,497,500 titled "Method and Apparatus for More Efficient Function Synchronization in a Data Flow Program".

U.S. patent application Ser. No. 08/474,307 titled "Method and Apparatus for Providing Stricter Data Type Capabilities in a Graphical Data Flow Environment" filed Jun. 7, 1995.

U.S. Pat. No. 5,481,740 titled "Method and Apparatus for Providing Autoprobe Features in a Graphical Data Flow Diagram".

U.S. patent application Ser. No. 08/870,262 titled "System and Method for Detecting Differences in Graphical Programs" filed Jun. 6, 1997, whose inventor is Ray Hsu.

U.S. patent application Ser. No. 08/912,445 titled "Embedded Graphical Programming System" filed Aug. 18, 1997, whose inventors are Jeffrey L. Kodosky, Darshan Shah, Samson DeKey, and Steve Rogers.

The above-referenced patents and patent applications disclose various aspects of the LabVIEW graphical programming and development system.

The LabVIEW and BridgeVIEW graphical programming manuals, including the "G Programming Reference Manual", available from National Instruments Corporation, are also hereby incorporated by reference in their entirety.

FIG. 1—Block Diagram

FIG. 1 is a block diagram illustrating the conversion of a graphical program into hardware and software descriptions. The graphical program 300 comprises graphical code, such as interconnected function nodes or icons. The graphical code in the graphical program may use graphical data flow and/or graphical control flow constructs. On the display, the graphical program is represented as interconnected icons or function nodes. In the memory of the computer system, the graphical program 300 comprises data structures representing functional operations, data flow and/or control flow, and execution order. As the user assembles the graphical program on the display, e.g., by selecting, arranging, and connecting various icons or function nodes on the display, the data structures are automatically created and stored in memory.

The graphical program 300 may be created with various development tools. For example, the graphical program may be created using the following development systems: LabVIEW, BridgeVIEW, DASYLab, Visual Designer, HP VEE (Visual Engineering Environment), Snap-Master, GFS DiaDem, ObjectBench, Simulink, WiT, Vision Program Manager, Hypersignal, VisiDAQ, VisSim, Truly Visual, and Khoros, among others. In the preferred embodiment, graphical program 300 is a LabVIEW graphical program or virtual instrument (VI).

Programs of the present invention create the VDiagram tree 302 from the data structures of the graphical program 300. The VDiagram tree 302 is an abstract hardware graph which represents at least a portion of the graphical program 300. The graph is organized in a way that facilitates the generation of specific types of descriptions by back end programs of the present invention. In one embodiment, the graphical programming system automatically creates and stores a VDiagram tree 302 (abstract hardware graph) in response to a user's creation of a graphical program. In this instance, conversion from graphical program data structures to a VDiagram tree is not necessary.

A hardware description 304 may be generated from the abstract hardware graph 302 by a back end program. The hardware description 304 may be in various hardware description languages such as VHDL, EDIF, and Verilog. In the preferred embodiment, the hardware description 304 comprises one or more VHDL files. A hardware netlist 306 may be generated from the hardware description using various synthesis tools. As noted above, the term "netlist" comprises various intermediate hardware-specific description formats comprising information regarding the particular hardware elements required to implement a hardware design and the relationship among those elements. In the preferred embodiment, the hardware netlist 306 is an FPGA-specific netlist. The hardware netlist 306 is used to create or configure one or more functional hardware devices or hardware elements 308 which are configured to execute the portion of the graphical program 300 that is represented by the abstract hardware graph 302.

Hardware element 308 may comprise any of various devices. For example, hardware 308 may comprise a programmable logic device (PLD) such as an FPGA or CPLD. However, hardware 308 may comprise other types of hardware devices, such as a traditional circuit board which is created using the hardware netlist 306. In the preferred embodiment, hardware 308 is an interface card comprising an FPGA, wherein the interface card is comprised in the computer system where the graphical program 300 is created. The hardware 308 may also be comprised in an external device connected to the computer system where the graphical program 300 is created. The hardware 308 may be connected to the computer over an external serial or parallel bus, or over a network, such as the Internet.

As shown in FIG. 1, software description source code 310 may also be generated from the abstract hardware graph 302 by a back end program. The source code 310 may be in various source code languages such as C, C++, Java, etc. Machine code 312 may be produced from the source code 310 using various source code compilers. Linked machine code 314 may be produced from the machine code 312 using various machine code linkers. The linked machine code 314 is executable to perform the operations of the portion of the graphical program 300 that is represented by the abstract hardware graph 302.

Figure 2:
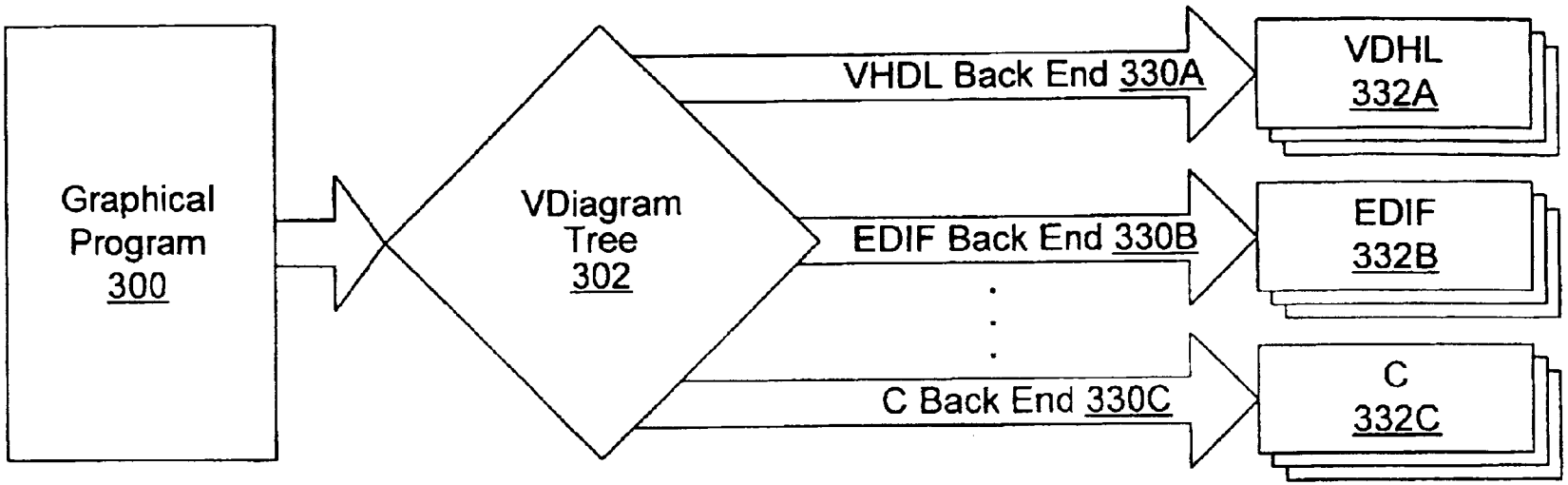
FIG. 2 illustrates the generation of various types of hardware and software descriptions from a VDiagram tree.

FIG. 2—Block Diagram

FIG. 2 is a block diagram illustrating the generation of various types of hardware and software descriptions from a VDiagram tree. As described for FIG. 1, programs of the present invention create a VDiagram tree 302 from a graphical program 300. The VDiagram tree 302 represents at least a portion of the graphical program 300. Back end programs 330 generate hardware descriptions from the VDiagram tree 302. Exemplary back end programs 330A, 330B, and 330C are illustrated. Back end 330A generates a VHDL hardware description comprising one or more VHDL files. Back end 330B generates an EDIF hardware description comprising one or more EDIF files. Back end 330C generates a C source code software description comprising one or more C files.

The number and type of back end programs that may be present are not limited. In the preferred embodiment, one or more back end programs may be called automatically as part of a process initiated by a user to generate hardware/software descriptions for the graphical program 300. In another embodiment, the VDiagram tree 302 may be generated and saved to a file, and the user may call a back end program at a later time to generate a hardware/software description.

As described above for FIG. 1, appropriate synthesis tools or compilers may be called to convert a hardware/software description into another format such as an FPGA-specific netlist or compiled machine code.

Figure 3:
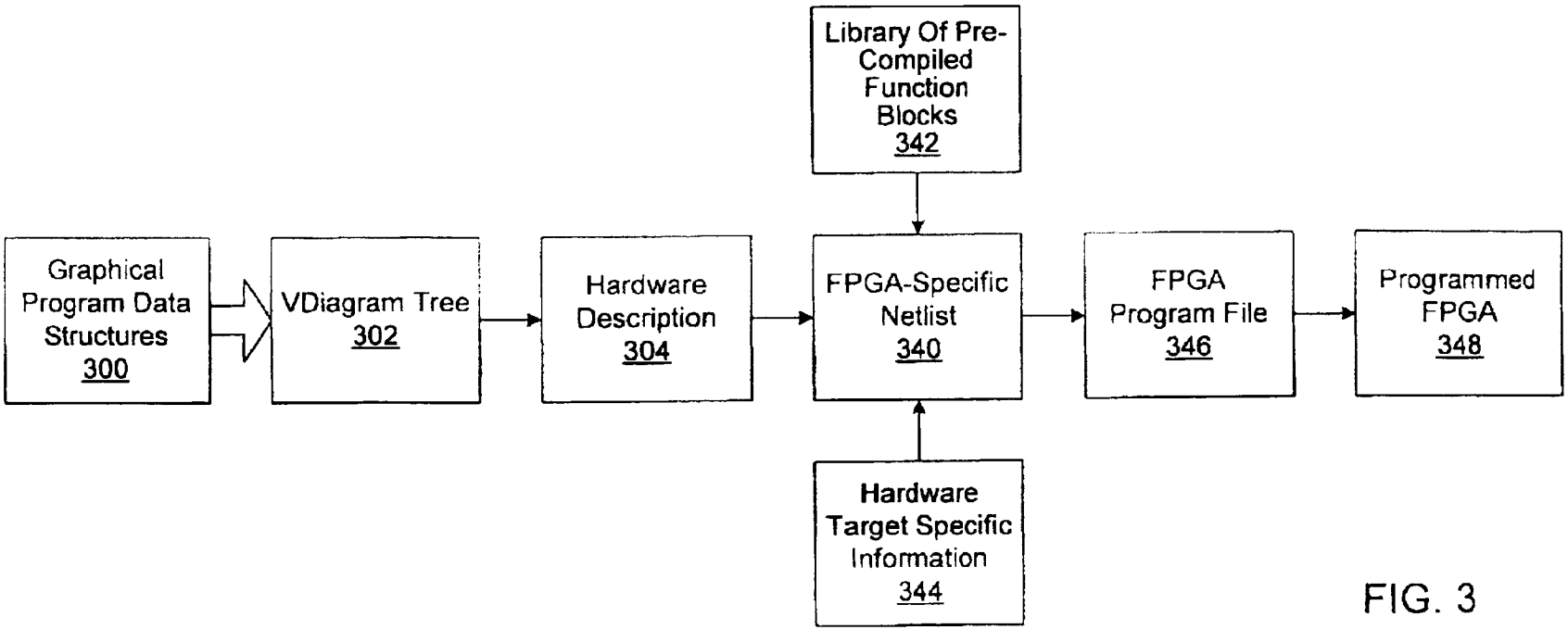
FIG. 3 illustrates the conversion of a graphical program into a hardware description and the use of the hardware description to program an FPGA.

FIG. 3—Block Diagram

FIG. 3 illustrates the exportation of at least a portion of a graphical program 300 into a hardware description and the use of the hardware description to program an FPGA. As described above for FIG. 1, the VDiagram tree 302 comprises information representing the graphical program 300, including the functional operations of the program. As described in detail below, the VDiagram tree comprises VDiagrams, each of which maintains a list of components. This list of components includes components which represent functional operations.

A back end program converts the VDiagram tree 302 to a hardware description 304. Back end programs may implement the functionality of the components in the VDiagram component lists using constructs of their respective description languages. For example, a VHDL back end may create VHDL code to implement a component that performs a particular mathematical algorithm such as an exponential calculation. However, in the preferred embodiment, such functional components are simply referenced as library components.

FIG. 3 illustrates the preferred embodiment in which the VDiagram tree references one or more library components. The present invention comprises pre-compiled function blocks 342 which implement these library components for particular hardware devices such as FPGAs. Various FPGA netlist synthesis tools may be called to generate an FPGA netlist 340 from the hardware description 304. These synthesis tools may incorporate the pre-compiled function blocks 342 into the FPGA netlist 340. Also, as shown, the synthesis tools may utilize hardware target-specific information in creating the netlist. For example, the exact form that the FPGA netlist takes may depend on the particular type of FPGA that will use the netlist, since FPGAs differ in their available resources.

An FPGA bit stream program file 346 may be generated from the FPGA netlist 340 using readily available synthesis tools. This FPGA program file may be uploaded to an FPGA 348. The FPGA 348 may be comprised in a hardware device such as an interface board. After being programmed with the program file 346, the FPGA is able to execute the portion of the graphical program 300 that is exported to the hardware description 304. If the entire graphical program is not exported to the hardware description, then a portion of the program may execute on the general purpose CPU of the computer system. This portion preferably comprises the supervisory control and display portion of the program. Details follow on how the execution of the FPGA portion is coordinated with the execution of the main CPU portion and how the external hardware resource requirements for the FPGA portion are managed.

Figure 4:
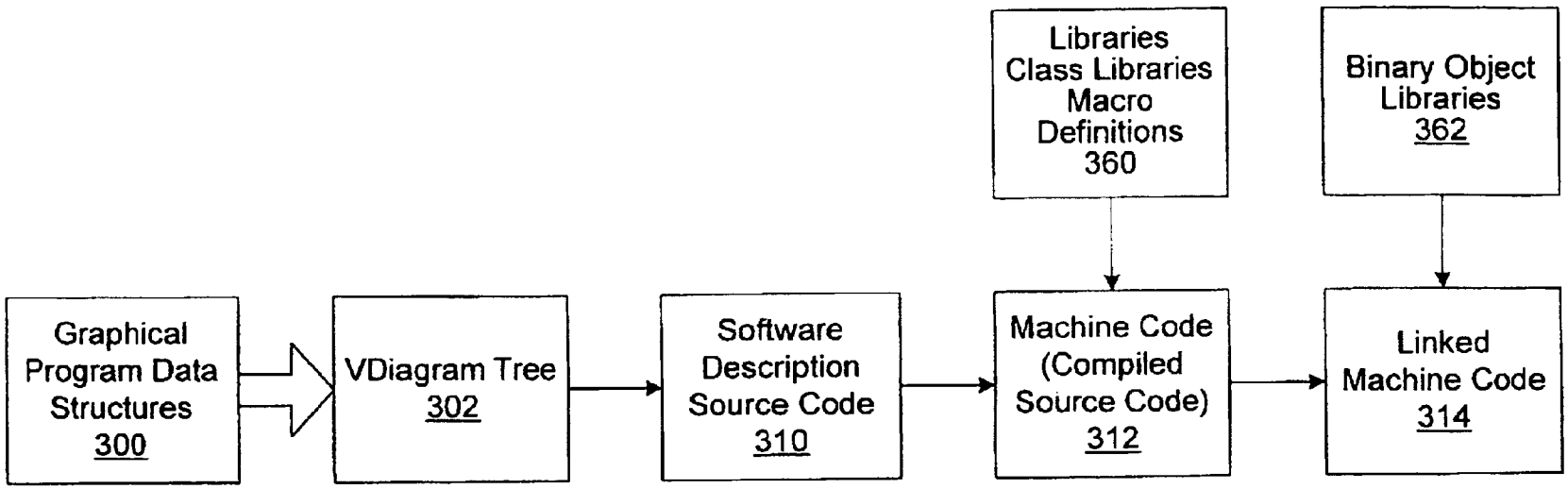
FIG. 4 illustrates the conversion of a graphical program into a software source code description and the compilation and linkage of the source code.

FIG. 4—Block Diagram

FIG. 4 illustrates the exportation of at least a portion of a graphical program 300 into a software source code description and the compilation and linkage of the source code. As shown, the graphical program data structures may be first converted to a VDiagram tree 302 and then to software description source code 310.

As described above for FIG. 3, in the preferred embodiment the VDiagram tree 302 references library components to represent various functional components of the graphical program. These library components may be implemented in libraries, class libraries, macro definitions, etc. 360. As shown in FIG. 4, these class libraries, etc. may be used to produce the machine code 312 from the source code 310. Also, binary object libraries 362 may implement some functionality of the software description. These binary object libraries may be linked in with the machine code 312 is linked to produce the linked executable code 314. Libraries 360 and 362 may also contain compiler-specific or platform-specific information necessary to produce executable code 314. Linked code 314 may be executed to perform the operations of the portion of the graphical program that is exported to the software source code description 310.

Figure 5A:
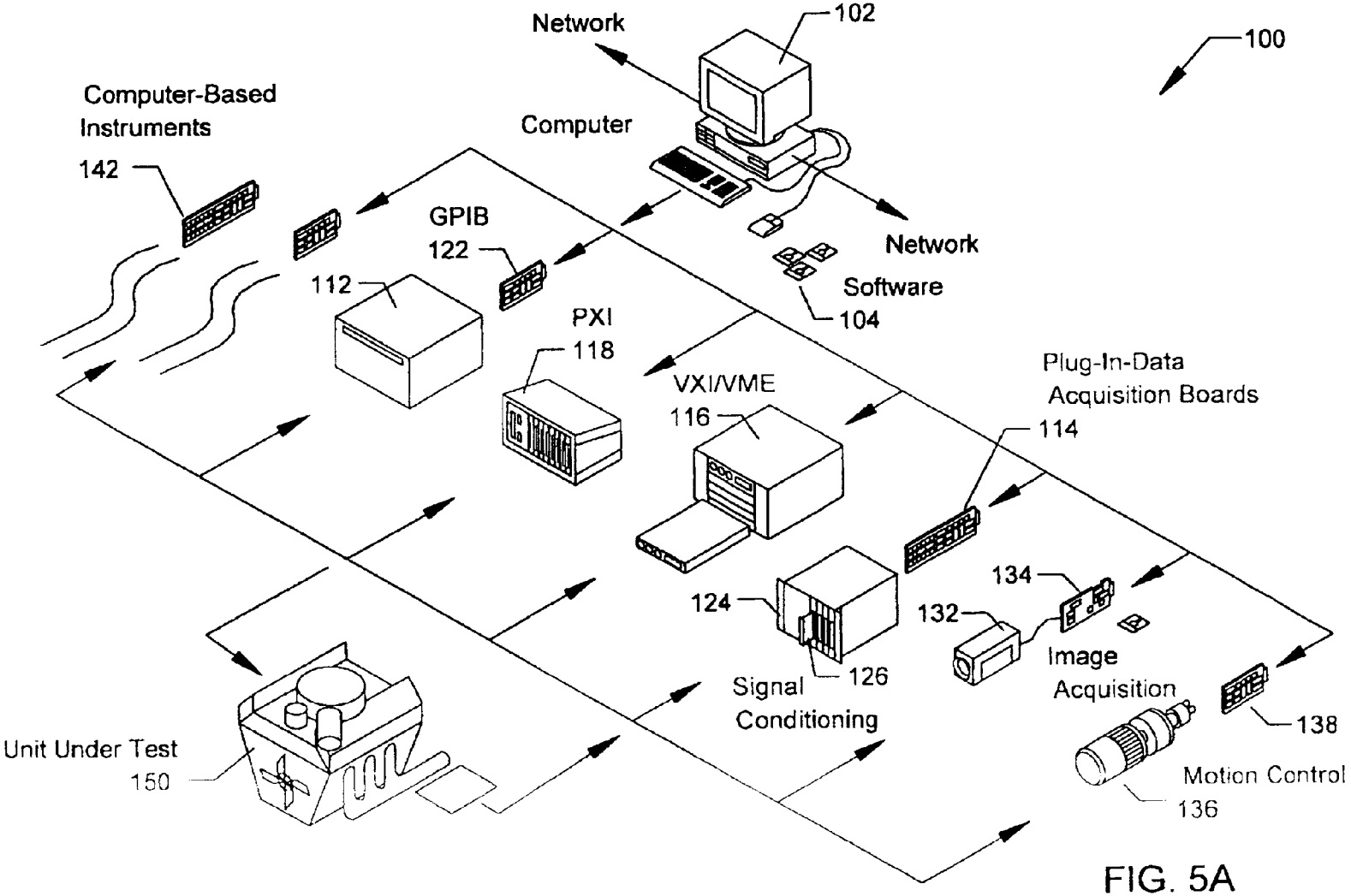
FIG. 5A illustrates an instrumentation control system.
Figure 5B:
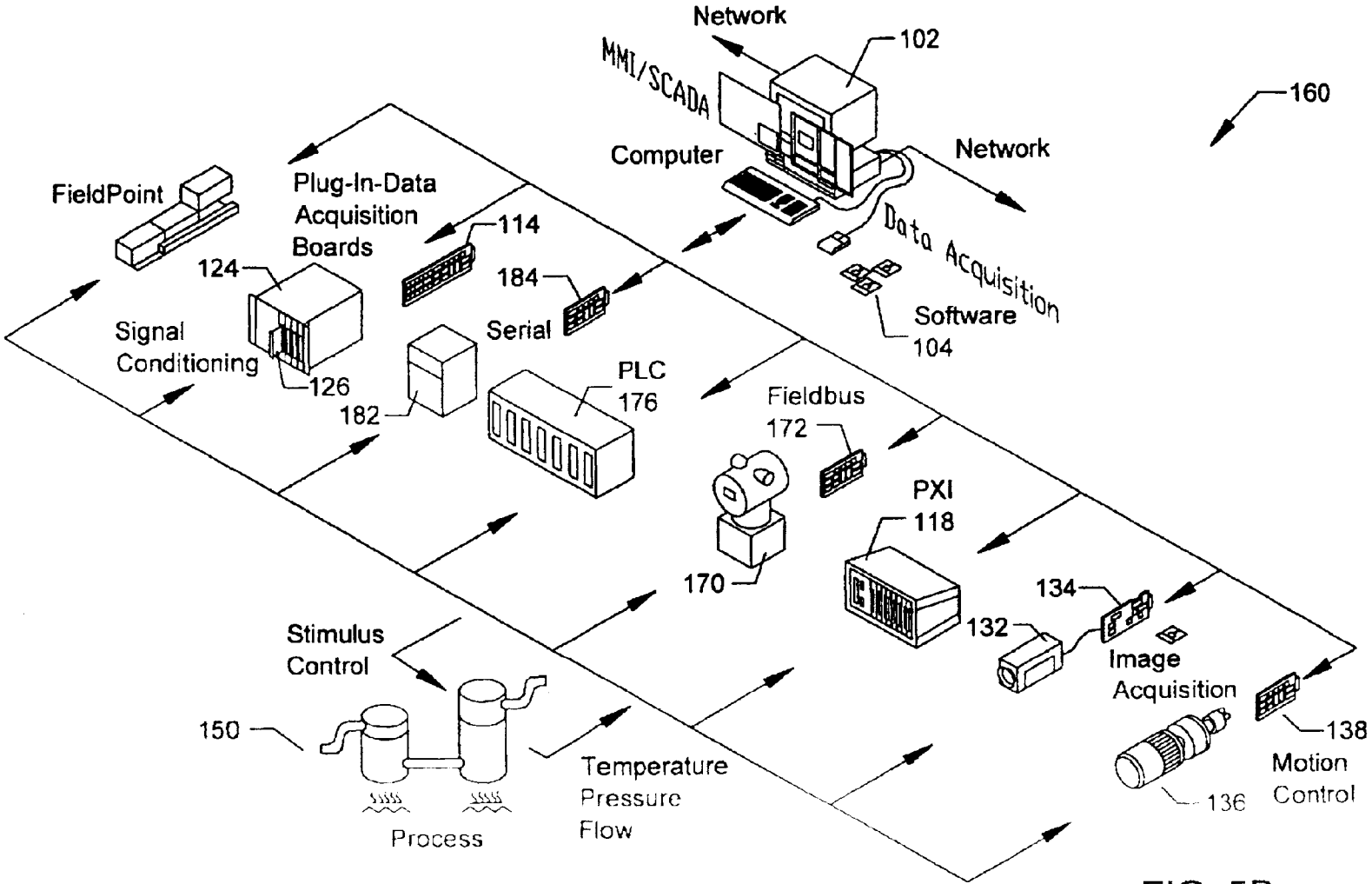
FIG. 5B illustrates an industrial automation system.

FIGS. 5A and 5B—Instrumentation and Industrial Automation Systems

The following describes embodiments of the present invention involved with controlling and/or modeling instrumentation or industrial automation hardware. However, it is noted that the present invention can be used to create hardware implementations of graphical programs for a plethora of applications and are not limited to instrumentation or industrial automation applications. In other words, the following description is exemplary only, and the present invention may be used in any of various types of systems. Thus, the system and method of the present invention is operable for automatically creating hardware implementations of graphical programs or graphical code for any of various types of applications, including the control of other types of devices such as multimedia devices, video devices, audio devices, telephony devices, Internet devices, etc., as well as general purpose software applications such as word processing, spreadsheets, network control, games, etc.

FIG. 5A illustrates an instrumentation control system 100. The system 100 comprises a host computer 102 which connects to one or more instruments. The host computer 102 comprises a CPU, a display screen, memory, and one or more input devices such as a mouse or keyboard as shown. The computer 102 connects through the one or more instruments to analyze, measure or control a unit under test (UUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device 132 and associated image acquisition card 134, a motion control device 136 and associated motion control interface card 138, and/or one or more computer based instrument cards 142, among other types of devices.

The GPIB instrument 112 is coupled to the computer 102 via the GPIB interface card 122 provided by the computer 102. In a similar manner, the video device 132 is coupled to the computer 102 via the image acquisition card 134, and the motion control device 136 is coupled to the computer 102 through the motion control interface card 138. The data acquisition board 114 is coupled to the computer 102, and preferably interfaces through signal conditioning circuitry 124 to the UUT. The signal conditioning circuitry 124 preferably comprises an SCXI (Signal Conditioning eXtensions for Instrumentation) chassis comprising one or more SCXI modules 126.

The GPIB card 122, the image acquisition card 134, the motion control interface card 138, and the DAQ card 114 are typically plugged in to an I/O slot in the computer 102, such as a PCI bus slot, a PC Card slot, or an ISA, EISA or Micro-Channel bus slot provided by the computer 102. However, these cards 122, 134, 138 and 114 are shown external to computer 102 for illustrative purposes. These devices may also be connected to the computer 102 through a serial bus or through other means.

The VXI chassis or instrument 116 is coupled to the computer 102 via a VXI bus, MXI bus, or other serial or parallel bus provided by the computer 102. The computer 102 preferably includes VXI interface logic, such as a VXI, MXI or GPIB interface card (not shown), which interfaces to the VXI chassis 116. The PXI chassis or instrument is preferably coupled to the computer 102 through the computer's PCI bus.

A serial instrument (not shown) may also be coupled to the computer 102 through a serial port, such as an RS-232 port, USB (Universal Serial bus) or IEEE 1394 or 1394.2 bus, provided by the computer 102. In typical instrumentation control systems an instrument will not be present of each interface type, and in fact many systems may only have one or more instruments of a single interface type, such as only GPIB instruments.

In the embodiment of FIG. 5A, one or more of the devices connected to the computer 102 include programmable or reconfigurable hardware according to the present invention. For example, one or more of the GPIB card 122, the DAQ card 114, a VXI card in VXI chassis 116, a PXI card in PXI chassis 118, the image acquisition board 134, the motion control board 138, or a computer-based instrument, include programmable hardware according to the present invention. Alternatively, or in addition, one or more of the GPIB instrument 112, the VXI instrument 116, the serial instrument, or another type of device include programmable hardware according to the present invention. Where the programmable hardware is comprised on a VXI or PXI card, the programmable hardware may be configured to control one or more other VXI or PXI cards, respectively, comprised in the respective chassis. In the preferred embodiment, the programmable hardware comprises a field programmable gate array (FPGA).

The instruments are coupled to the unit under test (UUT) or process 150, or are coupled to receive field signals, typically generated by transducers. The system 100 may be used in a data acquisition and control application, in a test and measurement application, a process control application, or a man-machine interface application.

FIG. 5B illustrates an exemplary industrial automation system 160. The industrial automation system 160 is similar to the instrumentation or test and measurement system 100 shown in FIG. 5A. Elements which are similar or identical to elements in FIG. 5A have the same reference numerals for convenience. The system 160 comprises a computer 102 which connects to one or more devices or instruments. The computer 102 comprises a CPU, a display screen, memory, and one or more input devices such as a mouse or keyboard as shown. The computer 102 connects through the one or more devices to a process or device 150 to perform an automation function, such as MMI (Man Machine Interface), SCADA (Supervisory Control and Data Acquisition), portable or distributed data acquisition, process control, advanced analysis, or other control.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

The DAQ card 114, the PXI chassis 118, the video device 132, and the image acquisition card 136 are preferably connected to the computer 102 as described above. The serial instrument 182 is coupled to the computer 102 through a serial interface card 184, or through a serial port, such as an RS-232 port, provided by the computer 102. The PLC 176 couples to the computer 102 through a serial port, Ethernet port, or a proprietary interface. The fieldbus interface card 172 is preferably comprised in the computer 102 and interfaces through a fieldbus network to one or more fieldbus devices. Each of the DAQ card 114, the serial card 184, the fieldbus card 172, the image acquisition card 134, and the motion control card 138 are typically plugged in to an I/O slot in the computer 102 as described above. However, these cards 114, 184, 172, 134, and 138 are shown external to computer 102 for illustrative purposes. In typical industrial automation systems a device will not be present of each interface type, and in fact many systems may only have one or more devices of a single interface type, such as only PLCs. The devices are coupled to the device or process 150.

In the embodiment of FIG. 5B, one or more of the devices connected to the computer 102 include programmable hardware according to the present invention. For example, one or more of the data acquisition board 114, the serial instrument 142, the serial interface card 152, the PLC 144, or the fieldbus network card 156 include programmable hardware according to the present invention. In the preferred embodiment, the programmable hardware comprises a field programmable gate array (FPGA).

As noted above, the programmable hardware may be comprised in a device which connects to the computer 102 over a network, such as the Internet. In one embodiment, the user operates to select a target device from a plurality of possible target devices for programming or configuration according to the present invention.

Referring again to FIGS. 5A and 5B, the computer 102 preferably includes a memory medium on which computer programs according to the present invention are stored. As used herein, the term "memory medium" includes a non-volatile medium, e.g., a magnetic media or hard disk, or optical storage; a volatile medium, such as computer system memory, e.g., random access memory (RAM) such as DRAM, SRAM, EDO RAM, RAMBUS RAM, DR DRAM, etc.; or an installation medium, such as a CD-ROM or floppy disks 104, on which the computer programs according to the present invention are stored for loading into the computer system. The term "memory medium" may also include other types of memory.

The memory medium may be comprised in the computer 102 where the programs are executed or may be located on a second computer which is coupled to the computer 102 through a network, such as a local area network (LAN), a wide area network (WAN), or the Internet. In this instance, the second computer operates to provide the program instructions through the network to the computer 102 for execution.

The software programs of the present invention are stored in a memory medium of the respective computer 102, or in a memory medium of another computer, and executed by the CPU. The CPU executing code and data from the memory medium thus comprises a means for converting graphical programs into hardware implementations according to the steps described below.

The memory medium preferably stores a graphical programming development system for developing graphical programs. The memory medium also stores computer programs according to the present invention which are executable to convert at least a portion of a graphical program into a form for configuring or programming the programmable hardware or FPGA.

The instruments or devices in FIGS. 5A and 5B are controlled by graphical software programs, optionally a portion of which execute on the CPU of the computer 102, and at least a portion of which are uploaded to the programmable hardware element for hardware execution. The graphical software programs which perform data acquisition, analysis and/or presentation, e.g., for instrumentation control or industrial automation, may be referred to as virtual instruments.

In the preferred embodiment, the present invention is comprised in the LabVIEW or BridgeVIEW graphical programming systems, hereafter collectively referred to as LabVIEW, available from National Instruments. Also, in the preferred embodiment, the term "LabVIEW" is intended to include graphical programming systems which include G programming functionality, i.e., which include at least a portion of LabVIEW graphical programming functionality, including the BridgeVIEW graphical programming system.

Also, the term "graphical programming system" is intended to include any of various types of systems which are used to develop or create graphical code or graphical programs, including LabVIEW, BridgeVIEW, and DASYLab from National Instruments, Visual Designer from Intelligent Instrumentation, Hewlett-Packard's VEE (Visual Engineering Environment), Snap-Master by HEM Data Corporation, GFS DiaDem, and ObjectBench by SES (Scientific and Engineering Software), Simulink, WiT, Vision Program Manager, Hypersignal, VisiDAQ, VisSim, and Khoros, among others.

Although in the preferred embodiment the graphical programs and programmable hardware are involved with data acquisition/generation, analysis, and/or display, and for controlling or modeling instrumentation or industrial automation hardware, as noted above the present invention can be used to create hardware implementations of graphical programs for a plethora of applications and is not limited to instrumentation or industrial automation applications. In other words, FIGS. 5A and 5B are exemplary only, and the present invention may be used in any of various types of systems. Thus, the system and method of the present invention is operable for automatically creating hardware implementations of graphical programs or graphical code for any of various types of applications, including general purpose software applications such as word processing, spreadsheets, network control, games, etc.

Figure 6:
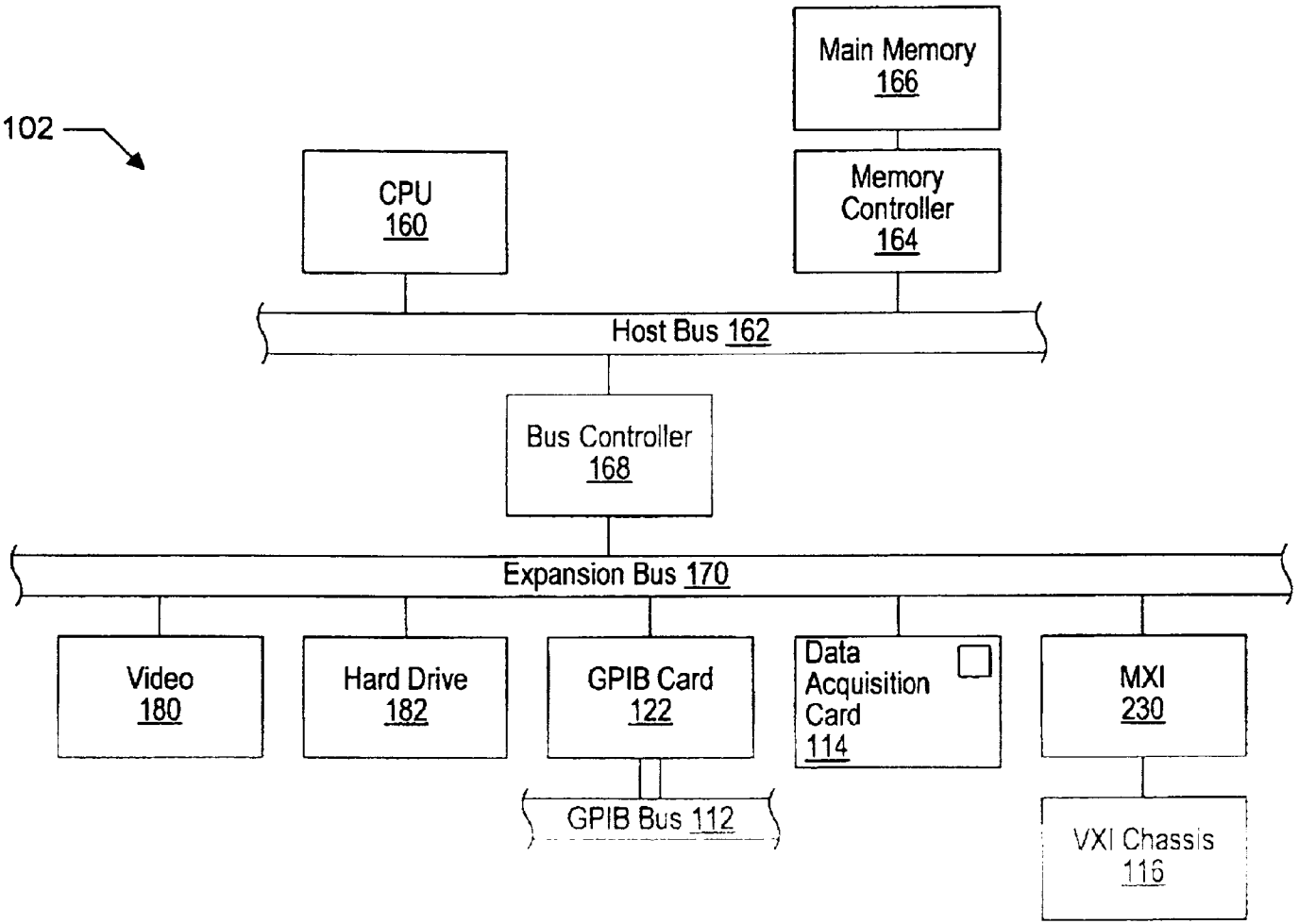
FIG. 6 is a block diagram of the instrumentation control system of FIG. 5A.

FIG. 6—Computer Block Diagram

FIG. 6 is a block diagram of the computer 102 of FIGS. 5A and 5B. The elements of a computer not necessary to understand the operation of the present invention have been omitted for simplicity. The computer 102 includes at least one central processing unit or CPU 160 which is coupled to a processor or host bus 162. The CPU 160 may be any of various types, including an x86 processor, a PowerPC processor, a CPU from the Motorola family of processors, a CPU from the SPARC family of RISC processors, as well as others. Main memory 166 is coupled to the host bus 162 by means of memory controller 164. The main memory 166 stores a graphical programming system, and also stores software for converting at least a portion of a graphical program into a hardware implementation. This software will be discussed in more detail below. The main memory 166 also stores operating system software as well as the software for operation of the computer system, as well known to those skilled in the art.

The host bus 162 is coupled to an expansion or input/output bus 170 by means of a bus controller 168 or bus bridge logic. The expansion bus 170 is preferably the PCI (Peripheral Component Interconnect) expansion bus, although other bus types can be used. The expansion bus 170 includes slots for various devices such as the data acquisition board 114 (of FIG. 5), a GPIB interface card 122 which provides a GPIB bus interface to the GPIB instrument 112 (of FIG. 5), and a VXI or MXI bus card 230 coupled to the VXI chassis 116 for receiving VXI instruments. The computer 102 further comprises a video display subsystem 180 and hard drive 182 coupled to the expansion bus 170.

One or more of the interface cards or devices coupled to the expansion bus, such as the DAQ card 114, the GPIB interface card 122, or the GPIB instrument 112 comprises programmable hardware such as a field programmable gate array (FPGA). The computer 102 may also include a network interface card for coupling to a network, wherein the target device containing the programmable hardware is coupled to the network.

Figure 7:
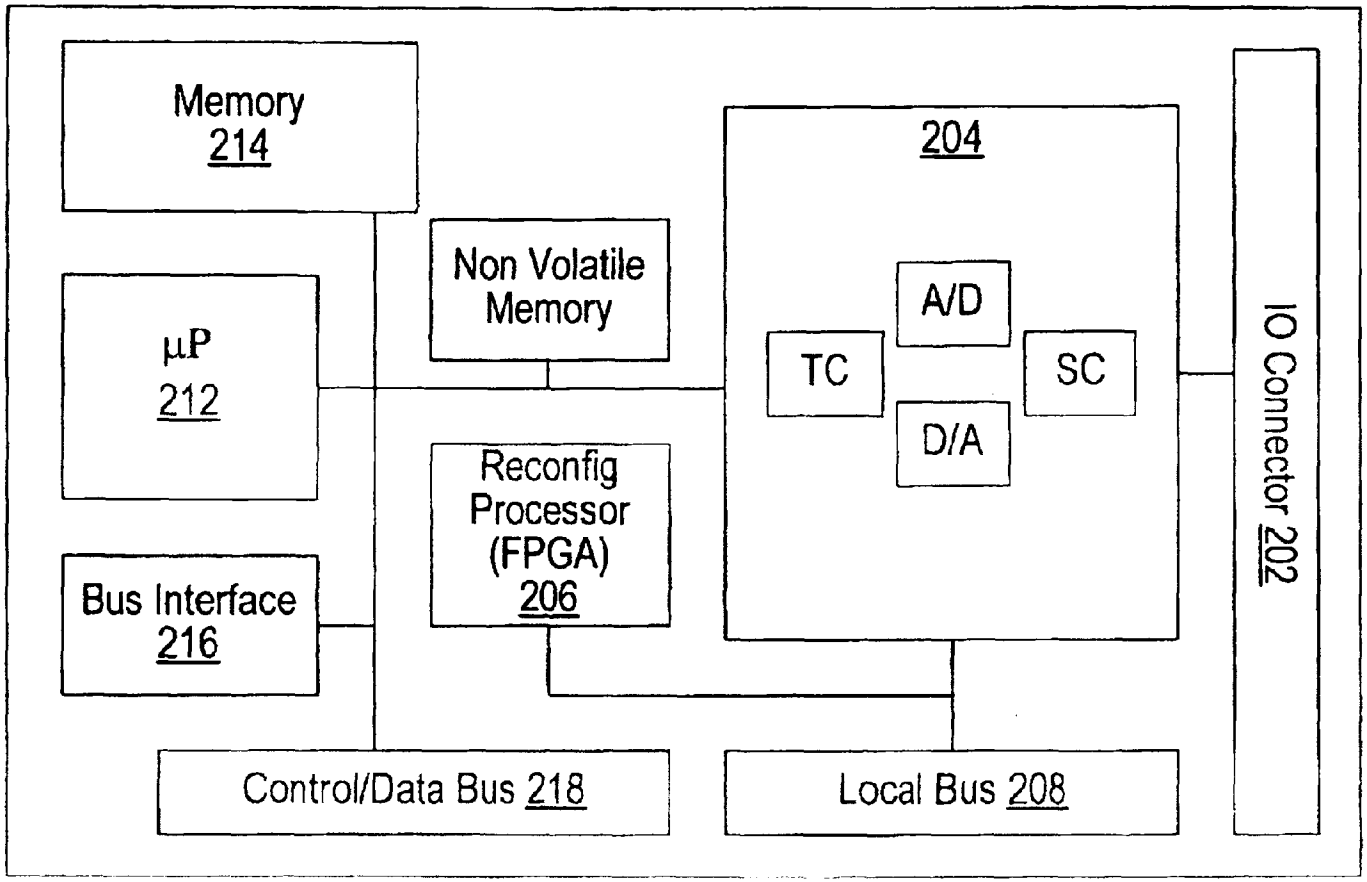
FIGS. 7, 7A and 7B are block diagrams illustrating an interface card configured with programmable hardware according to various embodiments of the present invention.

FIG. 7—Programmable Hardware Diagram

FIG. 7 is a block diagram illustrating a device, e.g., an interface card, configured with programmable hardware according to the present invention. It is noted that FIG. 7 is exemplary only, and an interface card or device configured with programmable hardware according to the present invention may have various architectures or forms, as desired. For example, the device may be internal or external to the computer 102, and may be connected to the computer through a network, such as the Internet. The interface card illustrated in FIG. 7 is the DAQ interface card 114 shown in either of FIG. 5A or 5B. However, as noted above, the programmable hardware may be included on any of the various devices shown in FIG. 5A or 5B, or on other devices, as desired. Also, the programmable hardware illustrated in FIG. 7 is an FPGA, but the device may include another type of programmable hardware instead, such as a CPLD or other type of (re)configurable hardware.

As shown, the interface card 114 includes an I/O connector 202 which is coupled for receiving signals. In the embodiments of FIGS. 5A and 5B, the I/O connector 202 presents analog and/or digital connections for receiving/providing analog or digital signals. The I/O connector 202 is adapted for coupling to SCXI conditioning logic 124 and 126, or is adapted to be coupled directly to a unit under test 130 or process 160.

The interface card 114 also includes data acquisition (DAQ) logic 204. As shown, the data acquisition logic 204 comprises analog to digital (A/D) converters, digital to analog (D/A) converters, timer counters (TC) and signal conditioning (SC) logic as shown. The DAQ logic 204 provides the data acquisition functionality of the DAQ card 114. In one embodiment, the DAQ logic 204 comprises 4 A/D converters, 4 D/A converters, 23 digital I/Os, a RTSI connector, and a TIO. This extra hardware is useful for signal processing and motion control applications. The programmable hardware element or FPGA can access these resources directly, thereby enabling creation of very powerful DSP and control applications, among others.

According to the preferred embodiment of the invention, the interface card 114 includes a programmable hardware element or programmable processor 206. In the preferred embodiment, the programmable hardware 206 comprises a field programmable gate array (FPGA) such as those available from Xilinx, Altera, etc. The programmable hardware element 206 is coupled to the DAQ logic 204 and is also coupled to the local bus interface 208. Thus a graphical program can be created on the computer 102, or on another computer in a networked system, and at least a portion of the graphical program can be converted into a hardware implementation form for execution in the FPGA 206. The portion of the graphical program converted into a hardware implementation form is preferably a portion which requires fast and/or real-time execution In the embodiment of FIG. 7, the interface card 114 further includes a dedicated on-board microprocessor 212 and memory 214. This enables a portion of the graphical program to be compiled into machine language for storage in the memory 214 and execution by the microprocessor 212. This is in addition to a portion of the graphical program being converted into a hardware implementation form in the FPGA 206. Thus, in one embodiment, after a graphical program has been created, a portion of the graphical program is compiled for execution on the embedded CPU 212 and executes locally on the interface card 114 via the CPU 212 and memory 214, and a second portion of the graphical program is translated or converted into a hardware executable format and uploaded to the FPGA 206 for hardware implementation.

As shown, the interface card 114 further includes bus interface logic 216 and a control/data bus 218. In the preferred embodiment, the interface card 114 is a PCI bus-compliant interface card adapted for coupling to the PCI bus of the host computer 102, or adapted for coupling to a PXI (PCI eXtensions for Instrumentation) bus. The bus interface logic 216 and the control/data bus 218 thus present a PCI or PXI interface.

The interface card 114 also includes local bus interface logic 208. In the preferred embodiment, the local bus interface logic 208 presents a RTSI (Real Time System Integration) bus for routing timing and trigger signals between the interface card 114 and one or more other devices or cards.

In one embodiment, the interface card 114 also includes a non-volatile memory (not shown) coupled to the programmable hardware element 206. The non-volatile memory is operable to store the hardware description received from the host computer system to enable execution of the hardware description in the programmable hardware element 206 prior to or during booting of the computer system 102.

Figure 7A:
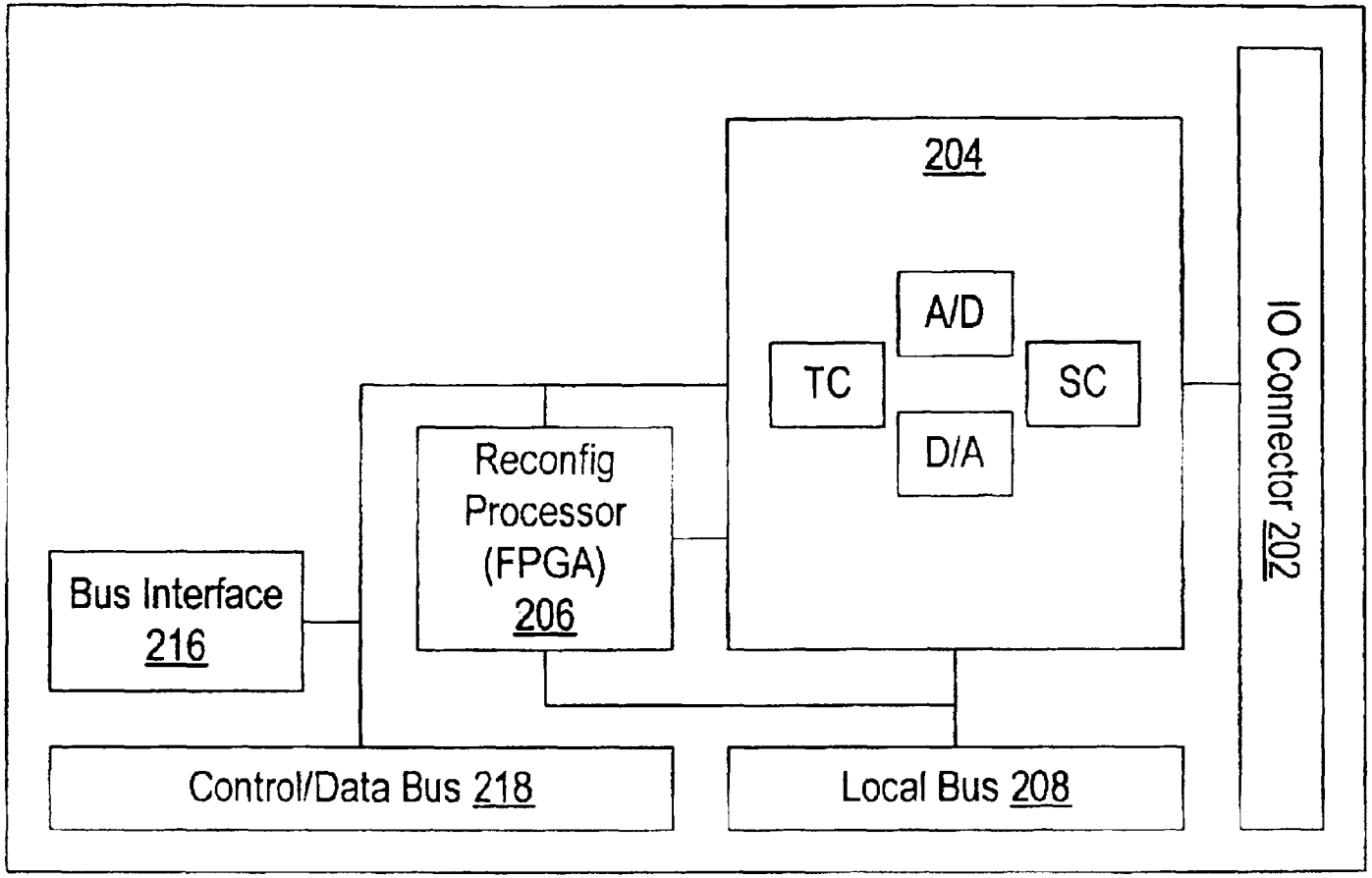

In the embodiment of FIG. 7A, the CPU 212 and memory 214 are not included on the interface card 114, and thus only the portion of the graphical program which is converted into hardware implementation form is uploaded to the FPGA 206. Thus in the embodiment of FIG. 7A, any supervisory control portion of the graphical program which is necessary or desired to execute in machine language on a programmable CPU may be executed by the host CPU in the computer system 102, and is not executed locally by a CPU on the interface card 114.

Figure 7B:
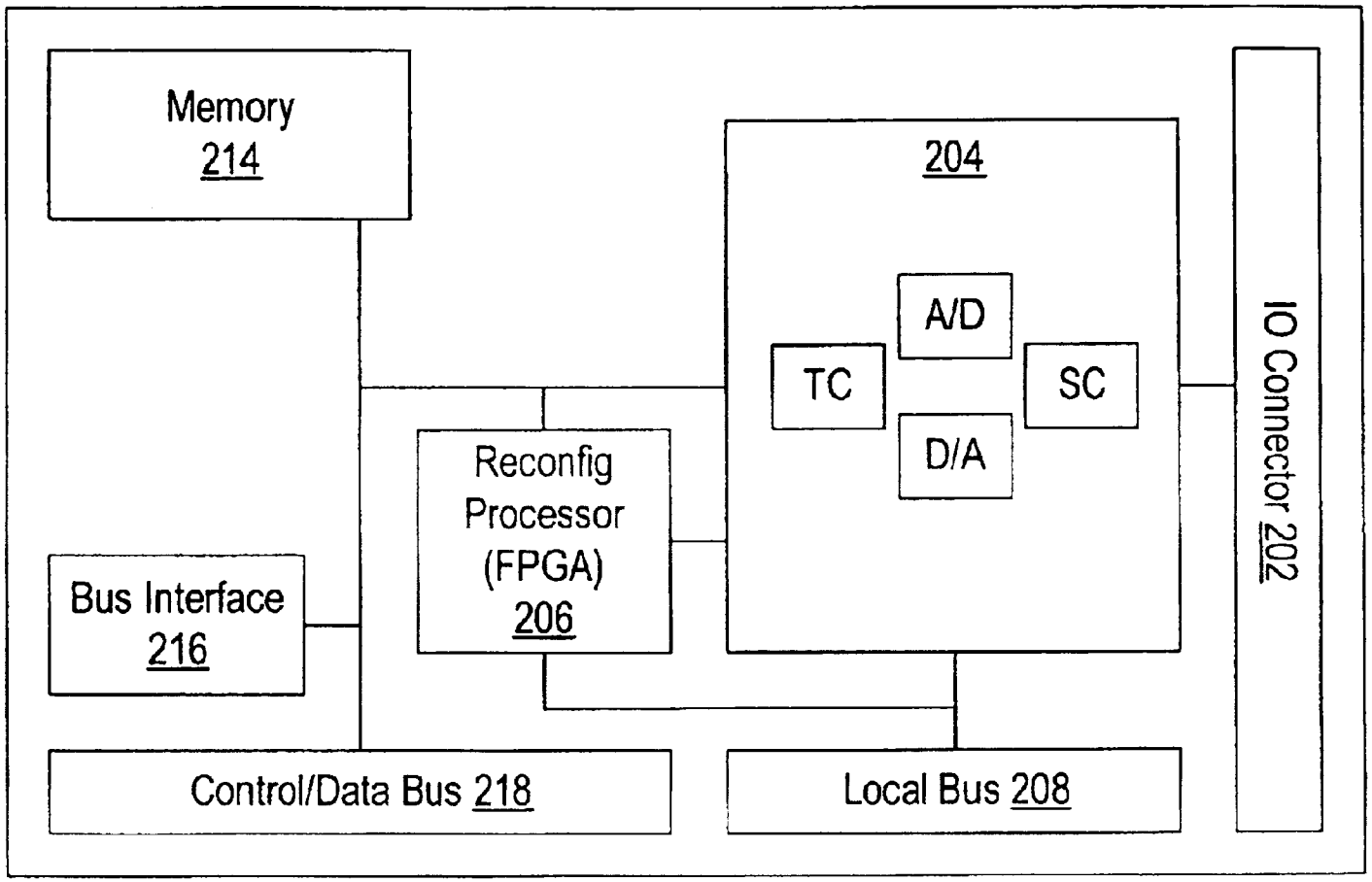

In the embodiment of FIG. 7B, the CPU 212 is not included on the interface card 114, i.e., the interface card 114 includes the FPGA 206 and the memory 214. In this embodiment, the memory 214 is used for storing FPGA state information. FIG. 7B is the currently preferred embodiment of the present invention.

Figure 8:
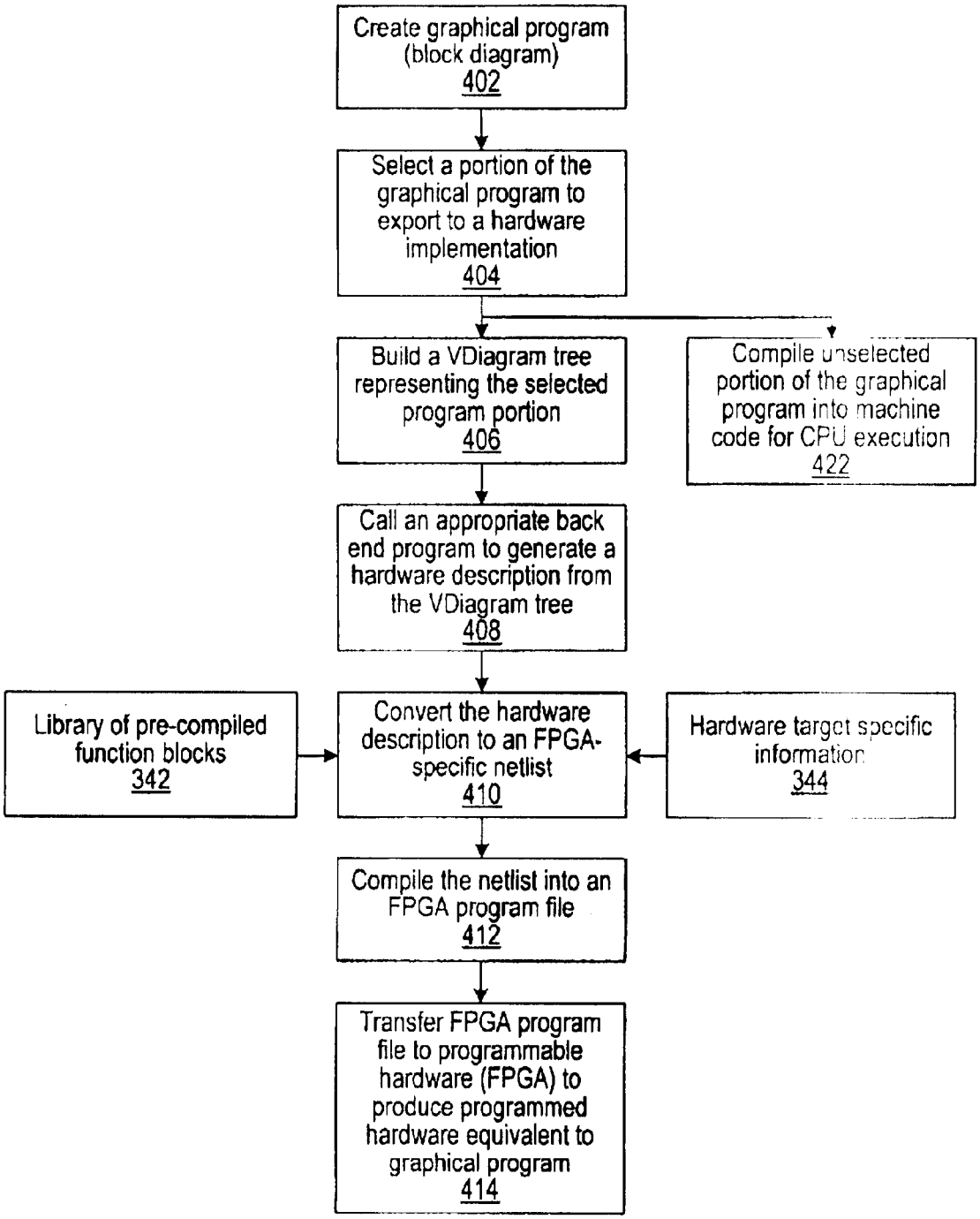
FIG. 8 is a flowchart diagram illustrating operation of the preferred embodiment of the invention, including compiling a first portion of the graphical program into machine language and converting a second portion of the graphical program into a hardware implementation.

FIG. 8—Conversion of a Graphical Program into a Hardware Implementations

FIG. 8 is a flowchart diagram illustrating operation of the preferred embodiment of the present invention. The present invention comprises a computer-implemented method for generating hardware and/or software implementations of graphical programs or graphical code. It is noted that various of the steps in the flowchart can occur concurrently or in different orders.

One goal of the present invention is to provide a development environment that will seamlessly allow use of a graphical programming system to design applications for reconfigurable or programmable hardware. In the preferred embodiment where the graphical programming system is LabVIEW, the present invention allows LabVIEW users to design applications in LabVIEW for reconfigurable hardware.

Many applications, such as signal processing and real-time motion control, are easily implemented in a graphical programming language, such as the LabVIEW G language. However, in some instances traditional software compilation methods cannot produce an application that is fast enough to meet a user's needs. The present invention solves this problem by allowing a user to convert their graphical program, e.g., a G program, into application-specific hardware such as a programmed FPGA. The hardware maintains the exact functionality of the graphical program while running at speeds far exceeding that of traditional general-purpose processor platforms. The current implementation of the present invention is a desktop or embedded PC that contains an FPGA-based daughter card.

In one embodiment, the present invention appears as a conventional graphical programming system while providing a seamless interface to the reconfigurable hardware. For example, the preferred embodiment of the invention, referred to as "FPGA LabVIEW", provides a seamless interface to an FPGA. FPGA LabVIEW appears from the outside to be exactly the same as the normal LabVIEW graphical program development system.

FIG. 8 illustrates the translation process from a graphical program to a hardware description that corresponds to the graphical program. A graphical programming application that is being targeted for a hardware implementation is designed in exactly the same way as an ordinary graphical programming application. As shown, in step 402 the user first creates a graphical program, also sometimes referred to as a block diagram. A design is entered and debugged in the traditional software-based manner. In the preferred embodiment, the graphical program comprises a graphical data flow diagram which specifies functionality of the program to be performed. This graphical data flow diagram is preferably directly compilable into machine language code for execution on a computer system.

When the design is finalized, the user can instruct the system to compile the design for the FPGA hardware. Unfortunately, some graphical programming constructs may not be efficiently implemented in FPGA hardware. For example, file I/O is a task that is usually better left to the general-purpose host processor. The present invention is capable of bisecting a design into hardware portions and software portions.

In step 404, the user selects a first portion of the graphical program for conversion to a hardware implementation. This first portion of the graphical program which is desired for hardware implementation preferably comprises portions of the graphical program, e.g., particular subprograms, which require a fast or deterministic implementation and/or are desired to execute in a stand-alone hardware unit. In general, portions of the graphical program which are desired to have a faster or more deterministic execution are selected in step 404 and converted into the hardware implementation in steps 406–414.

In step 422 the remaining portions of the graphical program which were not selected in step 404 are compiled into machine code for execution on a CPU, such as the host CPU in the computer 102 or the CPU 212 comprised on the interface card 114. The first portion of the program selected in step 404 preferably excludes program portions involving supervisory control and display. This enables the supervisory control and display portions to execute on the host CPU, which is optimal for these elements of the program.

In one embodiment, during creation of the graphical program in step 402 the user specifies portions, e.g. subprograms, which are to exported to the hardware description format for conversion into a hardware implementation. In another embodiment the user selects which modules or subprograms to export to the hardware implementation at the time when the conversion process is initiated. In another embodiment, the entire graphical program is selected for conversion to a hardware implementation, and thus step 422 is not performed.

In step 406 the graphical program portion selected in step 404 is first processed to create an abstract hardware graph called a VDiagram tree which serves as an intermediate data structure. The VDiagram tree contains a complete hardware representation of the program, but is not specific to any hardware description language. For example, the VDiagram tree comprises data structures representing hardware signals that implement the data flow within the graphical program, as well as data structures representing hardware signals that are added to preserve the proper execution flow (enable signals).

In step 408, a back end program is called to parse the VDiagram tree and generate a hardware description from it. The back end translates the information contained in the VDiagram tree into a specific hardware description language. For example, a VHDL back end may be called to generate a VHDL file or set of files describing the program. The hardware description comprises a high-level hardware description of function blocks, logic, inputs, and outputs which perform the operation indicated by the portion of the graphical program selected in step 404.

Various types of back end programs may be present. Back end programs may generate software source code descriptions as well as hardware description language descriptions. For example, FIG. 2 illustrates a back end 330A which uses the VDiagram tree to generate one or more VHDL files; back end 330B which generates one or more EDIF files; and back end 330C which generates one or more C files. These three back ends are representative only. Other back ends may generate other types of descriptions for the program. For example, a Verilog back end may generate a Verilog file for the program. Also, more than one back end may be called to generate different program descriptions. In the preferred embodiment, a VHDL back end generates a VHDL description which may then be compiled and used to program a programmable logic device such as an FPGA.

In step 410 the method operates to convert the hardware description into an FPGA-specific netlist. The netlist describes the components required to be present in the hardware as well as their interconnections. Conversion of the hardware description into the FPGA-specific netlist is preferably performed by any of various types of commercially available synthesis tools, such as those available from Xilinx, Altera, etc.

In the preferred embodiment, the converting step 410 may utilize one or more pre-compiled function blocks from a library of pre-compiled function blocks 342. Thus, for certain function blocks which are difficult to compile, or less efficient to compile, from a hardware description into a netlist format, the hardware description created in step 408 includes a reference to a pre-compiled function block from the library 342. Alternatively, hardware implementations for all of the function blocks are included in the function library. The respective pre-compiled function blocks are simply inserted into the netlist in place of these references in step 410. The preferred embodiment of the invention thus includes the library 342 of pre-compiled function blocks, also referred to as the component library, which are used in creating the netlist. The preferred embodiment also includes hardware target specific information 344 which is used by step 410 in converting the hardware description into a netlist which is specific to a certain type or class of FPGA.

In step 412 the method operates to compile the netlist into an FPGA program file, also referred to as a software bit stream. The FPGA program file is a file that can be readily uploaded to program an FPGA.

After the netlist has been compiled into an FPGA program file in step 412, then in step 414 the method operates to transfer the FPGA program file to the FPGA, to produce a programmed hardware equivalent to the graphical program. Thus, upon completion of step 414, the portion of a graphical program referenced in step 404 is comprised as a hardware implementation in an FPGA or other programmable hardware element.

In the preferred embodiment, the hardware description is passed transparently through the FPGA vendor's synthesis tools. Because the vendor's tools may take a considerable amount of time to process the design and generate a programming bitstream, it is recommended that this only be done after the design has been debugged using traditional software-compilation techniques.

As described above, the present invention may run on PC computers equipped with an FPGA-based expansion card on the PCI bus. Embodiments of the FPGA-based expansion card were described with reference to FIGS. 7, 7A and 7B. The graphical programming system uploads the programming bitstream generated by the FPGA vendor's design tools into the FPGA on this board. The FPGA then begins processing data, and the graphical programming system may coordinate data flow between the FPGA and the host CPU.

It is noted that various of the above steps can be combined and/or can be made to appear invisible to the user. For example, steps 410 and 412 can be combined into a single step, as can steps 404–410. In the preferred embodiment, after the user creates the graphical program in step 402, the user simply selects a hardware export option and indicates the hardware target or destination, causing steps 404–414 to be automatically performed.

FIG. 8 applies to the preferred embodiment in which the programmable hardware element is an FPGA. However, the same or similar steps may be applied to convert a graphical program into a hardware implementation for other types of programmable or (re)configurable hardware, such as a CPLD.

Figure 9:
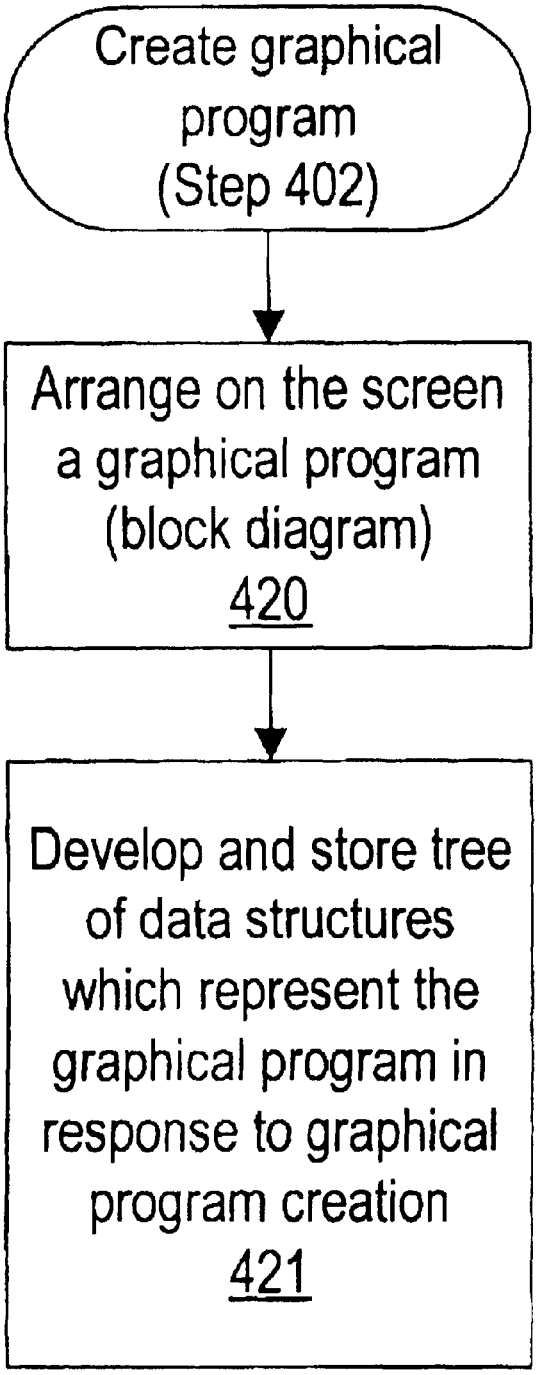
FIG. 9 is a more detailed flowchart diagram illustrating creation of a graphical program according to the preferred embodiment.

FIG. 9—Creation of a Graphical Program

FIG. 9 is a more detailed flowchart diagram of step 402 of FIG. 8, illustrating creation of a graphical program according to the preferred embodiment of the invention. As shown, in step 420 the user arranges on the screen a graphical program or block diagram. This includes the user placing and connecting, e.g., wiring, various icons or nodes on the display screen in order to configure a graphical program. More specifically, the user selects various function icons or other icons and places or drops the icons in a block diagram panel, and then connects or "wires up" the icons to assemble the graphical program. The user also preferably assembles a user interface, referred to as a front panel, comprising controls and indicators which indicate or represent input/output to/from the graphical program. The graphical program is sometimes referred to as a virtual instrument (VI). The graphical program or VI will typically have a hierarchy of sub-graphical programs or sub-VIs.

In the preferred embodiment, the graphical programming system is the LabVIEW graphical programming system available from National Instruments. For more information on creating a graphical program in the LabVIEW graphical programming system, please refer to the LabVIEW system available from National Instruments as well as the above patent applications incorporated by reference.

In response to the user arranging on the screen a graphical program, the method operates to develop and store a tree of data structures which represent the graphical program. Thus, as the user places and arranges on the screen function nodes, structure nodes, input/output terminals, and connections or wires, etc., the graphical programming system operates to develop and store a tree of data structures which represent the graphical program. More specifically, as the user assembles each individual node and wire, the graphical programming system operates to develop and store a corresponding data structure in the tree of data structures which represents the individual portion of the graphical program that was assembled. Thus, steps 420 and 421 are an iterative process which is repetitively performed as the user creates the graphical program. In one embodiment, the graphical programming system automatically develops and stores VDiagram data structures in response to the user creating the graphical program.

In one embodiment, the user optionally places constructs in the graphical program which indicate respective portions of graphical code which are either to be compiled into machine code for execution by a CPU or converted to a hardware description for implementation in a programmable hardware device such as an FPGA.

Figure 10:
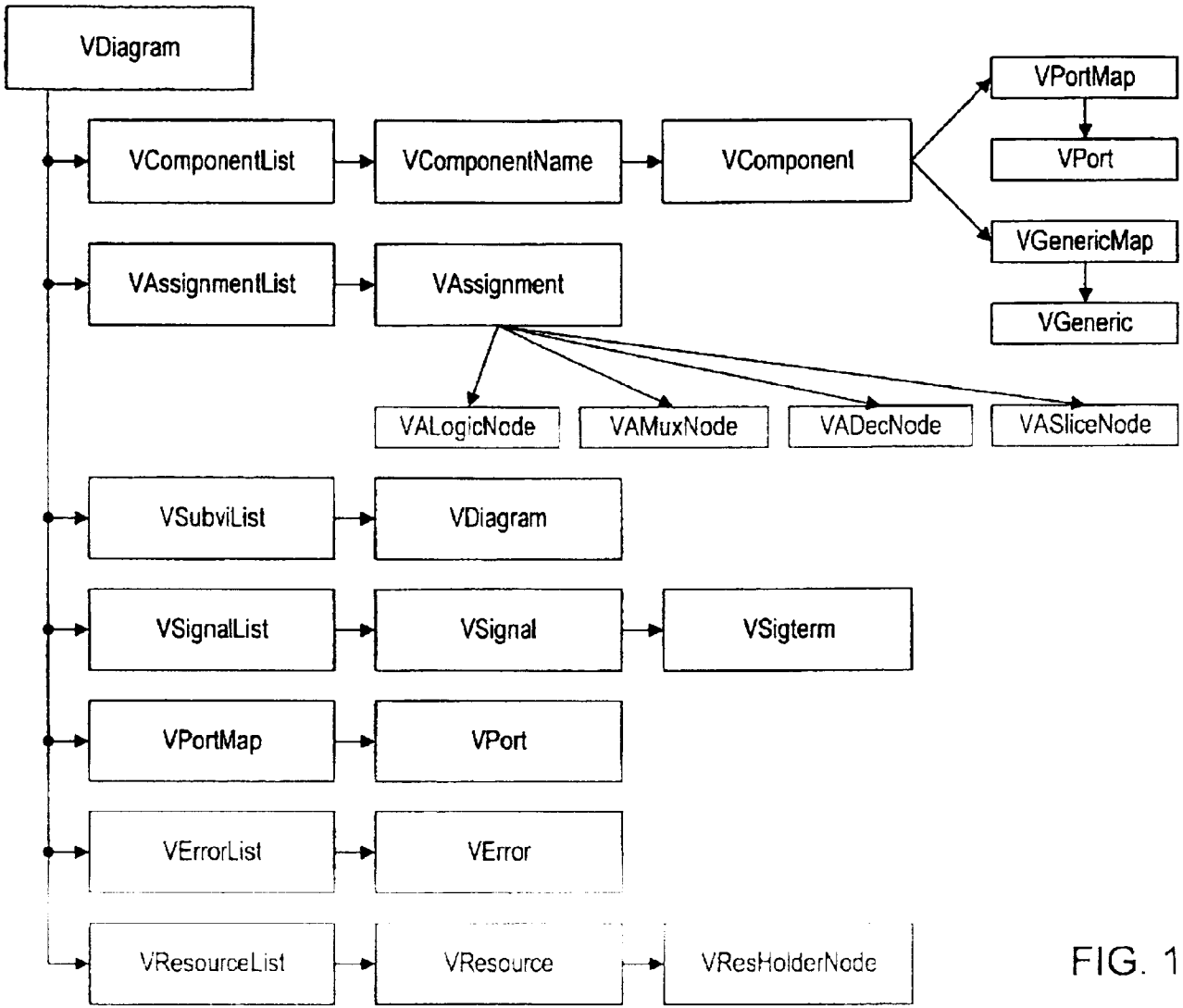
FIG. 10 is a graphical representation of a VDiagram and the relationship among its elements.
Figure 11:
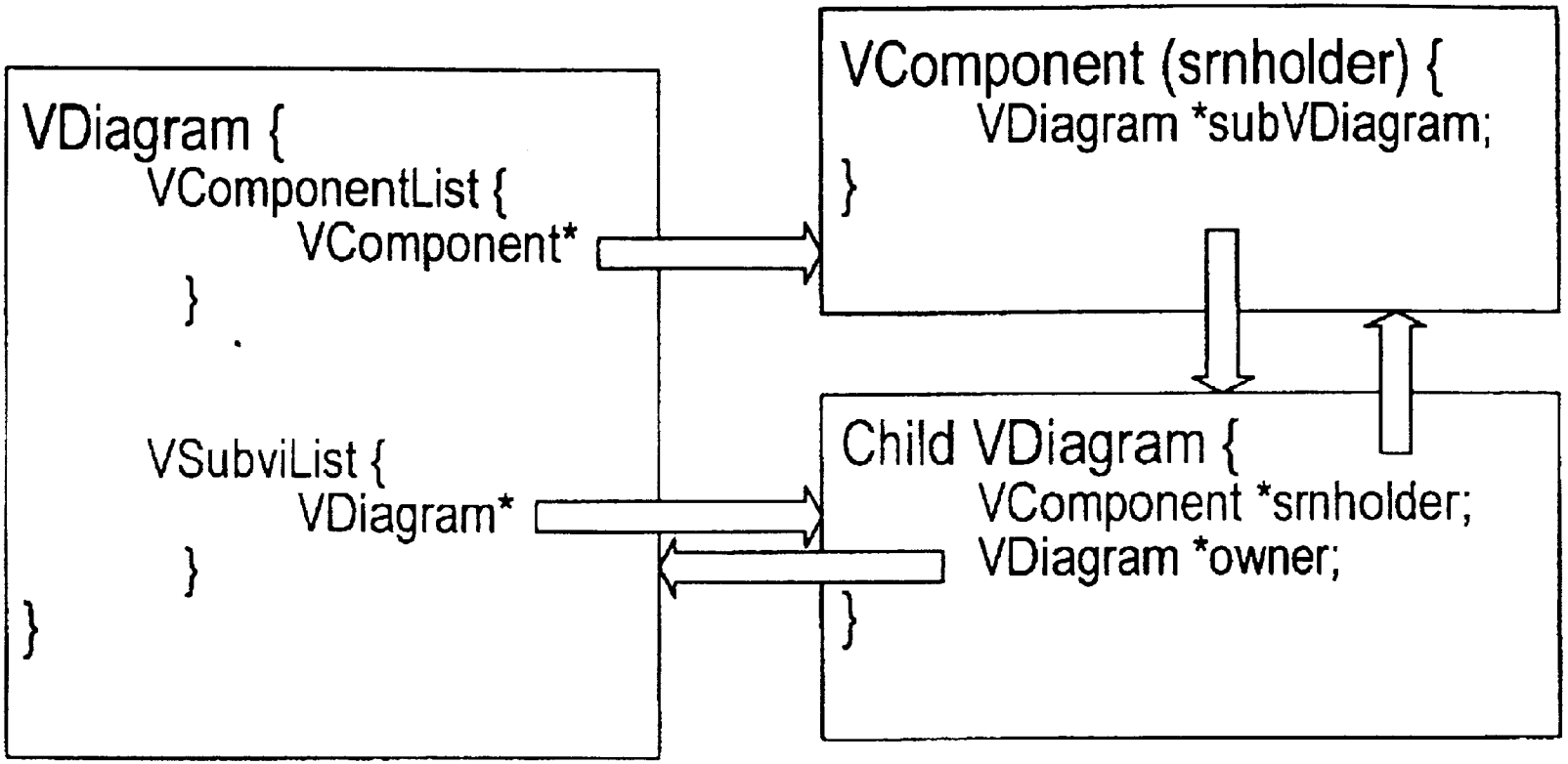
FIG. 11 is an example VDiagram hierarchy illustrating the relationship of a parent VDiagram, child VDiagram, and srnholder for a simple graphical program.

FIGS. 10 and 11—VDiagram Tree Structures

The VDiagram tree comprises data structures called VDiagrams. The root VDiagram contains information for the program items present in the top-level graphical program, such as wires, constants, etc. Any complex items such as sub-programs, functions, loop structures, etc. are represented as child VDiagrams. Parent VDiagrams have pointers to all their child VDiagrams so that a tree is formed for the program hierarchy. Each child VDiagram also has a pointer back to its parent.

The VDiagram code is preferably written in C++. The following pseudocode describes the contents of each VDiagram:

```
class VDiagram {
public:
    VComponentList complist;
    VSignalList signallist;
    VAssignmentList assignlist;
    VSubvlList arnlist;
    VSubviList subvilist;
    VPortMap topportrap;
    VResourceList resourcelist;
private:
    int isSubvi;
    VDiagram *owner;
    VComponent *srnholate;
    ObjID rootobj;
    char *entityname;
};
```

FIG. 10 provides a graphical representation of a VDiagram and the relationship among its elements. Each of these elements is discussed below. Note that specific graphical program components and constructs are discussed below, such as wires, functions, sequence structures, case structures, loops, loop tunnels, shift registers, etc. For more information on these concepts, please see the above-referenced patents or the LabVIEW documentation available from National Instruments.

complist

The component list contains a list of components that appear in the graphical program. The VDiagram thus preserves some of the structure present in a graphical program so that it appears in the resulting hardware description. Components include functions such as adders, multipliers, and comparators. Components also include objects that represent higher-level programming constructs such as while loops and sequences. Components also include sub-programs. Components on the list are subdivided by type. In the preferred embodiment in which a VHDL description is generated from the VDiagram tree, components generally correspond exactly to entities in a VHDL file.

signallist

The signal list stores all of the wires for the VDiagram. This includes all of the wires that appear on the graphical program itself, as well as any hardware-specific wires that are added, such as the clock and reset signals. Each signal stores a list of the components that it attaches to.

assignlist

Signals can be divided into two groups: signals that are driven by components and signals that are driven by other signals. The assignment list contains objects that describe relations of the latter type. Examples include boolean expressions, multiplexers, and decoders. For example, if a component has multiple input signals, it will need to have an enable signal that is composed of an AND of the enable out signals corresponding to the inputs. The assignment list will contain an entry specifying this relationship.

srnlist

This list contains pointers to additional VDiagrams, each of which represents a subframe of a graphical program. A subframe is the area inside of a structural component such as a while loop, a sequence frame, a case structure, etc. The root object of a subframe is a self reference node (SRN) which encloses the entire subframe. See the descriptions below and the above-referenced documentation for more information.

subvilist

Similar to the srnlist, the subvilist contains pointers to additional VDiagrams. These VDiagrams represent subvi's (subprograms) instead of subframes. The distinction between subvi and subframe is made to help the VDiagram back ends keep the hardware description organized. For example, the VHDL back end may keep all of the subframes of a program together in the same file, but may place the VHDL generated for subprograms in separate files.

The root object of a subprogram is a self reference node (SRN) which encloses the entire subprogram. See the descriptions below for more information.

topportmap

The topportmap is a list of ports that describe the connections between a graphical subprogram or subframe and its parent. These connections include things like data tunnels (a connection between a program and a loop's subframe), global variable hardware register connections, and other hardware-specific signals such as clock and reset.

resourcelist

The resourcelist is a list that keeps track of where hardware resources like A/D converters, D/A converters, and global variables are being used in the VDiagram tree. Parent VDiagrams inherit resource information from their children. (The VDiagram tree is built in a depth-first manner.) At the top-level VDiagram, the consolidated resource information from all child VDiagrams is used to build the logic that connects external hardware resources to the components that use them.

isSubvi

This is an integer used to identify the type of the VDiagram. There are three possibilities: V_TOPLEVELVI, V_SUBVI, and V_SRNVI. The top-level VDiagram is flagged as V_TOPLEVELVI. Child VDiagrams are flagged as V_SUBVI if they correspond to a subprogram, or V_SRNVI if they correspond to a subframe. See the descriptions for subvilist and srnvilist for more information.

owner, srnholder

The owner pointer points back to the parent VDiagram. The srnholder pointer points back to the srnholder in the parent VDiagram's component list. FIG. 11 shows an example VDiagram hierarchy illustrating the relationship of a parent VDiagram, child VDiagram, and smholder for a very simple graphical program containing a single subprogram. In this example, an srnholder appears in the parent VDiagram's component list. This srnholder points to the child VDiagram representing the subprogram. The parent VDiagram also contains an entry in its subvilist that points to the child VDiagram. As shown in FIG. 11, a child VDiagram points to both its parent VDiagram and its parent smholder.

rootobj

The rootobj pointer points to the root object that the VDiagram represents in the graphical program. In the preferred embodiment, the graphical program being converted to a hardware description is a LabVIEW VI. In this case the rootobj pointer would point to the root LabVIEW object for the VDiagram. The root object for a VDiagram may also be called a self reference node (SRN).

entityname

The entityname character string is a unique name for the VDiagram. There may be different naming conventions. For example, the top-level VDiagram may be named "toplevel," and the child VDiagrams may be named by concatenating the hex value of the rootobj pointer with some other information about the graphical program, such as the project name or file name.

Figure 12:
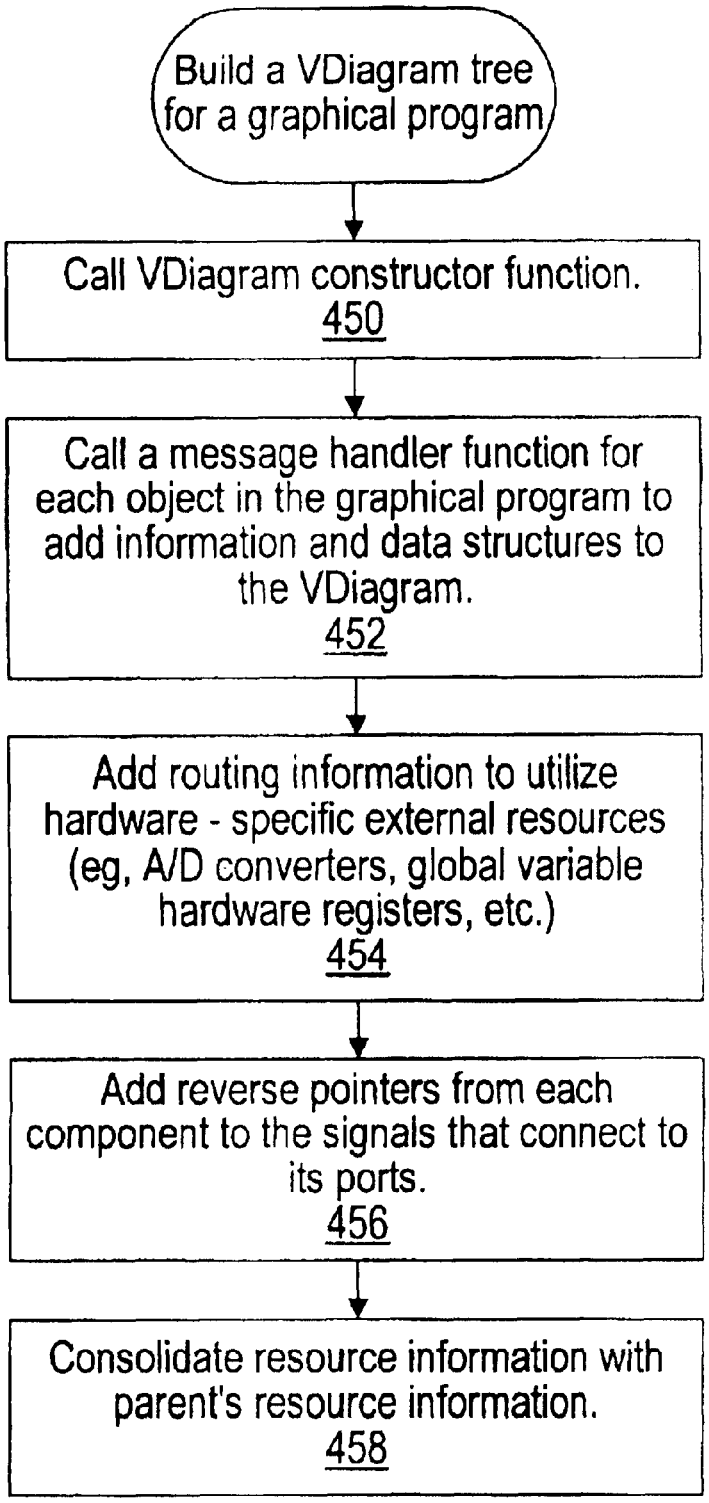
FIG. 12 is a flowchart diagram illustrating the process of building a VDiagram tree for a graphical program.

FIG. 12—Building a VDiagram Tree

FIG. 12 is a flowchart diagram illustrating the basic process of building a VDiagram tree for a graphical program. FIG. 12 shows step 406 of FIG. 8 in more detail. In step 450 the VDiagram tree constructor function is called for the appropriate root object of the graphical program, i.e. the point in the graphical program where conversion into a hardware description should begin. If the entire graphical program is to be converted, the constructor function should be called for the top-level program root object. In the preferred embodiment this is a self reference node (SRN) for the top-level LabVIEW VI. It may be desirable to translate only a part of the graphical program into hardware. For example, to convert a subprogram into hardware, the root object pointer for the subprogram is passed to the VDiagram constructor function.

Figure 13:
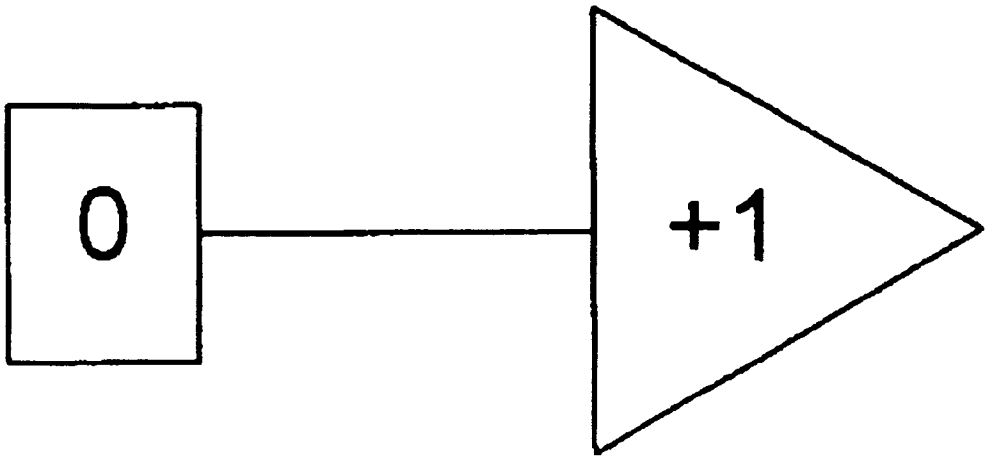
FIG. 13 is a simple graphical program used as an example of building a VDiagram.

The VDiagram constructor function is also called for each element in the portion of the graphical program to be translated that should be represented by a separate VDiagram (e.g., subprograms and subframes for loops, sequences, etc.). The constructor function also takes pointer parameters for the VDiagram's owner and smholder (described above) so that a VDiagram tree is built as shown in FIG. 13. The VDiagram tree is built in a depth-first manner. One reason for this is that a VDiagram needs to consolidate resource information for itself and all of its child VDiagrams, so the child VDiagram resource information must be determined first.

In step 452 the VDiagram constructor function calls a message handler function to add information and data structures to the VDiagram for each object in the portion of the program referenced by the root object pointer passed to it. For example, VComponents, VSignals, VSigterms, etc. are added to the VDiagram to represent each element of the graphical program. The message handler that is called is specific to the type of object, e.g. constant, function, signal, programmatic structure, subprogram, etc. Each message handler function adds any additional hardware information to the VDiagram that is necessary to convert the object into a hardware design but is not represented in the original graphical program. For example, enable and reset signals are added for each component. Step 452 is discussed in more detail below in the description for FIG. 14.

In step 454 the VDiagram constructor function adds routing information to the VDiagram for utilizing hardware resources such as A/D converters, global variable hardware registers, etc. Hardware resources require access to specific resources on the programmable logic device (PLD). For example, a hardware resource may require a connection to a specific pin on an FPGA. This PLD-specific information is available from the top-level VDiagram, but not from child VDiagrams. Thus, for child VDiagrams ports are added to the VDiagram's topportmap to route hardware-specific data through its parent VDiagram. At the top-level VDiagram, all hardware resource information is consolidated and logic is generated to interface with resources outside the PLD. More information on resources and arbitration follows in a later section.

In step 456 the VDiagram constructor function adds reverse pointers from each component to the signals connected to its ports. This is done primarily to aid in traversal of the VDiagram and is helpful to hardware description back ends.

In step 458 the resourcelist information for the VDiagram is consolidated with the parent VDiagram's resourcelist. Thus each VDiagram contains all the resource information necessary to implement itself and its children in hardware, and the top-level VDiagram is able to build the proper external interface logic.

Figure 14:
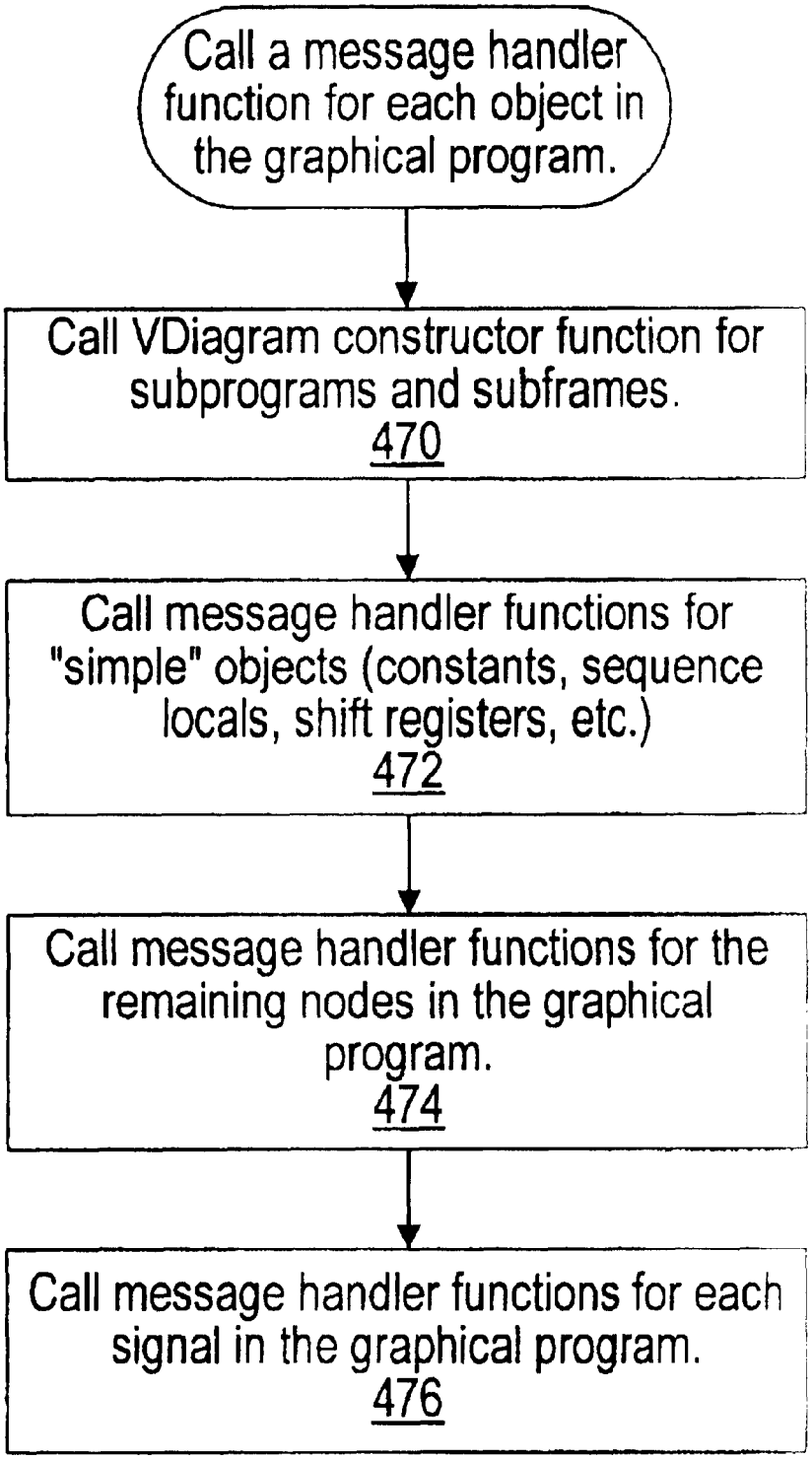
FIG. 14 is a more detailed flowchart diagram illustrating the step adding VDiagram information for each object in a graphical program.
Figure 15:
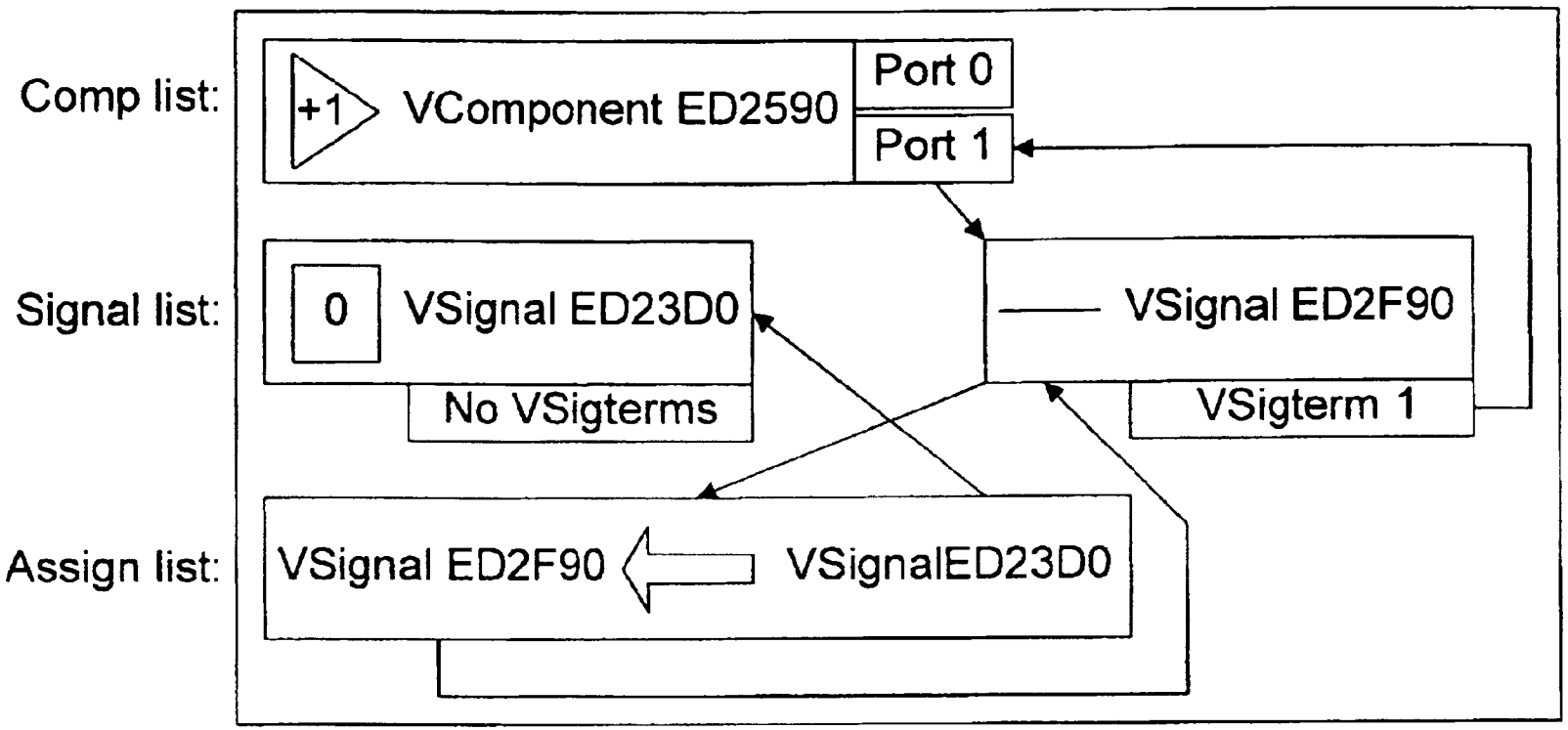
FIG. 15 is a block diagram representing a VDiagram for the example program of FIG. 13.

FIGS. 13–15: Graphical Program Example

FIG. 13 is a simple graphical program that is used here for an example of building a VDiagram. This program contains only three objects: a constant zero, a signal, and an incrementer function. The signal connects the output of the constant object to the input of the incrementer function. The incrementer function increments the integer value of the input by 1. In a real program there would be another signal connecting the output from the incrementer function to some other input port, but for simplicity it is not shown here. Depending on the particular embodiment, some other visible or invisible "object" is associated with the three objects shown in the diagram to group them together. In the case of a LabVIEW VI, this invisible object is called a self reference node (SRN). This grouping object is the same as the root object for the graphical program as described above.

The VDiagram is generated by calling the VDiagram constructor function with a pointer to the root object, null pointers for the owner and srnholder parameters, and a flag to indicate that it is a top-level VDiagram. As shown in FIG. 12, the constructor first performs step 452 of calling a message handler function to add information and data structures to the VDiagram for each object in the graphical program.

FIG. 14 illustrates the steps performed by the method step 452 of FIG. 12 in more detail. Each type of object in a graphical program has a corresponding message handler function, and each message handler adds information and/or data structures to the VDiagram for representing the object in hardware. The message handler functions are called in a particular order. In step 470 any objects in the program that should be represented as child VDiagrams are processed. The VDiagram constructor function is called for objects such as subprograms and subframes (e.g., the inside of a while loop). Thus, VDiagram information is added in a depth-first manner. There are no objects on the example program of FIG. 13 which are represented as separate child VDiagrams.

In step 472, message handlers are called for each of the simple objects present in the program such as constants, indicators for front panel displays, sequence local variables, etc. In the example program of FIG. 13, the only object present of this type is the constant zero. The message handler function for a numeric constant adds information to the VDiagram necessary to instantiate the constant in hardware. A constant is represented in hardware as a signal with an unchanging value. Thus the message handler adds a new VSignal to the VDiagram's signallist. Flags are set in the VSignal data structure to signify that it is a constant signal with an initialization value of zero. At this point the VSignal representing the constant zero is not connected to anything else. For now it is simply created and stored in the signallist.

After the message handlers for all the simple objects are called in step 472, message handlers are called in step 474 to add information and data structures representing the rest of the nodes in the graphical program to the VDiagram, such as functions. As described above, a graphical program is typically built by connecting "nodes" with "wires". Each node object represents an operation such as function or subprogram, or a programmatic structure such as a loop, or a data source/target such as a constant or a global variable, etc. Each wire object represents a connection between node objects. Wires are also called signals.

In the example program of FIG. 13 there are two node objects connected by a wire. The information for the simple constant node object is added in step 472. The only other node in the program is the incrementer function. The incrementer function message handler is called in step 474. The message handler function for the incrementer function adds a VComponent to the VDiagram's complist. In the preferred embodiment, the VComponent contains information referencing a hardware library component that may be used to implement the functionality of the incrementer function in hardware. This reference to the library component may later be used by the back end that generates a particular hardware description from the VDiagram. For example, a VHDL back end may generate standard VHDL syntax for an entity declaration and component instantiation. The entries in the VDiagram's complist are sorted by type so that it is easy to declare components by type and instantiate them individually. In another embodiment, the back end may be configured to generate a hardware description that implements the functionality of the incrementer function using constructs of the back end's hardware description language (e.g., VHDL, EDIF, etc.) rather than referencing a library component.

After message handlers for all the other objects have been called, a message handler function is called for each wire (signal) in the graphical program. This order of generating node information before signal information is important. Since signals connect other objects, the information for the objects, such as their port numbers, must be available to the signal message handler.

Only one signal is present in the example graphical program: the wire that connects the constant to the incrementer function. Signals in the graphical program map directly to VSignals in a VDiagram. The message handler creates a new VSignal data structure and adds it to the signallist. As noted in the description above for the assignlist of a VDiagram, signals can be divided into two groups: signals that are driven by components and signals that are driven by other signals. The VSignal representing the wire in the example graphical program is driven by another signal, since the constant zero is implemented as a hardware signal. A VAssignment data structure is added to the VDiagram's assignlist to represent this relationship. A pointer is added from the VSignal representing the wire in the program to the VAssignment specifying the signal-driving relationship. Another pointer is added from the VAssignment to the VSignal representing the constant zero to denote the source of the driving signal in the VAssignment.

The VSignal representing the wire in the example program drives a component rather than another signal. This relationship is represented by adding a VSigterm to the VSignal. The VSigterm points to the input port of the incrementer function component. Additional VSigterms could be added for signals that drive more than one component.

Step 452 of FIG. 12 is complete after the message handler function has been called for each signal (step 476 of FIG. 14). As shown, step 454 may then add information to the VDiagram for implementing hardware-specific resources. This example will skip step 454. Resources and arbitration are discussed in detail below.

In step 456 of FIG. 12, reverse pointers are added from each VComponent to the VSignals connected to its ports. Each VSignal is checked to make sure that its VSigterms point to a valid port on a valid VComponent. If the VSigterm is valid, a return pointer is created from the VComponent port back to the VSignal. In the FIG. 13 example program, the VDiagram contains only one VSigterm, so only one return pointer is created in this step. This is a pointer from the input port of the incrementer function VComponent to the VSignal representing the wire on the graphical program.

In step 458 of FIG. 12, the resourcelist information for the VDiagram is consolidated with the parent VDiagram's resourcelist. However, for this FIG. 13 example the VDiagram has no parent. The VDiagram tree contains only the top-level VDiagram. Thus, for the purposes of this example the VDiagram is complete after step 456.

FIG. 15 is a block diagram representing the VDiagram constructed for the example program of FIG. 13. As noted, this example omitted details regarding hardware resources. It also omitted a discussion of signals that are added to implement an enable chain among the objects. These aspects are discussed below. FIG. 15 illustrates the VDiagram data structures discussed above and the relationships among them. The hex numbers shown are example memory addresses for the structures.

Figure 16:
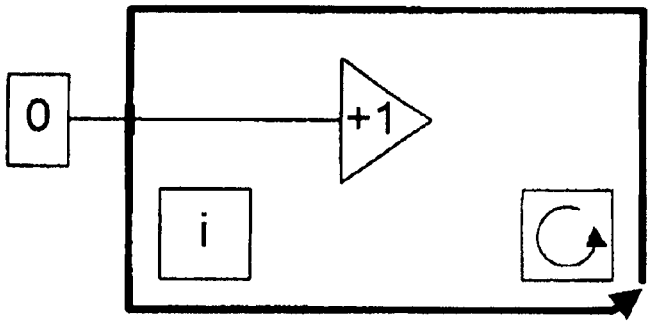
FIG. 16 is an example graphical program containing a while loop structure.
Figure 17A:
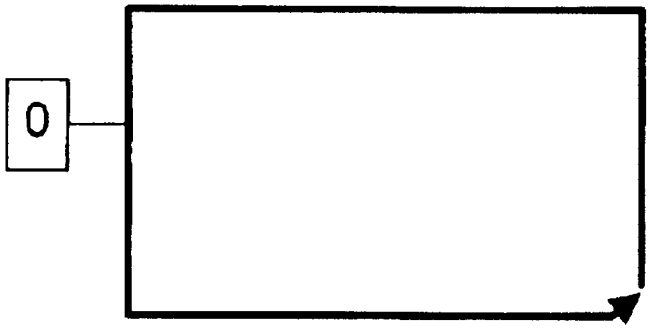
FIGS. 17A and 17B are partial graphical programs illustrating aspects of the graphical program of FIG. 16.
Figure 17B:
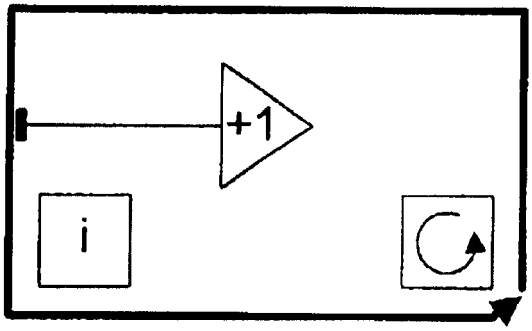
Figure 18:
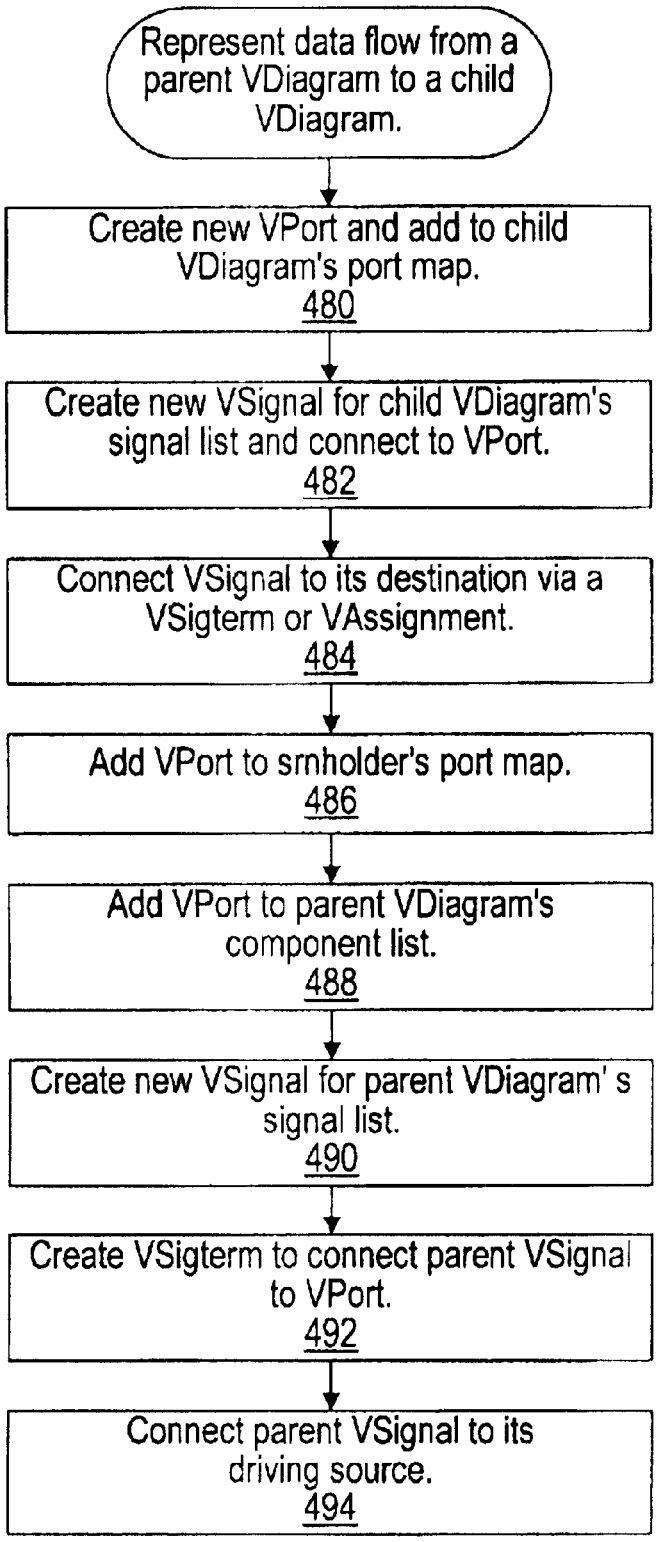
FIG. 18 is a flowchart diagram illustrating how the flow of data from a parent VDiagram to a child VDiagram is represented.

FIGS. 16–18: Data Flow Between VDiagrams

Data often flows across component boundaries in a graphical program. For example, wires in the main graphical program may go into a subprogram or vice versa, data may cross a loop boundary via a data tunnel, etc. This data flow is preserved in the data flow among VDiagrams in a VDiagram tree. FIGS. 16–18 illustrate data flow between VDiagrams.

FIG. 16 is a graphical program containing a while loop structure. As shown, a signal passes from the constant zero through a data tunnel into the while loop. As discussed above, programmatic structures such as while loops are represented as child VDiagrams of the parent VDiagram. FIG. 17A illustrates the graphical program from the point of view of the parent VDiagram. The parent VDiagram contains information representing the constant zero and the container object for the while loop. It views the while loop as a black box through which data enters via a data tunnel. FIG. 17B illustrates the graphical program from the point of view of the child VDiagram. The child VDiagram contains information representing the while loop subframe. Data enters the subframe via a data tunnel and flows to the incrementer function.

FIG. 18 is a flowchart diagram illustrating how the flow of data from a parent VDiagram to a child VDiagram is represented. As noted above, a VDiagram tree is constructed in a depth-first manner. The flowchart thus begins with what occurs for the child VDiagram. In step 480 a new VPort data structure is created and added to the child VDiagram's top-portmap. In step 482 a new VSignal is created and added to the child VDiagram's signallist. This VSignal represents the wire that appears in the portion of the graphical program represented by the child VDiagram. For example, it may represent the wire of FIG. 17B that connects to the incrementer function. The VSignal is mapped to the VPort created in step 480 to signify that the signal enters the child VDiagram from an external source.

In step 484 the VSignal created in step 482 is connected to its destination. For example, in FIG. 17B the wire shown connects to the input port of the incrementer function. In this example, a VSigterm pointing to the input port of the VComponent representing the incrementer function is added to the VSignal. If the VSignal drives another signal instead of a component, a VAssignment is created in step 484 instead of a VSigterm.

In step 486 the VPort created in step 480 is added to the port map of the child VDiagram's srnholder. In step 488 the VPort is added to the complist of the parent VDiagram. The VPort created for the child VDiagram in step 480 is thus available to the parent VDiagram to use to send data into the child VDiagram.

In step 490 a new VSignal is created and added to the parent VDiagram's signallist. This VSignal data structure represents the wire on the graphical program that enters into the portion of the program represented by the child VDiagram. For example, it may represent the wire of FIG. 17A that originates from the output port of the constant zero object and enters the while loop subframe. A signal that crosses between VDiagram boundaries is thus represented as two separate VSignal data structures: one in the child VDiagram (created in step 482) and one in the parent VDiagram (created in step 490).

In step 492 the two VSignals created in steps 482 and 490 are connected. A VSigterm is added to the parent VDiagram's VSignal which points to the VPort that was added to the parent VDiagram's complist in step 488. Thus the two VSignals are now joined via the VPort.

In step 494 the parent VDiagram's VSignal is mapped to its driving source. For the example program of FIG. 17, this mapping is accomplished by creating a VAssignment specifying that the VSignal is driven by another VSignal which represents the constant zero.

The example above is for data flowing from a parent VDiagram into a child VDiagram. The VDiagram tree may represent data flowing from a child VDiagram to a parent VDiagram using a similar mechanism. Also, the example is for data crossing the boundary of a while loop. Data crossing other programmatic construct boundaries and subprogram boundaries may also be represented similarly in the VDiagram tree. For example instead of loop tunnels, a subprogram may have subprogram connectors connecting the subprogram to front panel controls and indicators. These front panel data control objects may be associated with ports on the subprogram connectors using VPorts as described above.

Figure 19:
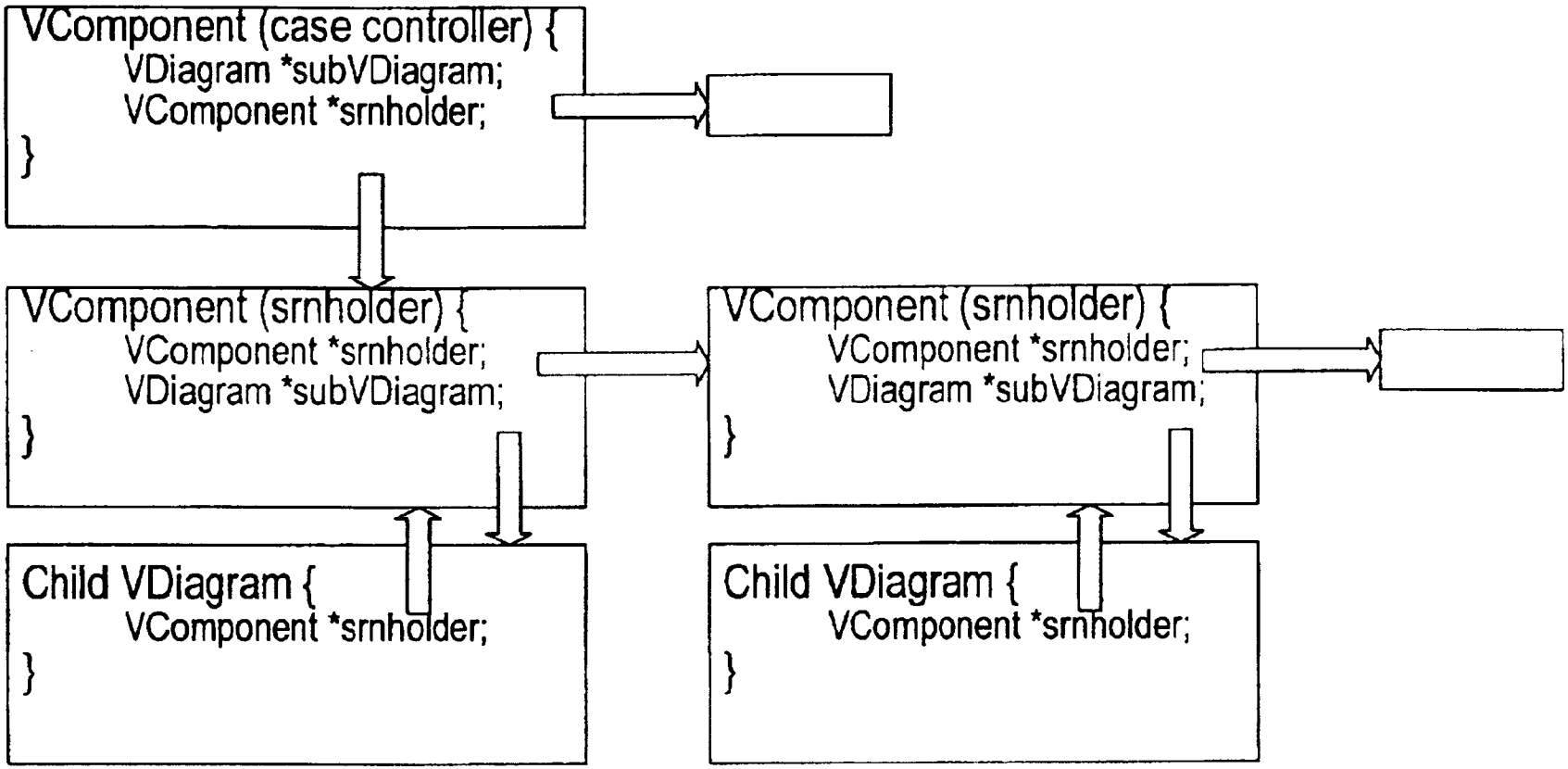
FIG. 19 is a block diagram illustrating the relationship among structure controllers, srnholders, and child VDiagrams.

FIG. 19—Case Structure Controller

As described previously, the subframes of complex programmatic structures such as while loops, for loops, and case structures are represented as child VDiagrams. An srnholder, which is a type of VComponent, is inserted into the parent VDiagram's complist. The srnholder VComponent points to the child VDiagram. The parent VDiagram also points to the child VDiagram. The child VDiagram also points back both to its srnholder and to its parent VDiagram. This relationship is illustrated in FIG. 11. (One difference is that FIG. 11 indicates that the child VDiagram is a member of the parent VDiagram's subvilist. VDiagrams representing subprograms are members of the parent's subvilist. However, VDiagrams representing programmatic structure subframes are members of the parent VDiagram's srnlist instead.)

A parent VDiagram needs additional information besides an srnholder VComponent and a child VDiagram in order to convert programmatic structures into hardware. For example, a while loop also needs an iteration counter and a variable representing the continue condition; a for loop needs to run for a specified number of iterations; a case structure needs to decode its select input, etc. Additional information is added to a parent VDiagram to fulfill these requirements using a structure controller data structure. A structure controller is represented in the VDiagram as another VComponent in the parent VDiagram's complist.

The structure controller VComponent contains ports which connect to iteration count nodes, continue nodes, case select nodes, maximum iteration nodes, etc. The message handler functions which generate the VDiagram information for each type of programmatic structure generate the appropriate VPorts and VSignals to route the necessary input/output signals from these structure controller ports to the child VDiagrams.

FIG. 19 illustrates the relationship among structure controllers, srnholders, and child VDiagrams. The figure illustrates an example for a case structure with two cases (i.e., there are two possible subframes). As shown there is an srnholder for each child VDiagram representing a subframe. Each srnholder points to its corresponding child VDiagram, and each child VDiagram points back to its srnholder. The smholders also have an associated srnholder pointer. These srnholder pointers are used for programmatic structures with multiple elements such as case structures and sequence structures. For these types of structures, the smholder pointers of the srnholders are used to link together the srnholders, as shown in FIG. 19. The structure controller points to the srnholder corresponding to the programmatic structure. For structures with more than one srnholder, the structure controller points to the first srnholder in the list, as shown in the figure.

Figure 20:
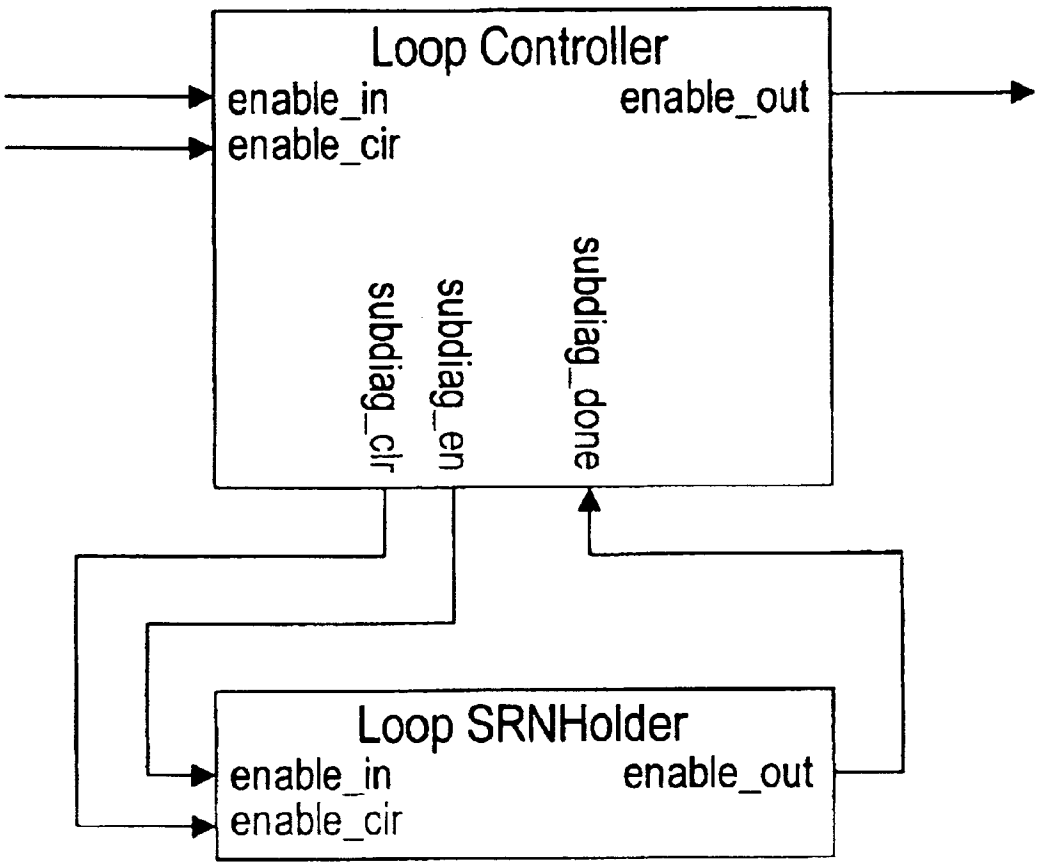
FIG. 20 is a block diagram illustrating how a structure controller drives the enable ports for a VDiagram representing a while loop subframe.

FIG. 20—Enable Chain Block Diagram

An order of execution is inherent in graphical programs. For example, the order in which two input signal parameters reach a two-integer adder function is not important, but it is important that both input parameters have reached the adder and are valid before the adder function performs the addition operation and the program continues execution using the output from the adder. Graphical program systems use mechanisms to ensure proper execution order. In order to faithfully duplicate a software program, hardware designs must also include such mechanisms. As a VDiagram tree is constructed, an enable chain is maintained for all components which ensures proper execution order and resolves hardware timing issues.

Three special VPorts are added to every VComponent in a VDiagram's complist. These ports are named enable_in, enable_out, and enable_clr. As noted above, objects in a graphical program such as programmatic structures and functions are implemented in the preferred embodiment using predefined hardware library components. These components are configured to respond to the enable_in and enable_clr signals and generate the enable_out signal as described below. In another embodiment, the functionality of the structures and functions is specified in the hardware description generated by the back end rather than by referencing a library component. In this case, the description generated by the back end includes functionality for the enable_in, enable_out, and enable_clr signals.

The enable_in port receives an input signal signifying when the input data for a component is valid. Each component is responsible for monitoring the enable_in input. Each component delays the enable_in input for as many clock cycles as necessary to perform the computation and then drives the enable_out signal to indicate that the output from the component is valid. Enable_in and enable_out are level-triggered signals. Once enable_out is asserted for a component, it remains asserted until the enable_clr signal is asserted. When this occurs, the enable_out signal is deasserted.

The enable_in, enable_out, and enable_clr VPorts are added to the port maps of each VComponent by the message handler function for each component in step 452 of FIG. 12. VSignal data structures are added to represent the signals connected to these ports. Each wire that appears in the graphical program is also associated with an enable signal. When the data carried by the wire is valid the associated enable signal is active high. For signals that drive components, the enable signal is connected to the enable_in port of the components. For a component that has multiple input signals, all of the enable signals associated with the input signals are AND'd together to drive the component's enable_in signal. This AND is represented in the VDiagram with a VAssignment, and the VComponent has a pointer to the VAssignment.

Enable_in, enable_out, and enable_clr ports are also added to the topportmap of each VDiagram. These ports are master enable ports for the entire VDiagram. The VDiagram's enable_in port is routed to the enable_in ports of all the VComponents in the VDiagram's complist. This master enable_in signal is AND'd together with the enable signals associated with any input signals the component has. Similarly, the master enable_out signal for the VDiagram is driven by ANDing together the enable_out signals for the VComponents. The VDiagram's master enable_clr signal is routed to the enable_clr ports for all of the VComponents.

The enable ports for child VDiagrams associated with while loops and for loops are driven by the corresponding structure controller. FIG. 20 illustrates how the structure controller drives the enable ports for a VDiagram representing a while loop subframe. The structure controller has its own master enable signals. It also sends enable signals based on the execution state (e.g., iteration count) to the master enable signals for the child VDiagram's srnholder. Although not shown in the figure, the master enable signals of the smholder map directly to the master enable signals of the child VDiagram.

The enable chain for a case structure is slightly different. The case controller decodes its select input and asserts an enable_in signal for only one of its child VDiagrams. The case controller's subdiag_en output signal is a vector type, with one bit for each child VDiagram. The vector is one-hot encoded and each bit is routed to the enable_in of a specific child VDiagram. The subdiag_done input is a single-bit signal and is driven by the logical OR of all of its child VDiagram's enable_out outputs. The schdiag_clr signal is routed to all child VDiagrams.

Sequence structures are unique because they do not use a structure controller. Instead, a sequence is treated as a normal component and is fitted into the enable chain in the standard way. The only difference is that the srnholder for the first frame in the sequence receives all of the enable_in fan-in signals for the entire sequence. The srnholder for the last frame in the sequence produces the enable_out signal for all VComponents that depend on any output of the sequence. All intermediate sequence frame srnholders simply connect their enable_out outputs to the enable_in input of the next frame. This ensures that the frames of the sequence structure execute in hardware in exactly the same order as they would in software.

FIGS. 21–26: Resources and Arbitration

Many programs that are converted into hardware require hardware resources external to the programmable logic device (PLD). Hardware resources include A/D converters and digital I/Os. Resources also include primitives that move data between the PLD and the CPU, such as global variable registers and DMA transfer primitives. A system is needed to represent the hardware resource requirements in a VDiagram tree. Often, the same resource is used in many places in the hierarchy of VDiagrams in the VDiagram tree. Therefore a system of arbitration is also needed to manage multiple simultaneous accesses to the same resource. This section describes the systems used to represent and arbitrate hardware resources in the VDiagram tree.

Interfacing external hardware resources with a PLD requires coordinating the external resources with resources of the PLD. For example, different external resources require a connection to specific pins on an FPGA. As examples, global variable registers need to access the external address and data bus, and A/D converters need access to the data and control signals for a specific A/D channel. Such specific resources are only available from the level of the root VDiagram. Thus, resources are only instantiated in the top-level VDiagram. As child VDiagrams are constructed, they consolidate their resource information with their parent VDiagrams so that the top-level VDiagram has all the information necessary to instantiate resources for the entire hardware description.

Each place where a specific resource is used in a VDiagram is called an access point. A resholder data structure (a type of VComponent) is added to the VDiagram's complist for each access point of a specific resource. Resholders can be of type read-only, write-only, or read-write. These resholders route the data and enable chain signals from each access point up through the parent VDiagram to the top-level VDiagram, where the individual requirements are arbitrated and fed into the child VDiagrams containing the resource-requiring VComponents.

Each VDiagram also has a resourcelist, which is a linked list of VResource objects. Each VResource represents a specific hardware resource. There may be many resholders for multiple access points for a single resource in a VDiagram, but the resource is represented only once in the resourcelist. Each VResource object maintains a list of read-type resholders and a list of write-type resholders.

Figure 21:
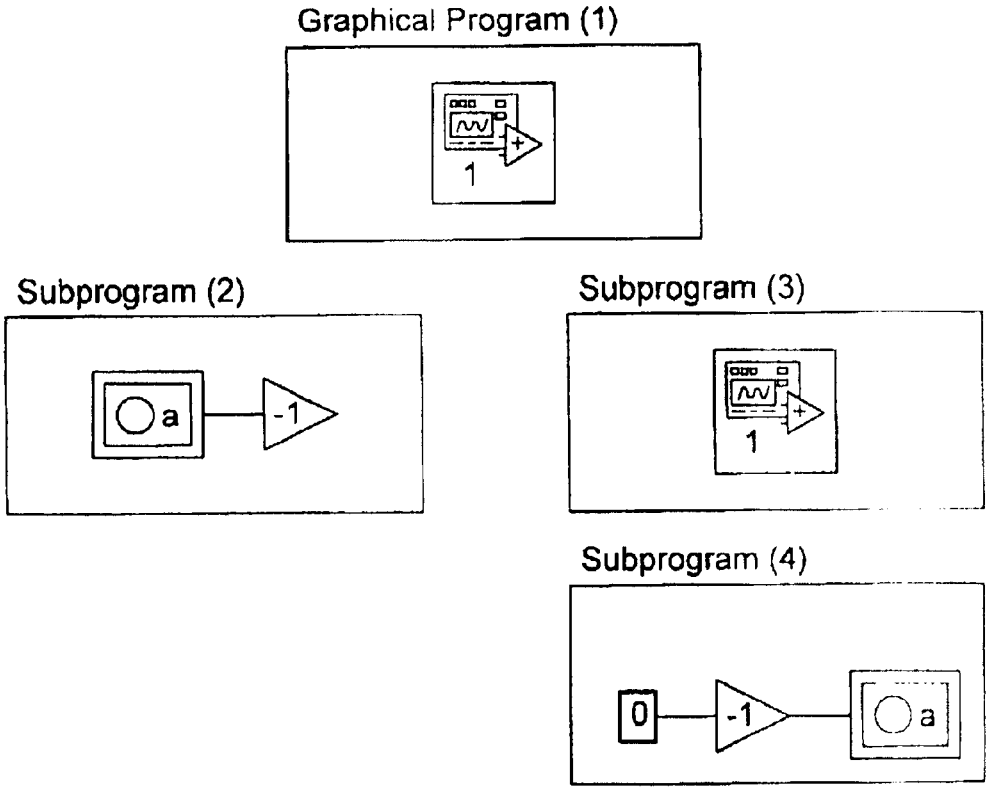
FIG. 21 is an example program hierarchy in which the same global variable is read in one subprogram and written in another subprogram.
Figure 22:
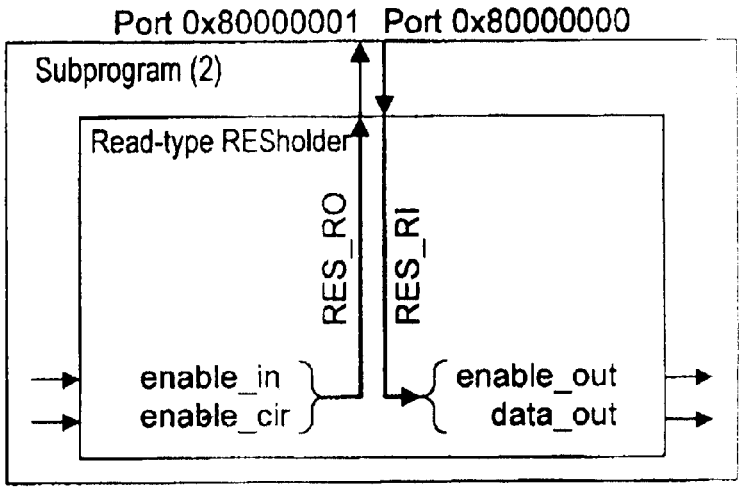
FIGS. 22 and 23 are block diagrams illustrating the hardware represented by VDiagrams for various subprograms of FIG. 21.

FIG. 21 illustrates an example program hierarchy in which the same global variable is read in one subprogram and written in another subprogram. The process of building a VDiagram tree which requires external resources is described here for the example program hierarchy of FIG. 21. This example will focus on the information added to the VDiagrams to represent the external resources. As shown in step 452 of FIG. 12, the VDiagram constructor calls a message handler function to add information for each object to the VDiagram. As explained above, child VDiagrams are added to the VDiagram in a depth-first traversal order of the graphical program hierarchy. We thus start with subprogram number 2. Subprogram number 2 reads global variable "a". Thus, the message handler unction that adds the information representing the global variable object to the Diagram adds a read-type resholder to the VDiagram. The read-type resholder has a data output signal for the value that is read from the hardware resource (the global variable register in this case). The resholder also has the normal enable_in and enable_clr inputs and the enable_out output. In addition, it has two special ports called RES_RI and RES_RO. These abbreviations stand for "resource read input" and "resource read output". The resholder bundles its normal inputs and outputs into a read group and a write group and connects these bundles to the RES_RI and RES_RO ports, respectively. Since this VDiagram is not the top-level VDiagram, ports are created on the VDiagram's topportmap to pass the resholder's RES_RI and RES_RO data up to the next level VDiagram. FIG. 22 illustrates the hardware represented by the VDiagram for subprogram 2.

After the global variable object's message handler function adds the read-type resholder for the read access point, it also adds a VResource object to the VDiagram's resource list. The address of the resholder is added to the VResource's list of readers. Since in this example there are no other access points for the global variable "a," no other entries appear in the VResource's lists of resholders.

After the global variable object's message handler function completes, step 452 of FIG. 12 continues as expected, calling message handlers for the incrementer function and wire shown in subprogram 2. As shown in FIG. 12, the next step 454 adds routing information for the resources to the VDiagram. VPorts are added to the topportmap of the VDiagram to pass the resource RES_RI and RES_RO signals between the VDiagram and its parent VDiagram. There is only one resource in the VDiagram's resourcelist and that resource only has one resholder. Thus, only two top-level ports are needed. After the two top-level resource VPorts are built, VSignals are added to connect the top-level VPorts to the RES_RI and RES_RO ports on the resholder VComponent.

As previously noted, VPorts of a child VDiagram are copied to the srnholder's port map. The port numbers assigned to the resource ports of the resholders are recorded. The parent VDiagram can use this information to route the resource signals through the appropriate ports in the srnholder to reach the appropriate resource access points.

Step 456 of FIG. 12 executes normally. This step does not need to do anything special to handle resources.

Step 458 of FIG. 12 consolidates the resource information in the VDiagram's resourcelist with the parent VDiagram's resourcelist. At this point, any access points in the portion of the program represented by the parent VDiagram have not yet been identified. However, the resource information for each child VDiagram is consolidated as step 458 is performed for each child VDiagram. Resource information for the parent VDiagram's own access points is added when the steps of FIG. 12 are carried out for the parent VDiagram.

The VResources of the child VDiagram that is constructed first are simply copied into the parents VDiagram's resourcelist. For other child VDiagrams, if the parent resourcelist already has a VResource with the same resource ID as the child's VResource, a complete copy is not performed. Instead, the linked list of resholder pointers in the child's VResource is merged into the linked list of the parent's VResource. As each child VDiagram is built and performs step 458, the top-level VDiagram eventually ends up with the complete set of resource information for the entire VDiagram tree.

Figure 23:
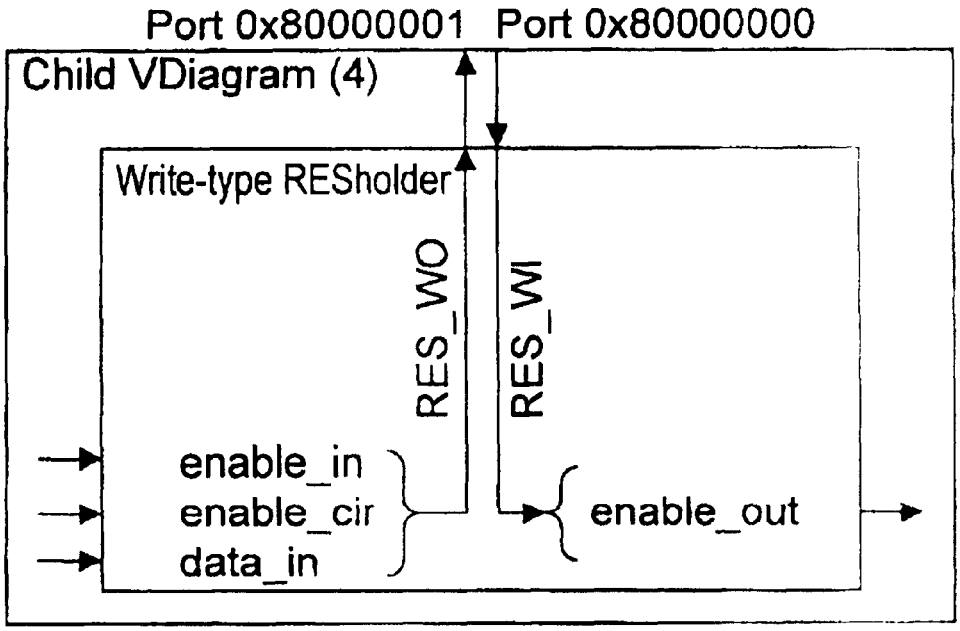

Once resource consolidation is finished, the VDiagram constructor for subprogram 2 returns. The depth-first traversal of the graphical program hierarchy continues with subprogram 4. The only major difference in the construction of VDiagrams for subprogram 2 and subprogram 4 is the type of resholder that is created. Since subprogram 4 writes to the global variable "a," a write-type resholder is added to the VDiagram from subprogram 4 instead of a read-type resholder. FIG. 23 illustrates the hardware represented by the VDiagram for subprogram 4.

Steps 452, 454, 456, and 458 are performed to build the VDiagram for subprogram 4 as described above for subprogram 2. Step 458 merges the VResource object for the global variable "a" into the resourcelist of the parent VDiagram (the VDiagram for subprogram 3). As described above, the write-type resholder for the write access point in subprogram 4 is contained in the VResource's list of write-type resholders.

The depth-first traversal continues with the construction of the VDiagram for subprogram 3. Since subprogram 3 does not have any access points, no new resource data structures are added. However, step 454 is slightly different for subprogram 3 than for subprograms 2 and 4. Because there are no access points for this VDiagram, the only resource information in the resourcelist is the global variable "a" VResource that was inherited from the VDiagram for subprogram 4. The VDiagram constructor function can determine that this VResource was inherited from a child VDiagram by checking the srnholder fields of the resholders in the VResource's linked lists. The srnholder field contains a pointer to the srnholder of the VDiagram from which the resholder was inherited. If the srnholder field is not null, then the resholder in question is a resholder of a child VDiagram. Thus in step 454 when routing information for the resource signals is added, the port map of the srnholder of the appropriate child VDiagram can be searched to find the correct ports to connect the resource signals to. (As noted above in the description for step 454 for subprogram 2, the port numbers assigned to the resource ports of resholders are recorded.)

Figure 24:
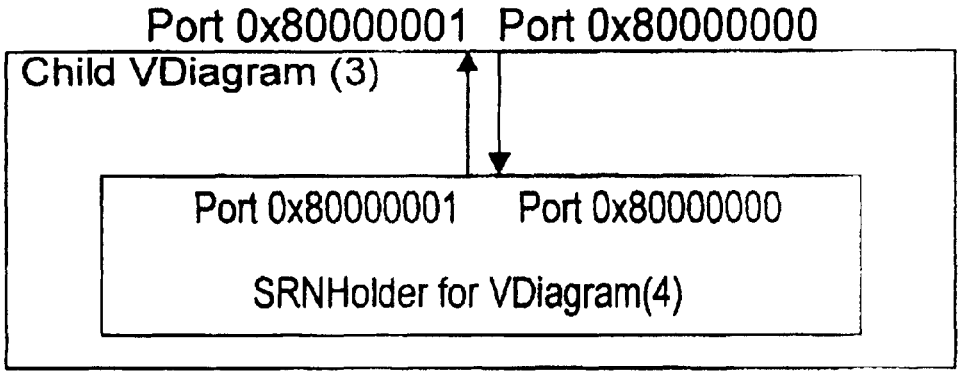
FIGS. 24 and 25 are block diagrams illustrating the ports, components, and connections added to VDiagrams for various subprograms of FIG. 21.

FIG. 24 illustrates the port connections added to the VDiagram for subprogram 3 (referred to as VDiagram 3 ) during step 454 of FIG. 12. Note that ports from the port map of the srnholder for VDiagram 4 are reassigned to ports on the top-level portmap of VDiagram 3. In this example the port numbers do not change between VDiagram 4 and VDiagram 3. If VDiagram 3 had another srnholder exactly like the one for VDiagram 4, the resource ports from that srnholder would get mapped to other top-level port numbers on VDiagram 3, e.g., 0×80000002 and 0×80000003. Thus it is possible for a resource to change port numbers as it propagates up the VDiagram tree.

After generating the ports and signals to connect the srnholder for VDiagram 4 to the port map of VDiagram 3, step 454 of FIG. 12 updates the port number information for resholders whose port numbers were reassigned. (There were no reassignments in this case.) Also, the srnholder field is updated to point to the srnholder for VDiagram 3. This will enable the VDiagram constructor for the top-level VDiagram to determine that resource was inherited from VDiagram 3.

The fields that hold the srnholder and portnumber pointers may get overwritten every time step 454 executes. It is not necessary to preserve this information. If the mapping for a resource at any particular level in the VDiagram tree needed to be determined, it would be possible to compare the fields for the VResource entry in a parent VDiagram with the fields for the VResource entry representing the same resource in a child VDiagram.

After step 454 of FIG. 12 completes for VDiagram 3, step 456 proceeds normally. Step 458 then copies the same resource information that was inherited from VDiagram 4 up to VDiagram 1. VDiagram 1 already has a VResource in its resourcelist for global variable "a" which was inherited from VDiagram 2. The information about the write-type resholder for VDiagram 4 is merged into the resholder list of the existing VResource.

Figure 25:
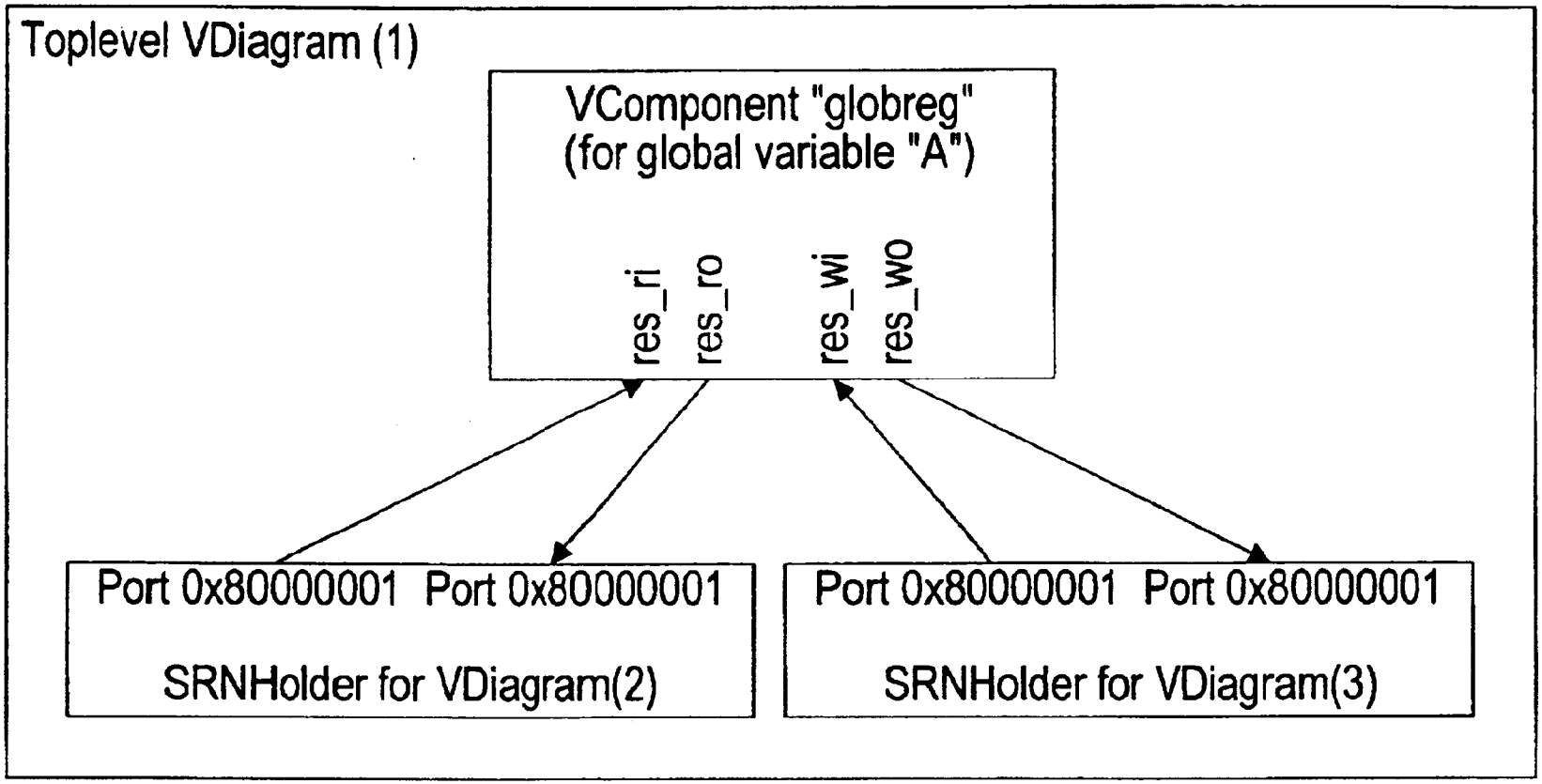

The execution of the steps of FIG. 12 is a special case for VDiagram 1 because VDiagram 1 is the top-level VDiagram. Instead of routing resource ports from srnholders to the toplevel port map, the VDiagram constructor builds VComponents for the resources themselves and connects them to the srnholder ports that feed back to the resholders. In this example, a globreg component is created for the global variable register. The globreg register component is then connected to the external address and data bus ports. Next, the VDiagram constrctor determines whether any arbitrators are necessary to multiplex multiple access points of the same type. If there are zero read or write access points for a given VResource, then the read or write inputs to the resource VComponent are driven with all zeroes. If there is only one read access point then the read ports of the resource VComponent can be connected directly to the resource ports of the read-type resholder. Similarly, if there is only one write access point then the write ports of the resource VComponent can be connected directly to the resource ports of the write-type resholder. In the example program hierarchy of FIG. 21, there is only one read access point and one write access point. Thus no arbitrators or zero-drivers are necessary in this example. FIG. 25 illustrates the ports, components, and connections that are generated by the VDiagram constructor for VDiagram 1.

Step 454 for a top-level VDiagram determines the type of each resource and adds an appropriate library component reference to the VDiagram. If the component requires any special signals, such as an address decode signal, they are also added. For a global variable register, the address decode for the globreg is constructed using a VADecNode-type VAssignment. Addresses may be assigned to globregs based on the order in which they are built. For example, a variable that stores the next valid address may be incremented each time a globereg is built.

Figure 26:
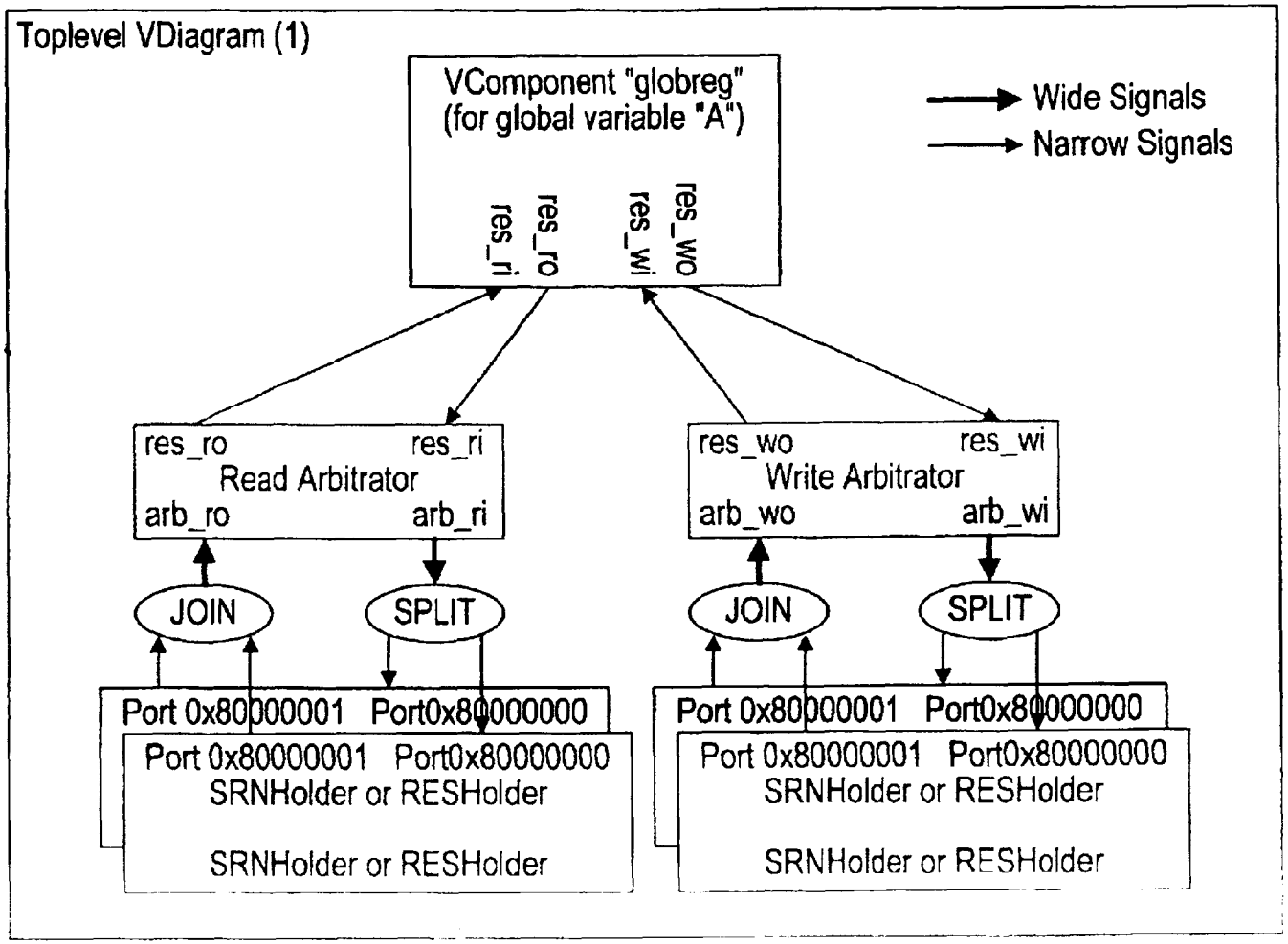
FIG. 26 is a block diagram illustrating the ports, signals, and components that are created to manage a global variable resource with two read and two write access points.

If there is more than one read or write access point for an individual resource, the top-level VDiagram constructor adds arbitrators to the top-level VDiagram to manage the multiple accesses. FIG. 26 illustrates the ports, signals, and components that are created to manage a global variable resource with two read and two write access points. Arbitrators have wide inputs and outputs on the resholder side and narrow inputs and outputs on the resource side. The wide inputs accommodate the array of data generated by concatenating the resource signals from multiple access points together.

The JOIN operators shown in the diagram are built using VALogicNodes with the operation parameter set to a value specifying that the signals should be concatenated. This produces an assignment statement signifying that the destination signal is driven by the concatenation of all of the input signals. The SPLIT operator is built using a VASliceNode. This produces an assignment statement signifying that the destination signal is driven by a specific bit range of the source signal.

Additional Information

The above explanation describes the basic system and method of the present invention. This section provides additional information regarding step 452 of FIG. 12, in which message handler functions are called for each object in the portion of a program represented by a VDiagram. Different message handlers are called for different types of objects. As described above, these message handler functions add information and data structures to the VDiagram in order to represent the respective objects in hardware. The following information applies to message handler functions for particular types of objects.

DiagOSaveHWInfoMethod

This is the message handler function for the root object of the entire block diagram (graphical program). This is the first OSaveHWInfoMethod call generated in step 452 of FIG. 12. This function does not add anything to the VDiagram. Instead, it generates more OSaveHWInfo calls for all of the nodes on the block diagram, and then all of the signals on the block diagram. This order is important. Signals cannot be properly processed until all of the components they connect to have been added to the VDiagram.

Note that specific graphical program components and constructs are discussed are discussed below, such as sequence structures, case structures, loops, loop tunnels, shift registers, etc. For more information on these concepts, please see the above-referenced patents or the LabVIEW documentation available from National Instruments.

SignalOSaveHWInfoMethod

This function creates a VSignal object to represent a signal appearing in a graphical program and inserts it into the VDiagram's signallist. Then, it builds a terminal list of VSigterm objects that point to VComponents. This terminal list is built using the information stored in the root object representing the signal in the graphical program. Information is also included in the VDiagram to build the enable chain as described above.

SignalOSaveHWInfoMethod determines the type of connection for all of the signal's terminals. There are three major types of connections:

1. SRN Connection

The signal attaches to an SRN object. This can be any of the following:

a) Front Panel Control or Indicator

These connections appear as ports on the VDiagram's top-portmap. A VALogicNode assignment statement is generated to drive the signal with the signal attached to the port. No enable chain logic is generated because all front panel controls are valid when the subprogram is executed, and all components are automatically dependent on the subprogram's enable_in signal. Likewise, the subprogram is automatically dependent on all of its components' enable_out signals. Thus, signals that drive Front Panel Indicators do not generate any extra enable chain logic.

b) Tunnel, Right Shift Register, or Sequence Local

These connections appear as ports in exactly the same way that front panel controls and indicators do. No enable chain logic is generated for the same reasons as above. These connections are separate from the front panel controls and indicators because the front panel objects may be stored in the graphical program differently than tunnels, shift registers, and sequence locals.

c) Left Shift Register

A left shift register is a VComponent in the VDiagram's complist. A VSigterm is added to the signal to indicate that the signal is connected to the data port of the left shift register VComponent. The enable_out of the left shift register VComponent is used to drive the enable chain for this signal.

2. While, For, or Case connection

The signal attaches to a programmatic structure component from the outside. Normally, this means a connection to a port on the loop srnholder. A VSigterm is added to the signal to indicate that the signal is connected to a specific port of the loop srnholder. If the signal drives a loop input, then the signal is considered to be an enable dependency for the loop. SignalOSaveHWInfoMethod calls AddEnvDependency on the loop's srnholder to add the current signal's enable signal to the srnholder's dependency list. If the signal is driven by a loop output, then the structure controller's enable_out is used as the enable for the signal. There are two special cases where additional logic needs to be created here:

a) If the signal drives the Maximum Iteration node of a For loop, the signal is routed to the For loop's srnholder and also to the structure controller for the For loop. Two VSigterms are added to the signal. This ensures that the maximum iteration value is accessible not only to the structure controller, but to the components inside the for loop as well.

b) If the signal drives the Case Select input of a Case structure, the signal is routed to each of the case's srnholders and also to the structure controller.

Multiple VSigterrms are added to the signal. This ensures that the select input is accessible to both the case structure controller and also the contents of every frame in the case structure.

3. A Normal Component Connection

In this case, the signal attaches to a normal component such as an adder or a multiplier. These components are VComponents in the VDiagram. A VSigterm is added to connect the signal to a specific port of the VComponent. If the signal drives one of the component's inputs, AddEnvDependency is called for that VComponent. If the signal is driven by one of the component's outputs, the VComponent's enable_out is used as the enable for the signal.

SRNOSaveHWInfoMethod

Self reference node (SRN) is the term used to signify the internal object maintained by the graphical program system which groups together the objects contained in a program, subprogram, or subframe. These include objects such as constants, shift registers, tunnels, sequence locals, wires, subprograms, programmatic structures, etc. This function does not add any objects to the VDiagram tree. Instead, it generates more OSaveHWInfo calls for the objects it contains.

FPTermOSaveHWInfoMethod

This function does not add any objects to the VDiagram tree. Instead, it generates a single OSaveHWInfo call to the front panel control or indicator object it points to.

FPDCOOSaveHWInfoMethod

This function is the target of the OSaveHWInfo call in FPTermOSaveHWInfoMethod. Front panel controls and indicators are represented as ports on the VDiagram's topportmap. This function adds a port for a front panel object to the VDiagram's topportmap only if it is wired to the connector object of the program. Unwired front panel objects are left floating. After the port is created, a VSignal of the appropriate width is attached to the port. Signals that attach to the front panel control or indicator then get attached to this new signal by SignalOSaveHWInfoMethod.

TermOSaveHWInfoMethod

This function is the target of the OSaveHWInfo calls made by SRNOSaveHWInfoMethod. This function does not add any objects to the VDiagram tree. Instead, it generates a single OSaveHWInfo call to the constant, shift register, tunnel, or sequence local that the terminal is associated with. This function translates OSaveHWInfo calls from terminals on an SRN's object list to the actual objects the terminals are attached to.

BDConstDCOOSaveHWInfoMethod

A constant is represented in the VDiagram tree as a VSignal of type V_CONST. A new VSignal is created with the appropriate initialization value and added to the VDiagram's signallist.

RSROSaveHWInfoMethod

This function processes a right shift register and all of its attached left shift registers. One left shift register VComponent is added to the VDiagram for each left shift register in the shift register chain. Signals are created to propagate the data along the shift register chain. VSigterms for these signals are created to link all of the left shift register VComponents together. If any of the left shift registers are initialized, ports are added to the VDiagram's toplevel portmap to send that data into the VDiagram. Then VSignals and VSigterms are created to attach the ports to the initialization inputs of each left shift register VComponent. If a signal is attached to the right shift register from outside the loop, a VDiagram port is created to pass the shift register data to the parent VDiagram. Otherwise, the right shift register is treated simply as an internal signal that drives the shift_in data port of the first left shift register in the shift chain.

LSROSaveHWInfoMethod

Because RSROSaveHWInfoMethod builds all of the VComponents for the left shift registers, this function does not need to do anything.

SLocOSaveHWInfoMethod

This function processes a sequence local. Sequence locals are treated as ports on the VDiagram's portmap. The same sequence object will get a SLocOSaveHWInfoMethod call for each frame in the sequence structure. It is important to not generate ports for the sequence local until the frame where the local is driven. SLocOSaveHWInfoMethod checks for this and will not add ports if the sequence local is not driven in the current VDiagram. In all sequence frames after the local is driven, a port will be created regardless of whether the local is read or not. Only ports are created in the function. SequenceOSaveHWInfoMethod will generate the VSignals that propagate the local between frames.

SeqTunOSaveHWInfoMethod

SelTunOSaveHWInfoMethod

LpTunOSaveHWInfoMethod

These three methods generate loop tunnels in similar ways. Loop tunnels are represented in hardware as ports on the VDiagram they belong to. Each of these functions generates a new VPort for the VDiagram's topportmap and attaches a new VSignal to that port. Any future signal that connects to the tunnel will either drive or be driven by this new VSignal by a VAssignment object. External multiplexers for Case output tunnels are not generated in this function. They are built in SelectOSaveHWInfoMethod. Sequence tunnels that are outputs only become ports on the VDiagram frame in which they are driven. Sequence input tunnels are turned into ports on all VDiagram frames.

CaseSelOSaveHWInfoMethod

This method processes the case select input node of a case structure. This node becomes an input port on each VDiagram belonging to the case. This allows the components inside the case frames to use the select input as a data source.

LMaxOSaveHWInfoMethod

This method processes the maximum iteration node of a For loop. This node becomes an input port on the VDiagram belonging to the For loop. This allows the components inside the loop to connect to the maximum iteration node. On the outside of the loop, the signal that drives this node attaches both to the new VDiagram port and also to the maximum iteration port on the For loop structure controller.

LCntOSaveHWInfoMethod

This method processes the iteration counter node for while loops and for loops. This node becomes an input port on the VDiagram corresponding to the loop subframe. On the outside of the loop, this port is driven by the loop structure controller's iteration count output.

LTstOSaveHWInfoMethod

This method processes the continue node for a While loop. This node becomes an output port on the VDiagram corresponding to the loop subframe. On the outside of the loop, this port drives the While loop structure controller's continue input.

PrimOSaveHWInfoMethod

This method processes functions, such as adders, comparators, data manipulation operators, type converts, etc. This function adds a new VComponent to the VDiagram's complist. Clock, reset, and enable chain ports are added to the new VComponent. Then, generic parameters and data ports are added to the new VComponent. The exact ports and generics that are added depend on the type of the function. Numeric functions have WIDTH and REPRESENTATION generic parameters. Comparison functions typically have WIDTH-based inputs, but only single-bit outputs. Other functions such as Split, Join, Scale, and Select have slightly more complicated generic parameters and data ports.

GRefOSaveHWInfoMethod

This method processes references to global variables. This function adds a new resholder VComponent to the VDiagram's complist. If the reference is a global variable read, a read-type resholder is created. A write-type resholder is created for global variable writes. Clock, reset, and enable chain ports are added to the resholder VComponent. A generic parameter for the data width is also added. Lastly, the function creates a new VResource object to represent this resource access point and adds it to the VDiagram's resourcelist. If a VResource already exists for the global variable, the new resholder is automatically consolidated into the existing VResource.

IUseOSaveHWInfoMethod

This method processes references to subprograms. A srnholder component is created and added to the VDiagram's complist. The srnholder is given clock, reset, and enable chain connections. Then, a new VDiagram object is constructed for the referenced subprogram. This new VDiagram is added to the current VDiagram's subvilist. Once the child VDiagram is built, its topportmap is copied into the srnholder's port map. This ensures that the subVDiagram and the srnholder have the same port map. IUseOSaveHWInfoMethod treats all subprograms as re-entrant and makes unique VDiagrams for each instance of a subprogram.

WhileLoopOSaveHWInfoMethod

This method processes While loops. A srnholder component is created for the While loop and added to the VDiagram's complist. Then, a new VDiagram object is constructed. The loop subframe is used as the root node for building the child VDiagram. The child VDiagram is added to the parent VDiagram's srnvilist. After the child VDiagram is built, its topportmap is copied into the srnholder's port map. This ensures that the subVDiagram and the srnholder have the same port map. The smholder VComponent is given clock and reset signals. A While loop structure controller is created and added to the VDiagram's complist. The structure controller is given clock, reset, and enable chain signals. It is also given subdiagram enable signals (subdiag_en, subdiag_done, subdiag_clr), and these signals are given VSigterms to attach them to the loop srnholder. The structure controller points to the srnholder. The srnholder points to the subVDiagram.

ForLoopOSaveHWInfoMethod

This method processes For loops. It functions similarly to the WhileLoopOSaveHWInfo method. The For loop structure controller has a parameterized input width for the maximum iteration input so that the maximum iteration node can be driven by a signal of any integer type.

SequenceOSaveHWInfoMethod

This function builds srnholders and child VDiagrams for each frame in the sequence. These child VDiagrams are added to the parent VDiagram's subsmlist. However, no structure controllers are built. The sequence frame srnholders are given clock, reset, and enable chain signals. As each sequence frame srnholder is built, the enable_out signal from the previous frame is set as an enable dependency for the current frame. This ensures that the sequence frames execute in sequence regardless of whether they share any data or not. After child VDiagrams are built for the sequence frames, SequenceOSaveHWInfoMethod processes sequence locals. Each sequence local appears as a port on one or more of the child VDiagrams. These ports are connected together with a VSignal. For each sequence local in a sequence, a VSignal of the appropriate width is created and added to the VDiagram's signallist. Then, VSigterms are created to attach the new signal to each of the frames the sequence local connects to.

SelectOSaveHWInfoMethod

Similarly to SequenceOSaveHWInfoMethod, this function builds srnholders and child VDiagrams for each frame in the case structure. These child VDiagrams are added to the parent VDiagram's subsrnlist. A structure controller is built. The case structure controller has parameterized ports for the width of its select input and the number of case frames it controls. The case controller is also given clock, reset, enable chain, and subdiag enable chain ports. The subdiagram enable signals are routed to the srnholders in a special way. The subdiag_en signal is a wide signal with one bit for each case frame. Frame 0 uses subdiag_en(0) as its enable_in. Frame 1 uses subdiag_en(1) as its enable_in, etc. Subdiag_clr is wired to the enable_clr input of all the srnholders. The enable_out outputs of all the smholders are OR'd together using a VALogicNode assignment to drive the subdiag_done input of the case controller. SelectOSaveHWInfoMethod builds multiplexors for the case structure's output tunnels. Each output tunnel is driven by a VAMuxNode assignment. This ensures that only the outputs of the currently selected case frame can be used outside of the case structure. The case controller's subdiag_en signal is used as the select signal for all output multiplexors. When subdiag_en(0) is active high, each output tunnel multiplexor will select the outputs of case frame 0. When subdiag_en(1) is active high, each output tunnel multiplexor will select the outputs of case frame 1, etc. Each case output tunnel is driven by every case frame. Thus, SelectOSaveHWInfoMethod assumes that each multiplexor will have the same number of inputs. The hardware description syntax may be generated in such a way that implicitly causes the last frame in the case to become the default.

Figure 27:
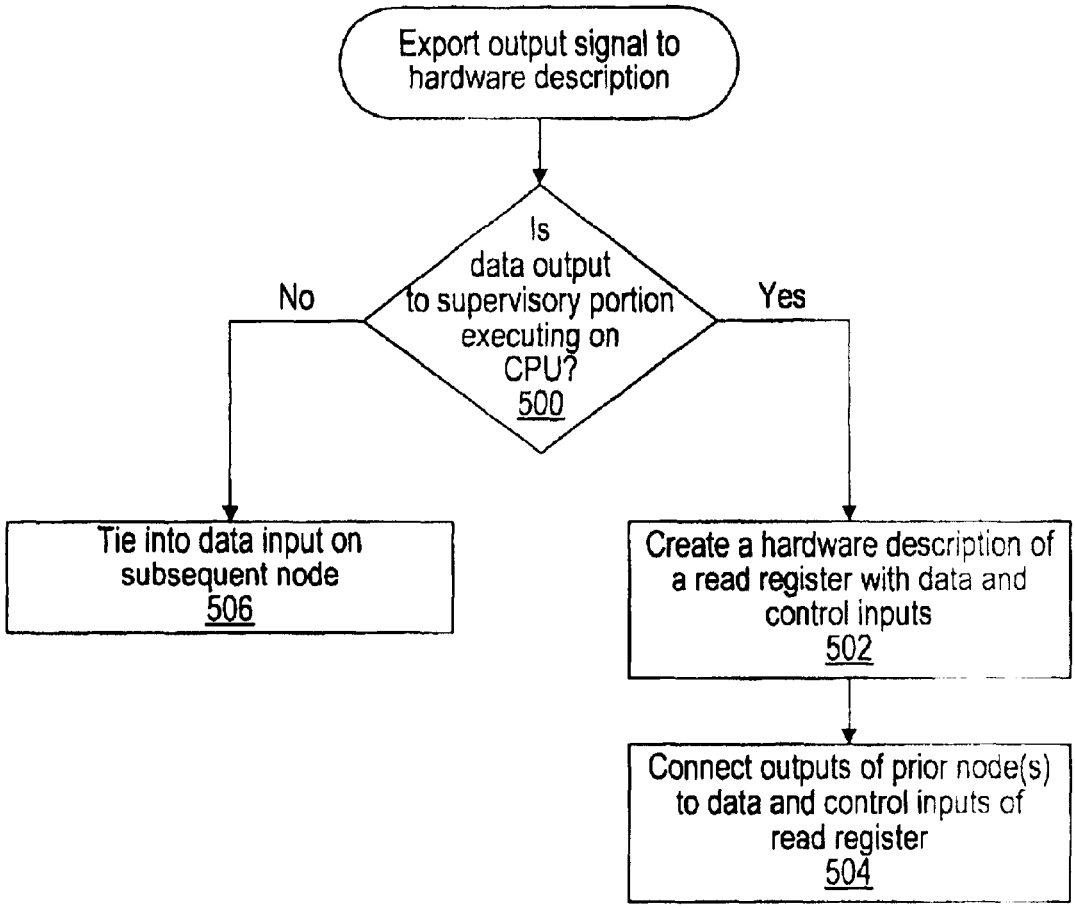
FIG. 27 is a flowchart diagram illustrating operation where the method exports an output terminal into a hardware description.
Figure 28:
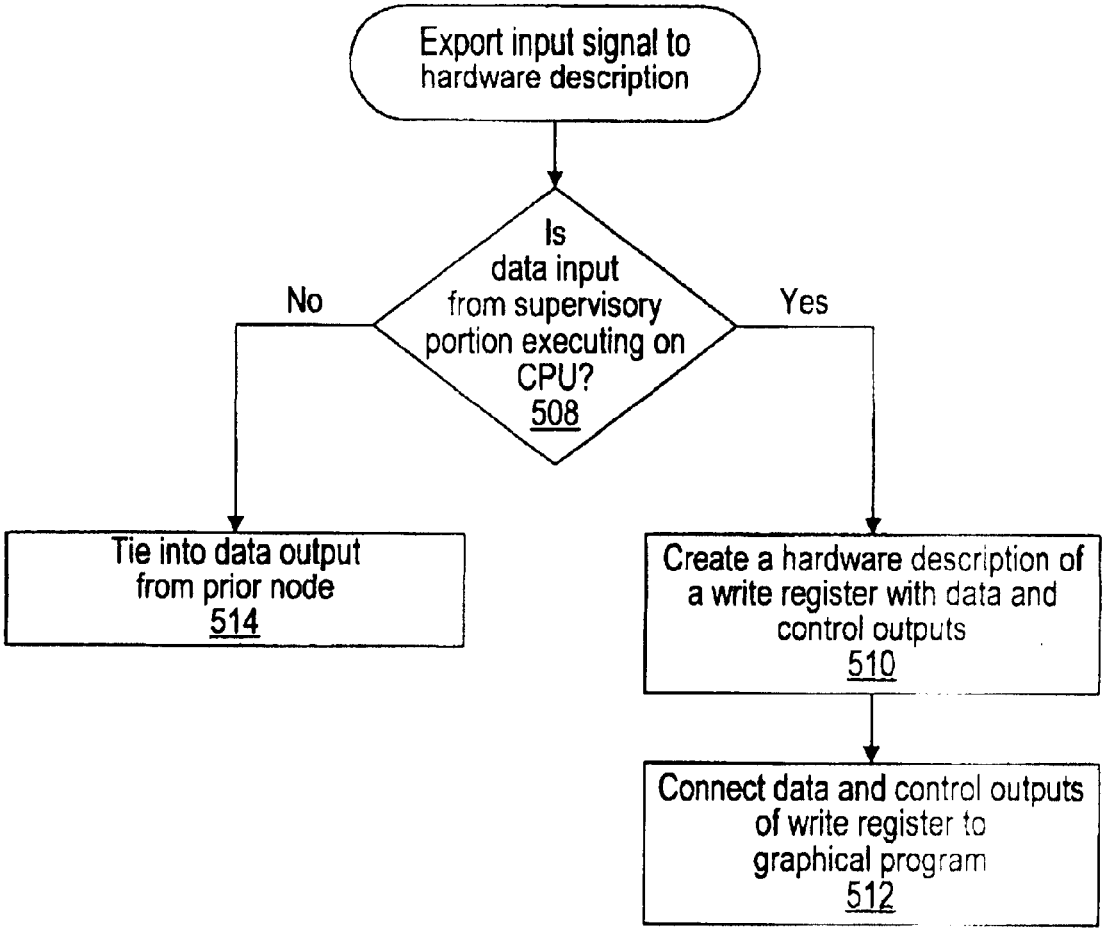
FIG. 28 is a flowchart diagram illustrating operation where the method exports an input terminal into a hardware description.

FIGS. 27 and 28—Coordinating Data Flow with Host Processor

As described above, a portion of a graphical program may be converted to a hardware implementation, while another portion executes on the host CPU. In most cases, data will flow between these two program portions. FIGS. 27 and 28 illustrate how this data flow is coordinated through hardware resources. As noted above, external resources are only resolved in the top-level VDiagram. All access points to external resources in child VDiagrams are funneled up to the top-level VDiagram. Thus FIGS. 27 and 28 are only relevant to the top-level VDiagram.

FIG. 27 illustrates tying in an output signal with the host processor. In step 500 the VDiagram constructor determines whether the output signal connects to an object in the portion of the graphical program executing on the host CPU or to an object internal to the hardware portion of the program. As shown in step 506, if the signal connects to an object within the hardware portion, then a VSigterm or VAssignment is created to represent this connection in the usual way as described above.

If the signal connects to the CPU portion of the program, then in step 502 the VDiagram constructor adds information to the VDiagram to represent a hardware read register that the signal can connect to. This hardware register receives the signal output as its data input, as shown in step 504. It also uses the enable_out of the signal as its enable_in input, thus maintaining the proper execution order.

The CPU portion must also coordinate itself with the hardware portion. The graphical program system recognizes that the input for one of its components originates from the hardware portion, and reads the read register created in step 502 accordingly for the component's input. Thus the system works together to seamlessly enable hardware program execution.

FIG. 28 illustrates the process of FIG. 27 corresponding to an input signal from the CPU portion rather than an output signal to the CPU portion. If the signal is not from the host portion, then it is tied to the output node of an internal component in step 514. If the signal is from the host portion, it is tied to a write register that the host portion writes to.

Figure 29:
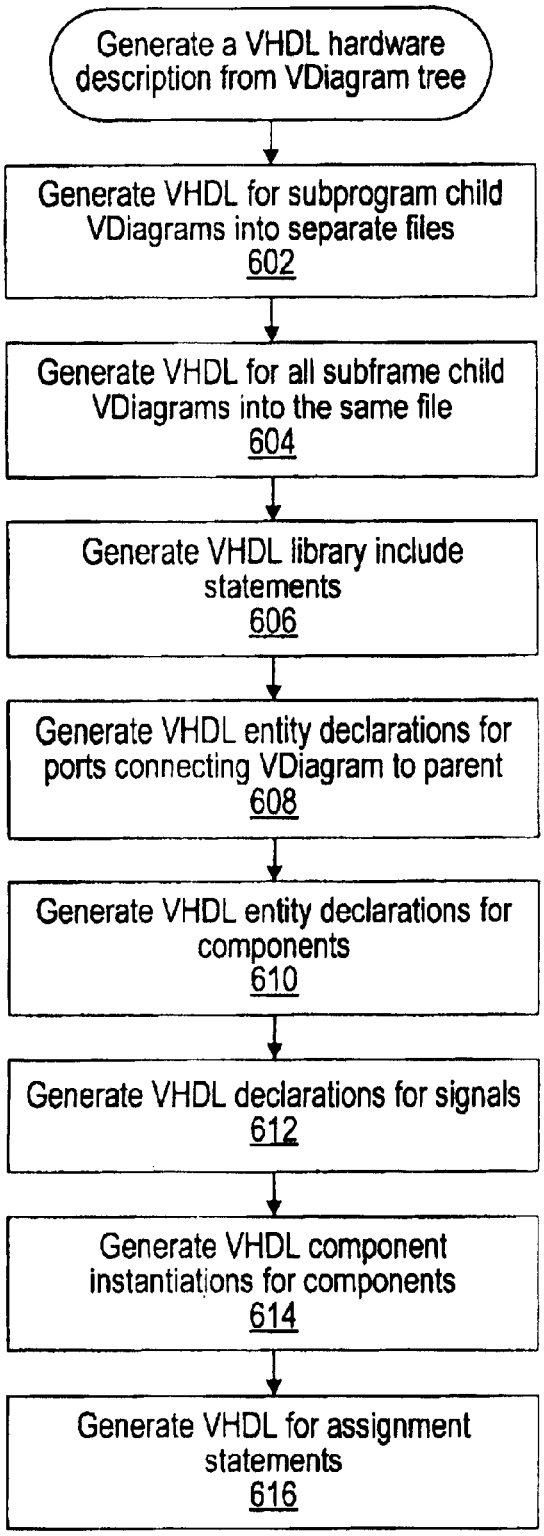
FIG. 29 is a flowchart diagram illustrating how a back end program may generate VHDL syntax from a VDiagram tree.

FIG. 29—Generating VHDL from a VDiagram Tree

As previously noted, various back ends may parse the VDiagram tree and generate a hardware description from it. For example, the system may comprise a VHDL back end to generate a VHDL hardware description, an EDIF back end to generate an EDIF hardware description, an XBI back end to generate a Java hardware description, etc. FIG. 29 is a flowchart diagram illustrating how a back end may generate VHDL syntax for a VDiagram tree. In step 602, the VHDL back end generates VHDL text for all child VDiagrams of the top-level VDiagram that correspond to subprograms. A VDiagram may have two types of child VDiagrams: child VDiagrams representing subprograms and child VDiagrams representing subframes of programmatic structures such as while loops, case structures, etc. These two types of child VDiagrams are maintained in separate lists in the VDiagram (the subvilist and the srnlist, respectively). In step 602 the child VDiagrams that correspond to subprograms are parsed and VHDL text is generated for them. The VHDL for each subprogram VDiagram is preferably placed in a separate file, but may also be generated into a single file.

In step 604, the VHDL back end generates VHDL text for the child VDiagrams representing programmatic structure subframes. The VHDL code for each of these VDiagrams is generated into the same file so that local components such as sequence frames stay together.

Steps 602 and 604 generate the VHDL code for the top-level VDiagram's child VDiagrams. These steps occur before any VHDL code is generated for other components of the top-level VDiagram, such as signals or constants. Thus the back end traverses the VDiagram tree in a depth-first manner. For each child VDiagram, the steps of FIG. 29 are performed. If a VDiagram has no children, then steps 602 and 604 do nothing and execution continues with step 606. The depth-first parse through the VDiagram tree ensures that the entity/architecture block pair for a child VDiagram is written to an output file before the entity/architecture block pair for a parent VDiagram. This order is a requirement of many VHDL compilers.

In step 606 the VHDL back end generates the VHDL library include statements.

In steps 608–616 the VHDL entity/architecture block pair for the VDiagram is generated. In step 608 the VHDL entity declarations for ports connecting the VDiagram to its parent are generated. In step 610 the VHDL entity declarations for components in the VDiagram's complist are generated. A message handler function is called for each type of component to generate these declarations. In step 612 the VHDL declarations for signals in the VDiagram's signallist is generated. In step 614 the VHDL component instantiations for components in the VDiagram's complist are generated. A message handler function is called for each type of component to generate these instantiations. In step 616 the VHDL assignment statements are generated.

Uploading a Hardware Implementation to the Programmable Logic

There are various possibilities or methods for uploading a hardware implementation to the programmable logic device. In one instance, the host CPU merely uploads the configuration to the programmable logic as described above. This could occur by the driver at boot up time or when the user presses the run button on the graphical program that was created. Alternatively, the host CPU provides the hardware implementation to a non-volatile memory comprised on the board, and during boot up of the board this hardware implementation is loaded from the non-volatile memory on the board into the programmable logic.

Thus the reconfigurable board can be designed so that the hardware diagram is written to non-volatile memory instead of directly to the FPGA. This allows a hardware implementation of a diagram to begin execution at power-on (long before the operating system has finished booting). In this case, the program preferably has top-level enable_in and abort signals which can be configured at compile time to either allow immediate execution or to require a supervisory program to enable hardware execution.

Default Configuration for Hardware Simulation

As discussed above, in the preferred embodiment the system of the present invention comprises a computer system which includes or is coupled to a device, such as an add-in card. The device preferably performs a data acquisition/generation function, e.g., is a data acquisition card. The DAQ card includes D/A and A/D converters as well as various other data acquisition logic, and includes a programmable logic device such as an FPGA which is operable to receive a hardware implementation created in response to a graphical program created on the computer system.

In one embodiment of the invention, the programmable logic or FPGA is operable to receive a default configuration, whereby the default configuration operates to configure the data acquisition board with a standard interface for execution of the graphical program in software. Thus, for example, the host CPU may upload a hardware implementation to the FPGA which programs the FPGA with a default configuration of a board to provide a desired interface for the board. This configuration would provide the host computer with direct access to the I/O of the board. This is useful, for example in hardware simulation, to allow the host CPU to execute the graphical program or diagram in software during algorithm development to determine feasibility and perform debugging etc. The graphical program behaves the same as it normally would in hardware, except the program runs slower due to software execution. However, software debugging tools available in the graphical programming system are available in order to more easily debug the program. This implementation also provides a faster compile time thus allowing a quicker turnaround for user bug fixes. Thus, it is anticipated that the user will upload a default configuration to the programmable logic and execute the graphical program being created in software one or more times to facilitate debugging. Once the graphical program has been constructed to a satisfactory performance, then the user may upload the actual hardware implementation of the graphical program to the programmable logic as described above.

As discussed above, there are various possibilities or methods for uploading a default configuration to the programmable logic. In one instance, the host CPU merely uploads the configuration to the programmable logic as described above. This could occur by the driver at boot up time or when the user presses the run button on the graphical program that was created. Alternatively, the host CPU provides the default configuration to a non-volatile memory comprised on the board, and during boot up of the board this default configuration is loaded from the non-volatile memory on the board into the programmable logic.

Estimation of the Size and Cost of a Hardware Implementation

Figure 37:
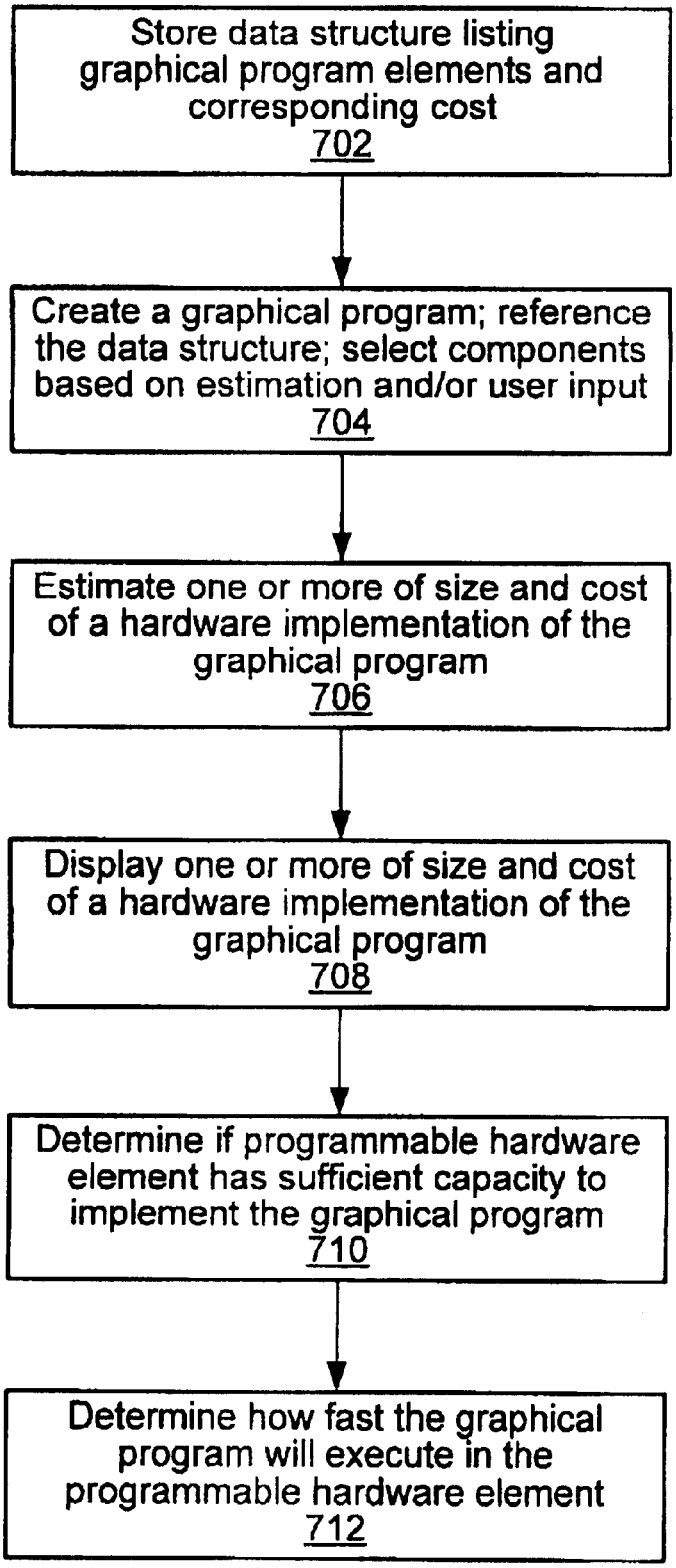
FIG. 37 illustrates storing data structure listing graphical programing elements and corresponding cost.

In one embodiment of the invention, the graphical programming system includes a data structure which includes a listing of each of the elements or components comprised in the component library, as well as the corresponding cost of each component in terms of gates and time of execution (FIG. 37, step 702). Thus, in this embodiment when a graphical program is created, the graphical programming system operates to reference the data structure to obtain the associated gate and time costs associated with each component being used from the component library in the graphical program being constructed (FIG. 37, step 704). For example, the graphical programming system totals the amount of gates utilized with regard to each component being used in the graphical program being constructed (FIG. 37, steps 706 and 708), and then determines if the programmable logic or FPGA being used has sufficient capacity to implement that graphical program (FIG. 37, step 710). Also, the graphical programming system can use this data structure to determine at or prior to compile time how fast the graphical program will execute in hardware, i.e., how fast the hardware implementation will execute in the FPGA (FIG. 37, step 712).

Figure 38:
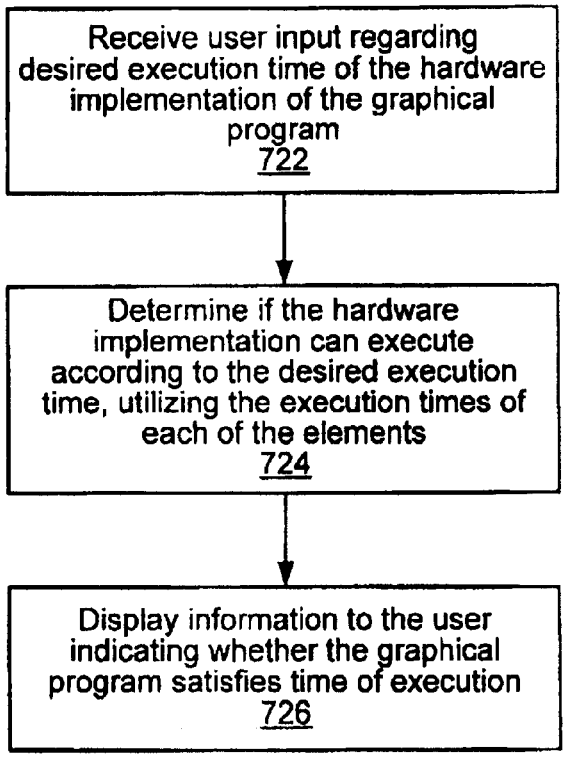
FIG. 38 illustrates receiving user input regarding execution time of the hardware implementation of the graphical program.

Alternatively, the graphical programming system receives user input regarding desired execution time (FIG. 38, step 722) and utilizes the execution times of each of the elements to provide feedback to the user as to whether the graphical program satisfies the users requirements regarding time of execution (FIG. 38, steps 724 and 726).

In addition, in one embodiment the component library includes multiple versions of respective components. For example, the component library includes a fast multiplier that is large and a small multiplier that is slow. The graphical programming system can be configured to select the appropriate version of component based on how much of the FPGA is consumed by the rest of the diagram and based on the loop times indicated in the diagram, or other input from the user and/or information in the diagram (FIG. 37, step 704). Thus, in one embodiment, the user inputs both the number of gates comprised in the programmable logic being used as well as the desired time of execution, and the graphical programming system automatically selects among various versions of components in the component library, e.g., a slower and less complex adder vs. a faster but more complex adder, in order to develop a hardware implementation which is suitable for the user's application.

In another embodiment, the user can select between parameter execution time vs. deployment size. In other words, the user may have the option to configure compilation time vs. optimization of the parameters above. Given the interactive and target customer of this system, compilation time may be an important parameter, wherein the user may choose to optimize compilation time over the parameters above.

Manipulation of Non-reuseable Hardware Resources

When a user creates a graphical program which manipulates one or more hardware resources of a device, such as one or more hardware resources comprised on an add-in board, e.g., a data acquisition board, in general the hardware device or board will have a limited number of hardware resources or components that are useable by the graphical program. For example, a given data acquisition board may only have one analog input channel. At least a subset of these hardware resources may only be used once, i.e., are not re-useable, referred to as non-reusable components. Examples of hardware resources include A/D converters, D/A converters, timers, counters, clocks, input channels, output channels, filters, and other logic blocks.

Figure 39:
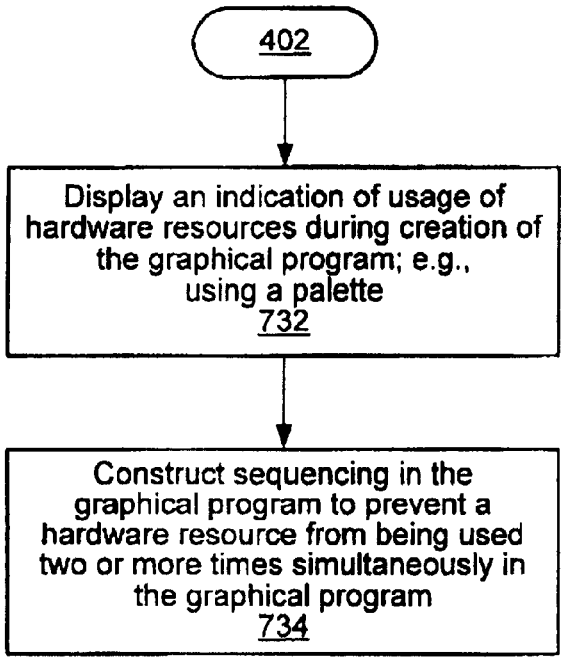
FIG. 39 illustrates displaying an indication of usage of hardware resources during creation of the graphical program.

In one embodiment of the invention, the non-reusable components comprised on the hardware being controlled appear on a palette during configuration or construction of the graphical program. More specifically, icons representing these non-reusable components or hardware resources appear on a palette during configuration or construction of the graphical program. The icons representing these non-reusable components disappear as they are used by the diagram to indicate to the user that these components have been used and thus cannot be reused (FIG. 39, step 732). In one embodiment, the user simply drags these non-reusable component icons from the palette into the graphical program. Once these components are dragged from the palette into the graphical program, the component icon disappears from the palette, and thus the user knows that the component has been used in the graphical program and is thus not available for reuse.

Where two or more hardware resources or components are comprised on the board which can be used, a corresponding two or more components appear in the palette. In this instance, as each component is used in the graphical program, the corresponding picture in the palette disappears to alert the user as to the number of remaining hardware components which can be used (FIG. 39, step 732). This provides a convenient mechanism for providing information to the user regarding the hardware components used and prevents reuse of a non-reusable component.

In some graphical programs, it is often convenient for a single graphical program to access a single hardware element from several locations in the graphical program or diagram. This would technically violate the single instance or non re-useability concept discussed above, whereby a non-reusable component can be used only once in a graphical program. However, where the user desires to access a single non-reusable hardware element in several places in a single graphical program, the user preferably constructs sequencing or implements sequencing in the graphical program which prevents this hardware element from being used simultaneously within the same graphical program (FIG. 39, step 734). For example, in the LabVIEW program the user constructs sequencing using a sequence structure. In one embodiment, references to hardware elements in the graphical program provide a "handle" to the hardware which is provided to the graphical program which can be used in multiple locations within the graphical program. This reference or "handle" to the hardware can then be used to provide simultaneous accesses to a single device in the graphical program.

In general, there are three different ways a graphical program or diagram can be constructed to access unique hardware resources. In a first instance (a) a single reference to the hardware appears in the diagram as discussed above. In a second instance (b) multiple references to the hardware appear in the graphical program, but no two of these references occur simultaneously. For example, the user can figure these multiple references in different frames of a sequence structure. In a third instance (c) the graphical program includes multiple references to the hardware, and the way in which the graphical program is constructed indicates that these multiple references may be executed simultaneously.

In the preferred embodiment, the graphical programming system preferably detects which of the above cases exist and performs any necessary type of configuration to accommodate these situations. In the first instance of case (a), a single reference to the hardware appears in the graphical program, and thus the graphical programming system is not required to perform any special processing in generating the hardware implementation. In the second case (b) mentioned above, the graphical program, when converting the sequence structure to a hardware implementation, utilizes multiplexers to multiplex the control and data inputs to the hardware in question with the same signals to guarantee that simultaneous accesses are impossible, as indicated by the sequence structure. In case (c) above, the graphical programming system preferably automatically detects an instance where multiple references in the hardware appear, wherein they may be executed simultaneously, and configures the hardware implementation to prevent these multiple accesses, and thus thereby preventing possible erroneous operation. In this instance, the graphical programming system, during the conversion process to the hardware implementation, detects the multiple references to the hardware which can be executed simultaneously, and instantiates one or more multiplexers and a full arbitration circuit to control the multiplexers. The multiplexers are provided in the hardware implementation to prevent or avoid the possibility of simultaneous execution of these multiple references to the non-reusable hardware.

In cases (b) and (c), the hardware implementations use similar multiplexers. The difference between cases (b) and (c) is that in case (c) the hardware implementation includes a control circuit. In case (b) the control signals are the same control signals that control which frame of the sequence is executing, and in (c) the control signals come from an arbitration circuit. Also, in item (b), the multiplexers that configure and implement the sequence structure are set or defined at compile time. Alternatively, in case (c) the arbitration unit is not necessarily defined as far as ordering at compile time, but the order of execution is actually defined at run time.

Probe Insertion

In one embodiment, during creation of the graphical program, a user may insert one or more probes into the graphical program which operate to display data on the respective wire where the probe is located during execution of the graphical program. When the user inserts a probe in one or more locations in the graphical program, the programmable logic or hardware element is configured with an element, referred to generally as a probe element, to display the appropriate value during execution of the programmable logic, much the same way a probe placed in a graphical program is used to display a value during execution of the graphical program. Thus the probe element may provide a real-time view and observability into the programmable logic or FPGA. Examples of the probe element include a time stamp generation circuit a register, or other type of memory or circuit for implementing a probe function.

In one embodiment, when the user inserts a probe in one or more locations in the graphical program, the corresponding hardware implementation directs the use of a time stamp generation circuit. In other words, when the user inserts a graphical icon of a probe in one or more locations in the graphical program, the programmable logic is configured to include a time stamp generation circuit. The time stamp generation circuit may be used to produce a value for a memory in the programmable logic associated with the location in the graphical program where the probe was inserted. The time stamp generation circuit preferably produces a value for the memory when the value changes. More particularly, the time stamp generation circuit preferably produces a value/time pair value of a memory location at the time of transition when the value changes.

The time stamp generation circuit may be included inside the programmable logic or FPGA, or the time stamp generation circuit is configured in a separate chip or logic block included on the board which is coupled to the FPGA. This time stamp generation circuit allows the graphical programming system to insert probes into the hardware implementation of the graphical program or diagram. The time stamp generation circuit thus comprises a hardware implementation of the probe which was inserted in the software graphical program. This enables the hardware debugging environment to look and feel the same as it does in the graphical programming system. The time stamp generation circuit preferably provides its output on a pin of the programmable logic, e.g., the FPGA.

In an alternate embodiment, when the user inserts a probe in one or more locations in the graphical program, the corresponding hardware implementation directs the use of a register. In other words, when the user inserts a probe in one or more locations in the graphical program, the programmable logic is configured to include a register. The register may be used to store a value in the programmable logic associated with the location in the graphical program where the probe was inserted. The register is preferably memory-mapped, and thus may be readable through memory mapped I/O.

The probe value obtained from the programmable logic or FPGA during execution of the programmable logic may optionally be sent to the graphical user interface being executed and/or displayed by the host. Thus the probe value may be displayed on the display in the graphical program, much the way a probe value is displayed in a software-executed graphical program, e.g., LabVIEW.

In one embodiment, the system includes two compile modes referred to as debug and release. The debug mode may support the inclusion of probes, or the automatic insertion of probes by the system without user specification. After the product has been finalized, the probes may optionally be removed for release mode. The system may also include a "debug version" of the system or board with a larger FPGA and/or possibly extra support for the time stamping, etc., such as buffers, external memory, etc.

Data Path Optimization

In one embodiment, the graphical programming system is operable to detect graphical programs or diagrams that are streaming data to/from the host computer, and the graphical programming system inserts special circuits in the hardware implementation to handle DMA for high speed transfers without special consideration from the user. These circuits include FIFOs and circuits to generate DMA requests (DRQ) or the equivalent.

This method enables the graphical programming system to automatically generate a DMA circuit for the graphical program or diagram created by the user. In the usual case, all communication to the graphical program or diagram from the CPU passes through global variables. According to this embodiment, the diagram would include an icon which looks similar to a "write global" in the sense that it is a data sink. When the icon is executed, the icon would assert a DMA request (DRQ) that goes back to the DMA controller and triggers a DMA transfer. The FIFO and DRQ generation circuitry are built inside the FPGA when the DMA icon is used.

Occurrences

The LabVIEW graphical programming system includes an occurrence capability which allows a first function to "go to sleep" while waiting for a second function to produce a result. In this manner, the first function does not consume any CPU time while waiting for the second function. Three icons are provided with associated control software which implement the occurrence function. A Wait on Occurrence function icon is associated with the first function that is waiting on the result from the second function. A Set Occurrence function icon is typically associated with the second function icon and triggers an occurrence when the second function produces the desired result. A Generate Occurrence function icon is used to pass identifier values linking multiple sources and destinations having Set Occurrence and Wait on Occurrence function icons, respectively.

Occurrences share some of the properties of global variables in that their implementation depends greatly on whether they are "written" and "read" within a single environment (all in software, all in hardware, or crossing the software/hardware boundary). An occurrence that is set and detected within hardware involves set and detect occurrence components from the library. An occurrence that is set in hardware and detected by the host CPU can be mapped automatically to an interrupt. The graphical programming system, e.g., LabVIEW, would then generate the interrupt handling code to run on the host computer.

Automatic Generation of the Programmatic Interface

In one embodiment, the hardware implementation generated by the graphical programming system, can be configured to be controlled by other software environments or other protocols, e.g., C, C++, Java, Visual Basic, Visual C++, LabWindows CVI, other types of graphical programming systems, etc. In this embodiment, the graphical programming system can automatically generate a description of the hardware necessary including a register map, interrupt map, DMA abilities, etc. to enable other software environments to control the hardware implementation. For example, in the preferred embodiment using the LabVIEW Graphical Programming System from National Instruments Corporation, the graphical program constructed in LabVIEW is converted into a hardware implementation, wherein the hardware implementation also includes the above hardware information necessary to allow another software development environment to control or execute the hardware implementation.

Compensating for Poor Place and Route Results

As discussed above, the present invention preferably uses a third party tool which converts the netlist created from the graphical program into a hardware implementation or FPGA configuration. In one embodiment, if this third party tool reports that the maximum clock speed is less than expected by the graphical programming system, then the graphical programming system can optionally reduce the clock speed and adjust one or more counter values and timers to compensate for this new clock speed. This is preferably performed in cases where overall performance goals are still met.

This may be necessary in instances, for example, where the user has configured timing within the graphical programming system on the assumption of a certain clock speed, e.g., a timing loop which assumes a 20 MHz clock and a loop constructed based on this 20 MHz clock that loops for two milliseconds. In cases where the clock speed is less than expected, the hardware implementation may actually work differently than expected by the user due to this different clock speed. In this instance, the graphical programming system can automatically reduce the clock speed and adjust the counter values and respective timers to compensate for this new clock speed and thus provide the user with the performance that the user expected when he/she created the graphical program. This embodiment utilizes a configurable oscillator on the data acquisition board.

Figure 30:
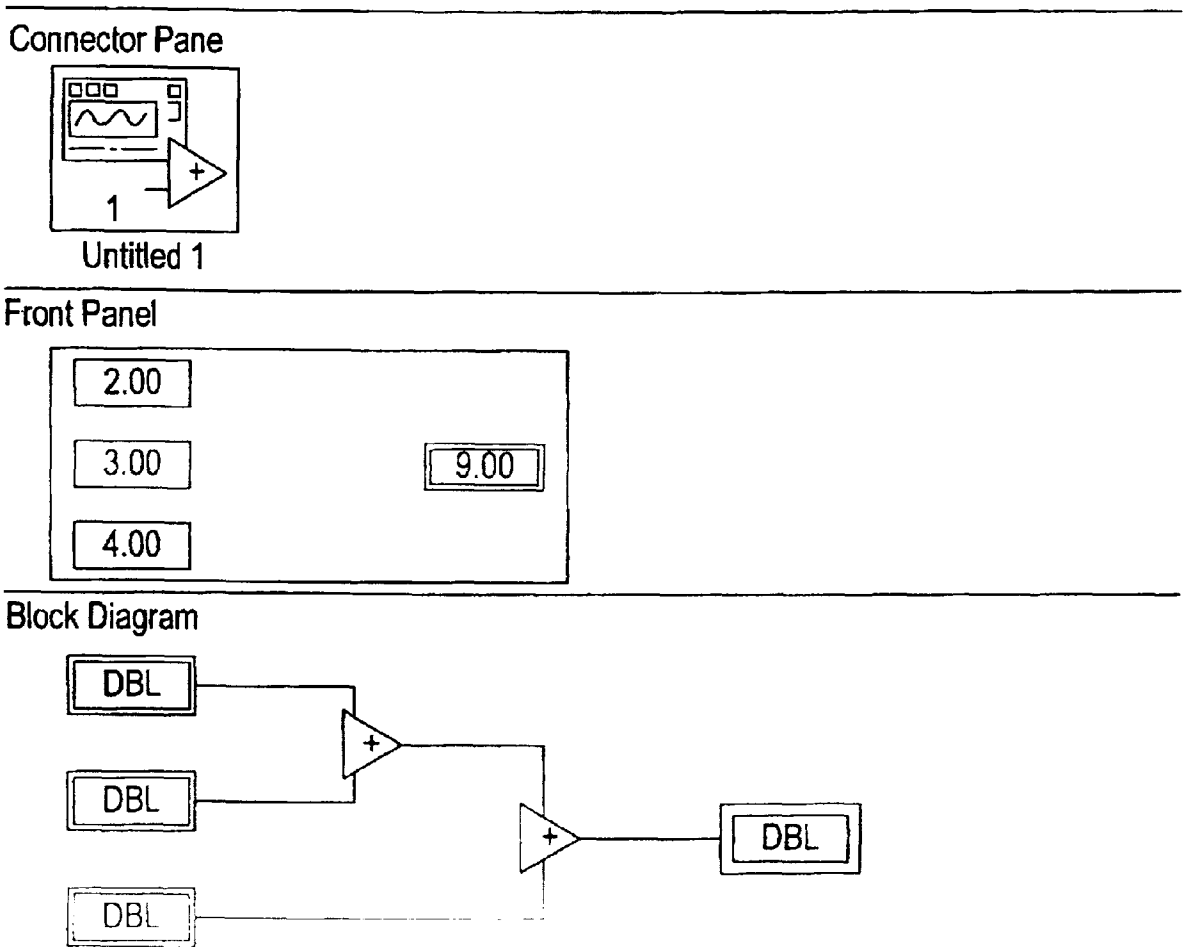

FIG. 30—Simple Graphical Program Example

FIG. 30 illustrates a simple example of a graphical program. In FIG. 30 the graphical program includes three input terminals and one output terminal. The graphical program simply comprises a first 2-input Add function node which receives input from two inputs terminals, and a second 2-input Add function node which receives the output from the first Add function node and receives an output from the third input terminal. The second 2-input Add function node provides an output to output terminal as shown.

Figure 31:
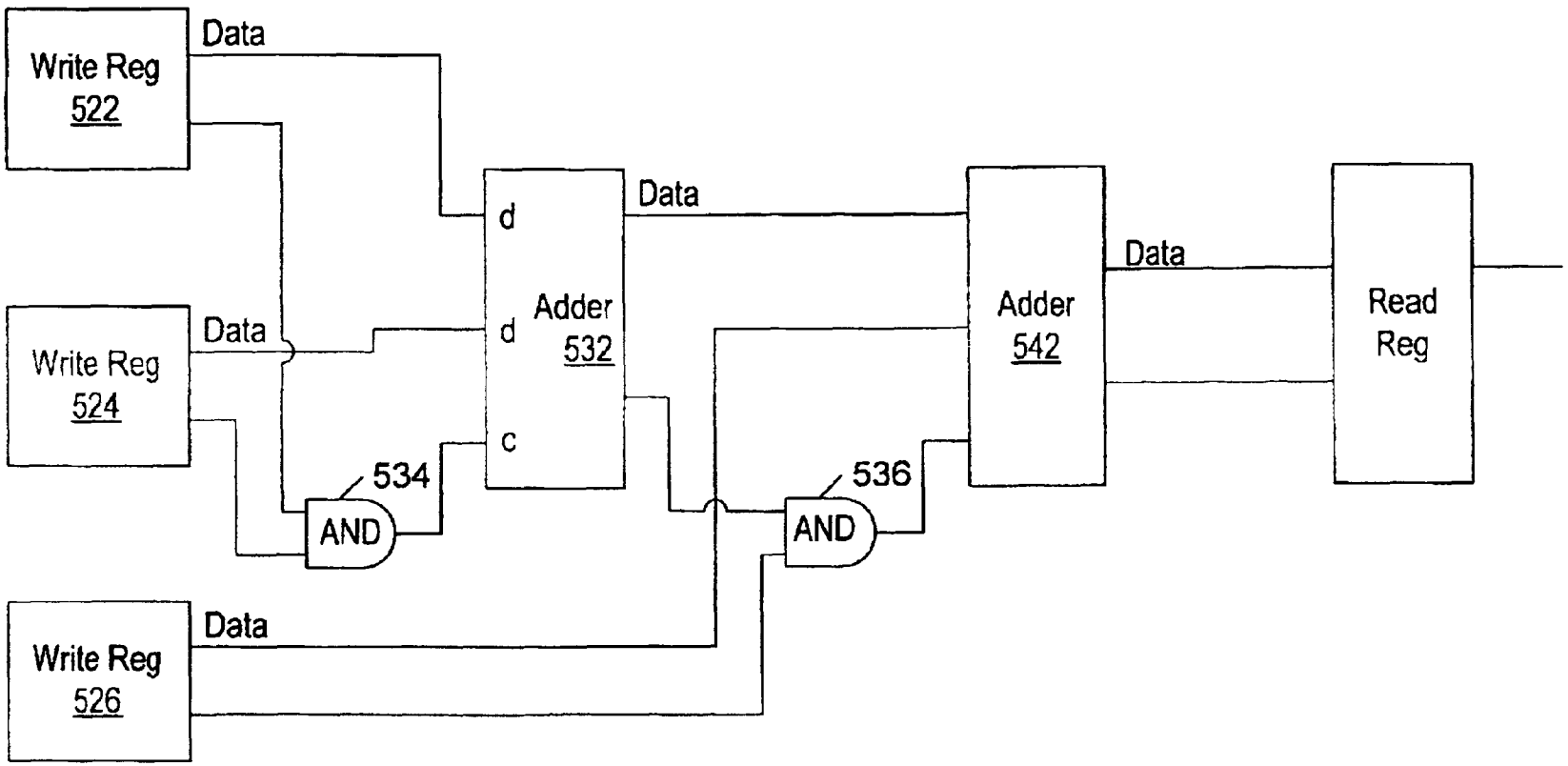

FIG. 31—Hardware Result

FIG. 31 is a conceptual diagram of the resulting hardware after the graphical program example of FIG. 30 is converted into a hardware description. As shown, the hardware diagram includes three write registers 522–526 corresponding to each of the three input terminals. The data outputs of the first two write registers 522 and 524 are provided as inputs to a first two-input adder 532, which corresponds to the first adder in the block diagram of FIG. 14. The hardware description also involves creating an AND gate 534 which receives control outputs from each of the first two write registers 522 and 524 and provides a single output to the control input of the adder 532. The purpose of the AND gate 534 is to prevent the adder 532 from executing until both inputs have been received.

The Adder 532 provides a data output to a second two-input Adder 542, which corresponds to the second adder in the block diagram of FIG. 14. The first Adder 532 also generates an enable out signal which is provided to an input of a second AND gate 536. The other input of the AND gate 536 receives an output from the third write register 526, corresponding to the third input terminal. The AND gate 536 provides an output to a control input of the second adder 542. Thus, the AND gate 536 operates to ensure that the second adder 542 does not execute until all inputs have been received by the adder 542. The second adder 542 provides a data output to a read register 546 associated with the output terminal. The second adder 542 also provides an enable out signal to the read register 546, which notifies the read register 546 when valid data has been provided.

Thus, as shown, to create a hardware description for each of the input terminals, the flowchart diagram of FIG. 12 is executed, which operates to create a hardware description of a write register 522, 524, and 526, each with data and control outputs. For each adder function node, a hardware description of an adder 532 or 542 is created, and an associated N input AND gate 534 or 536 is created, with inputs connected to the dependent inputs of the adder function node to ensure execution at the proper time. The flowchart diagram of FIG. 27 is executed for the output terminal of the graphical program, which operates to generate a hardware description of a read register with data and control inputs.

Figure 32:
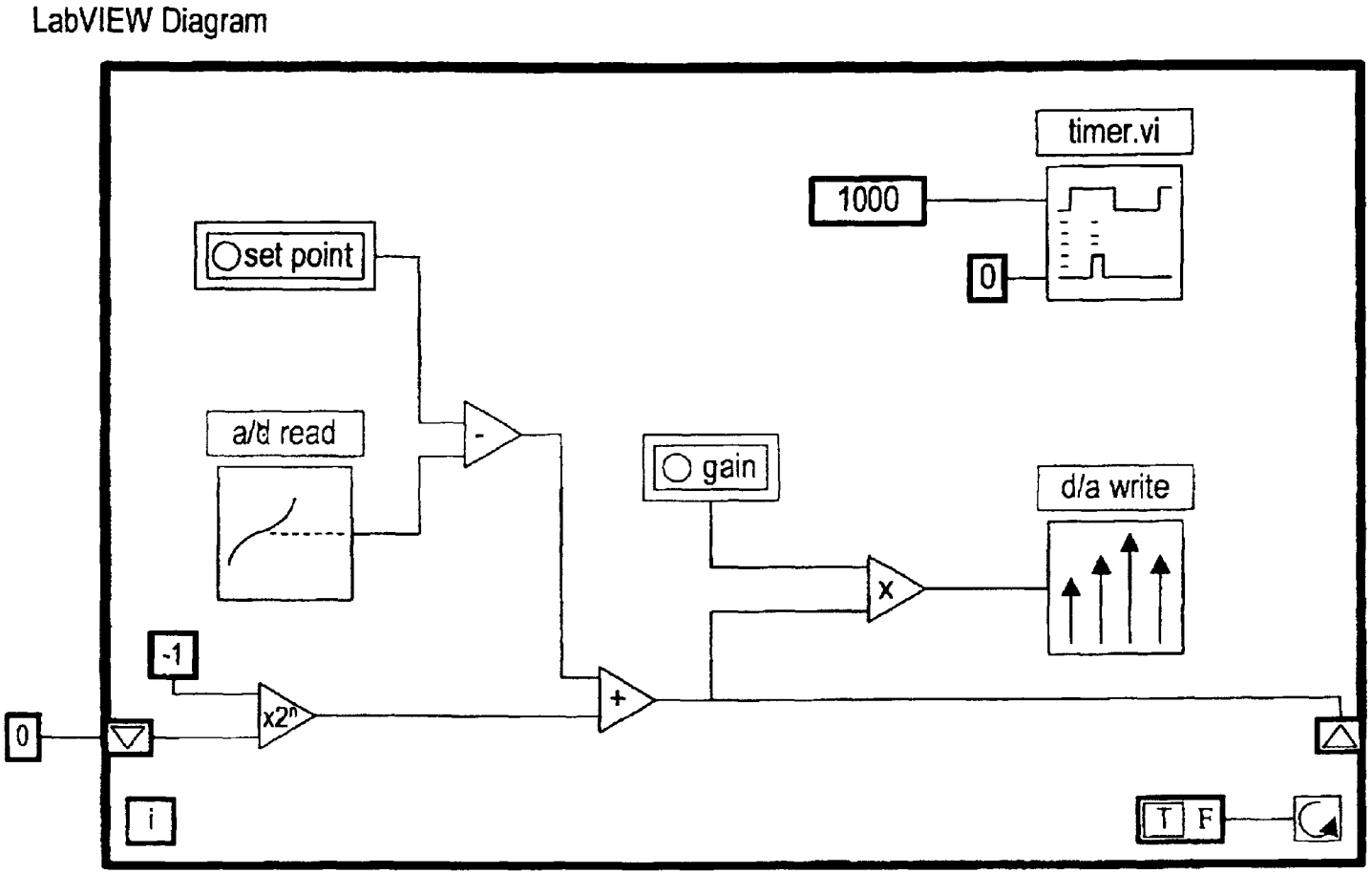
Figure 33:
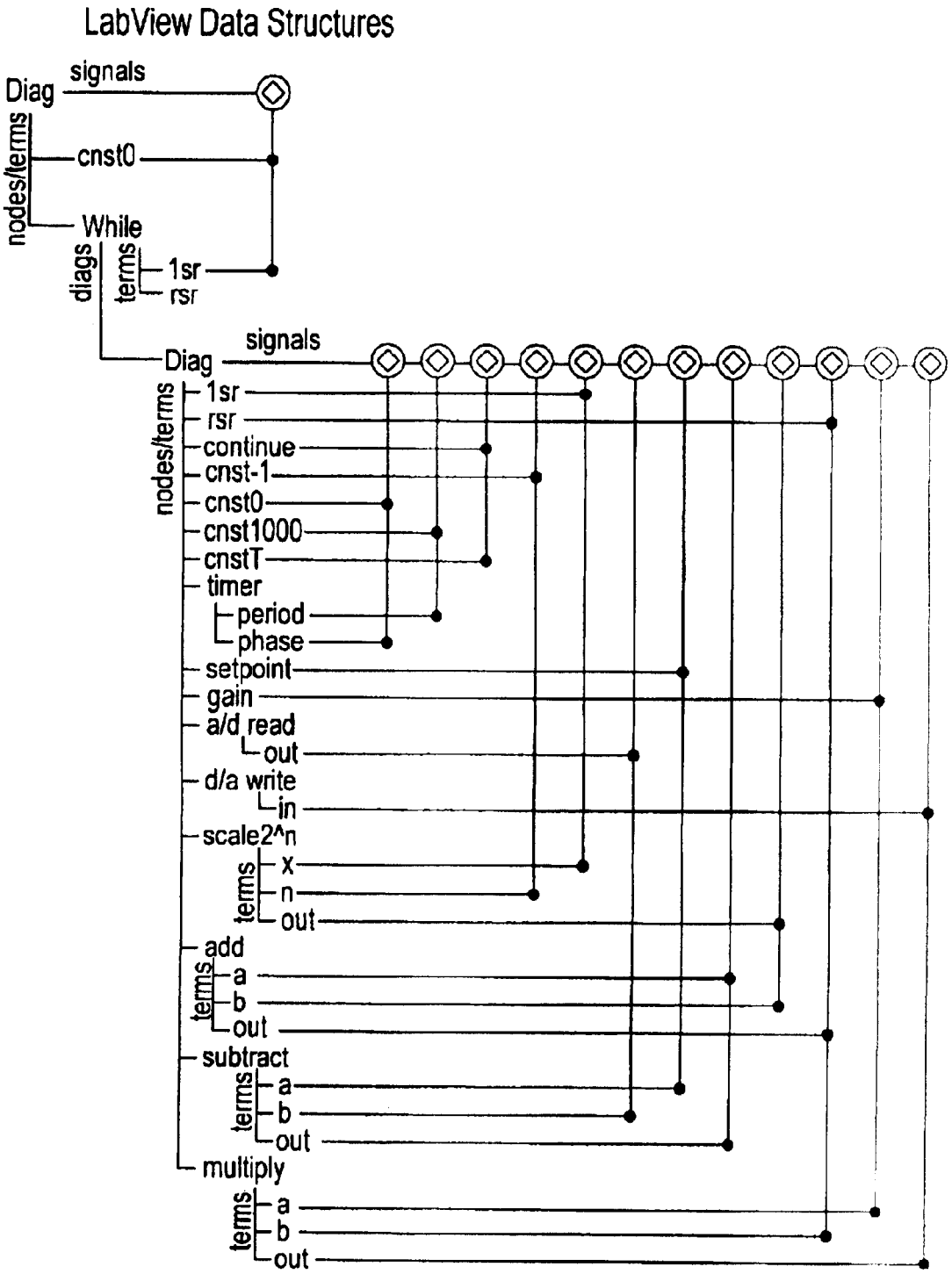
Figure 34:
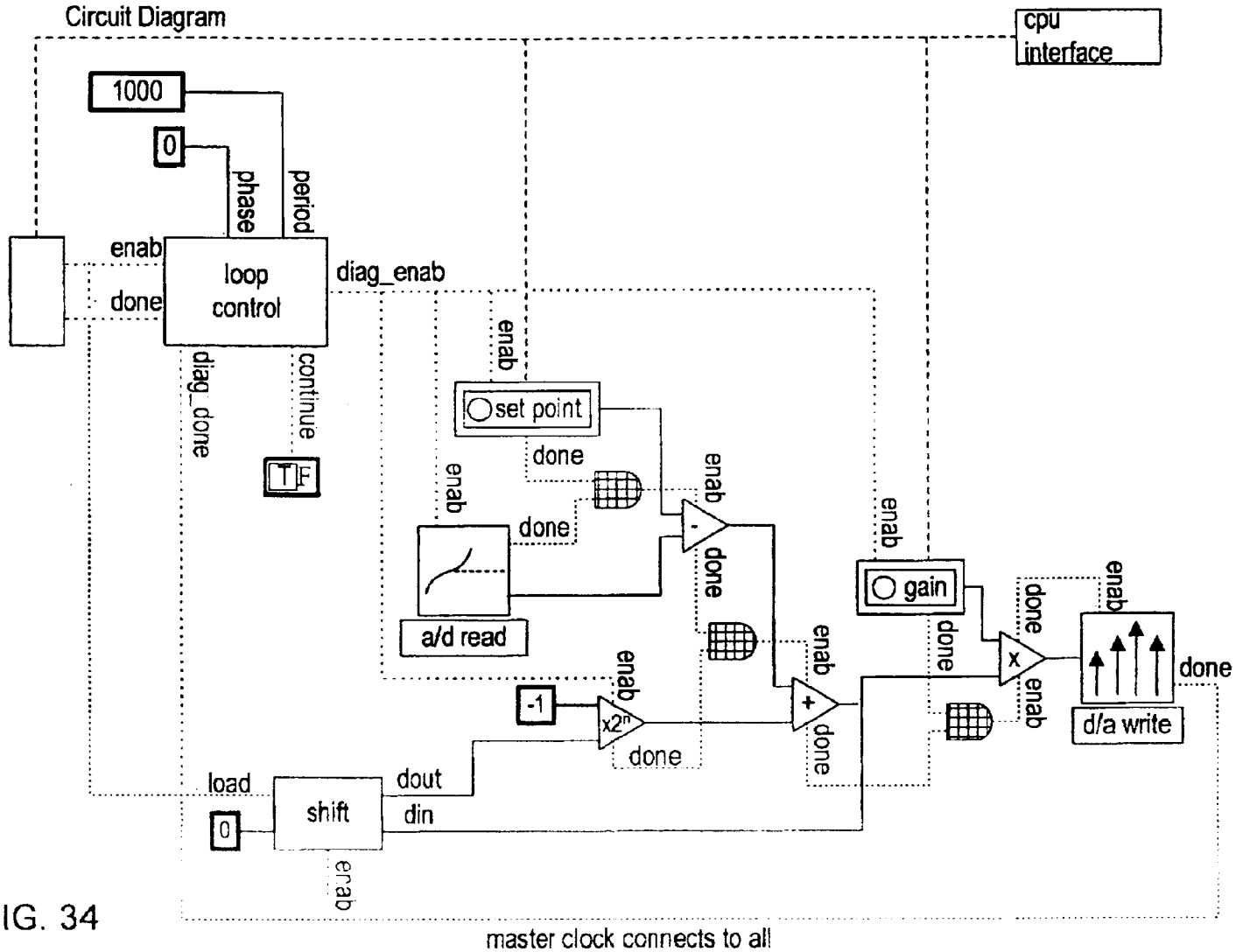
Figure 35:
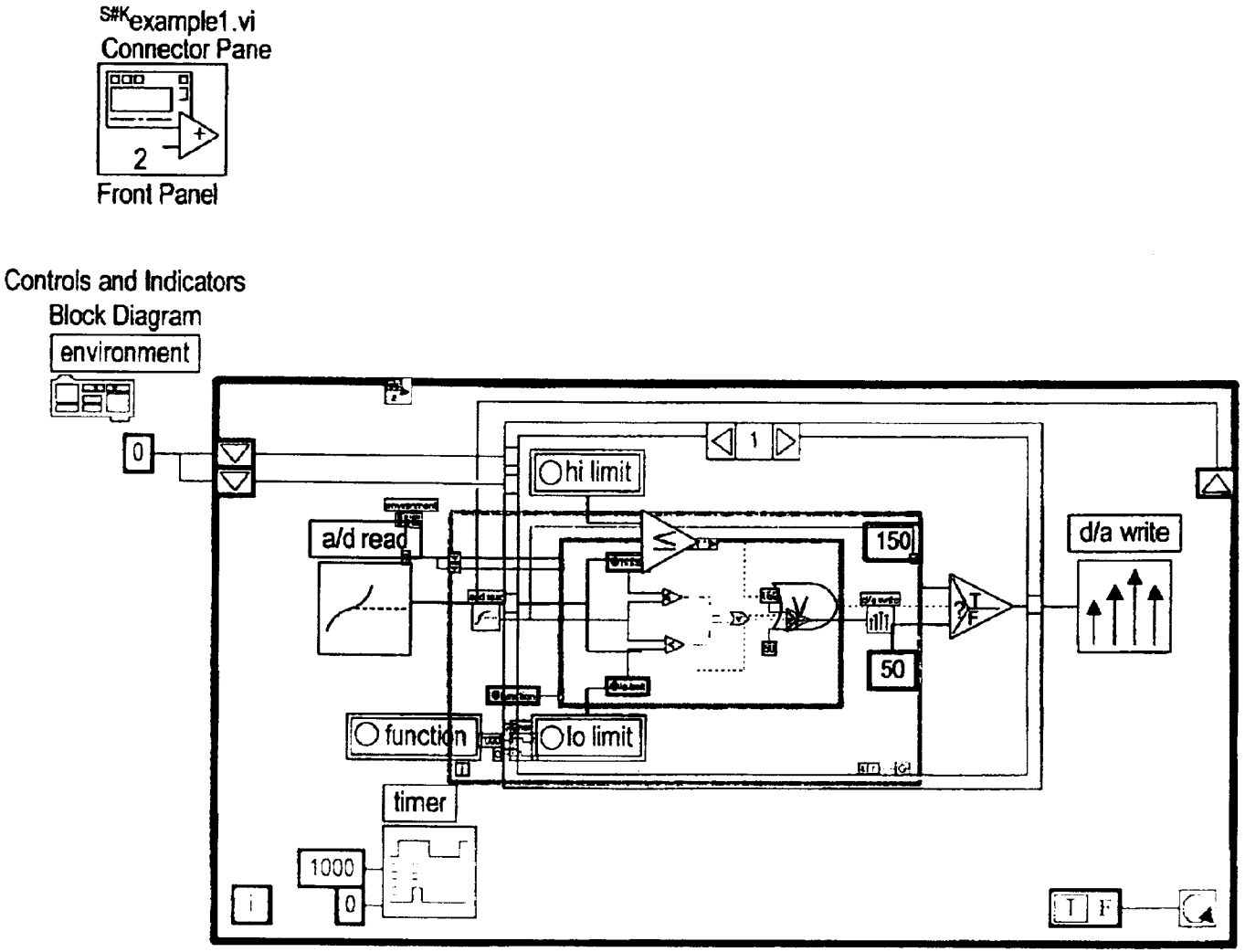
FIGS. 35–36 illustrate a graphical program called example1.vi.
Figure 36:
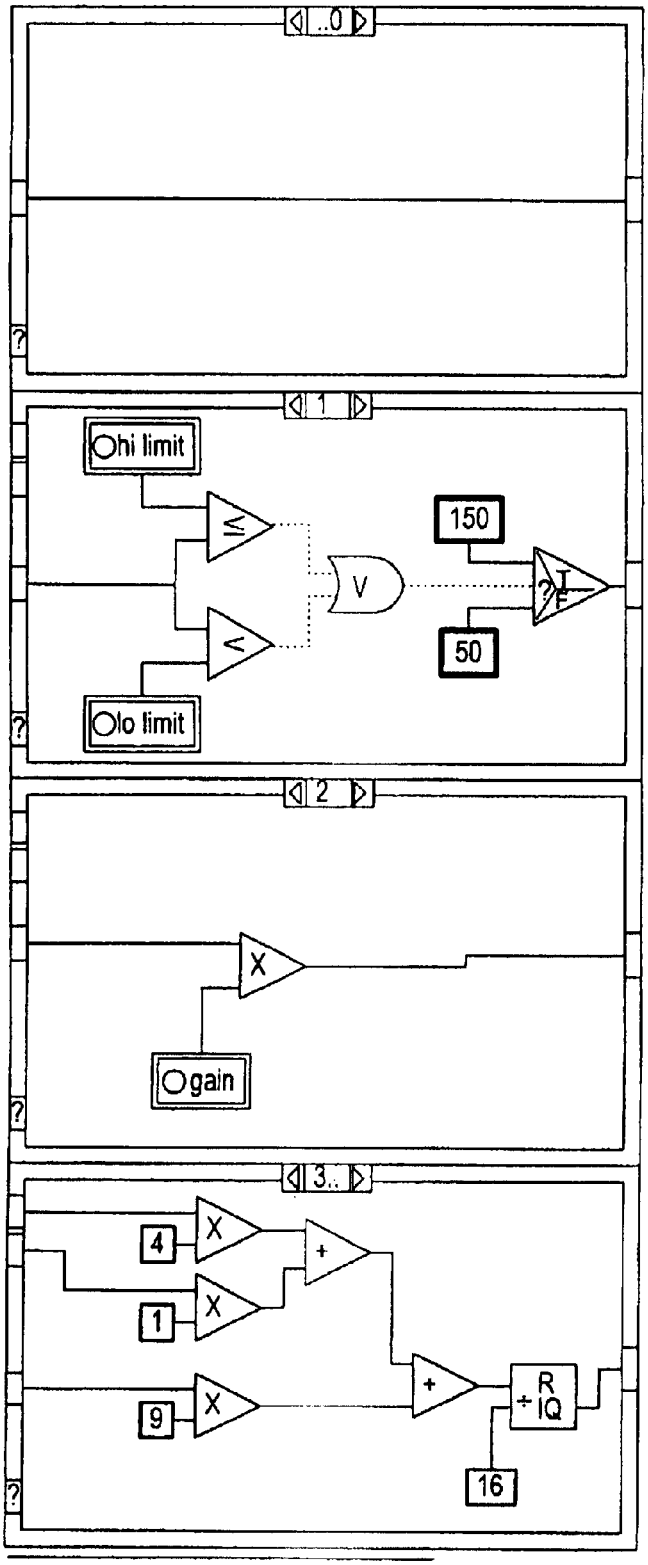

FIGS. 32–34: Example of Converting a Graphical Program into a Hardware Implementation FIGS. 32–34 comprise a more detailed example illustrating operation of the present invention.

FIG. 32 illustrates an example graphical program (a LabVIEW diagram) which is converted into an FPGA implementation using the present invention. As shown, the graphical program comprises a plurality of interconnected nodes comprised in a While loop. As shown, the While loop includes shift register icons, represented by the down and up arrows at the left and right edges, respectively, of the While loop. A 0 constant positioned outside of the While loop is connected to the down arrow of the shift register at the left edge of the While loop.

The While loop includes a timer icon representing or signifying timing for the While loop. The timer icon includes inputs for period and phase. As shown, the timer icon receives a constant of 1000 for the period and receives a constant of 0 for the phase. In an alternate embodiment, the While loop includes input terminals which are configured to receive timing information, such as period and phase.

FIG. 33 illustrates the LabVIEW data structures created in response to or representing the diagram or graphical program of FIG. 32. The data structure diagram of FIG. 33 comprises a hierarchy of data structures corresponding to the diagram of FIG. 32. As shown, the LabVIEW data structure representation includes a top level diagram which includes a single signal connecting the 0 constant to the left hand shift register of the While loop. Thus the top level diagram includes only the constant (0) and the While loop.

The While loop includes a sub-diagram which further includes left and right shift register terms, the continue flag of the While loop, a plurality of constants, a timer including period and phase inputs, global variables setpoint and gain, sub-VIs a/d read and d/a write, and various function icons, e.g., scale, add, subtract, and multiply. Further, each of the objects in the diagram have terminals, and signals connect between these terminals.

As described above, a VDiagram tree is constructed which represents the hardware components and the relationship among them required to convert the program into a hardware implementation. The VDiagram constructor is called for the "Diag" root object of the diagram, shown in FIG. 33. The VDiagram constructor calls a message handler function for each of the objects shown in FIG. 33. Once the VDiagram tree is built, a back end program is called to generate a hardware description using the information in the VDiagram tree.

FIG. 34 illustrates a circuit diagram representing the hardware description which is created in response to the data structures of FIG. 33. The circuit diagram of FIG. 34 implements the graphical program of FIG. 32. As shown, the CPU interface signals are bussed to the global variables. Although not.shown in FIG. 34, the CPU interface signals are also provided to the subprograms a/d read and d/a write.

The While loop is essentially abstracted to a control circuit which receives the period and phase, and includes an external enable directing the top level diagram to execute, which starts the loop. The loop then provides a diagram enable (diag_enab) signal to start the loop and waits for a diagram done (diag_done) signal to signify completion of the loop, or the period to expire. Based on the value of the Continue flag, the loop provides a subsequent diag_enab signal or determines that the loop has finished and provides a Done signal to the top level diagram. Although not shown in FIG. 34, the loop control block also provides a diagram clear enable out (diag_clear_enab_out) signal to every node in the sub-diagram of the While loop. Thus the loop control block outputs a diagram enable (diag_enab) signal that is fed to all of the starting nodes in the diagram within the While loop. The Done signals from these items are fed into an AND gate, whose output is provided to enable subsequent nodes.

The shift register includes a data in, a data out and an enable input which clocks the data in (din) to the data out (dout), and a load which clocks the initial value into the shift register.

Appendix A is a VHDL description corresponding to the example of FIGS. 32–34, wherein the VHDL description was created using the present invention.

Component Library

The preferred embodiment of the present invention includes a component library that is used to aid in converting various primitives or nodes in a graphical program into a hardware description, such as a VHDL source file. The following provides two examples of VHDL components in this component library, these being components for a While loop and a multiplier function.

1. While Loop Component

Appendix B is a source code listing that comprises a VHDL component referred to as whileloop.vhd that the present invention uses when a While loop appears on a graphical program or diagram. Whileloop.vhd shows how a While loop in a graphical program is mapped to a state machine in hardware. It is noted that other control structures such as a "For loop" are similar.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A computer-implemented method for configuring an instrument to perform measurement functions, wherein the instrument includes a programmable hardware element, the method comprising:

creating a graphical program, wherein the graphical program implements a measurement function;

[the] *a* computer system estimating one or more of size and cost of a hardware implementation of the graphical program; and the computer system displaying one or more of the size and cost of the hardware implementation of the graphical program to a user;

generating a hardware description based on at least a portion of the graphical program, wherein the hardware description describes a hardware implementation of the at least a portion of the graphical program;

configuring the programmable hardware element in the instrument utilizing the hardware description to produce a configured hardware element, wherein the configured hardware element implements a hardware implementation of the at least a portion of the graphical program;

the instrument acquiring a signal from an external source after said configuring; and the programmable hardware element in the instrument executing to perform the measurement function on the signal.

2. The method of claim 1, wherein the graphical program comprises a plurality of elements, the method further comprising:

storing a data structure including a listing of each of the elements and a corresponding cost of each element;

wherein said estimating uses said data structure.

3. The method of claim 2, wherein the data structure stores cost in terms of one or more of gates and time of execution.

4. The method of claim 1, further comprising:

determining if the programmable hardware element has sufficient capacity to implement the graphical program in response to said estimating, wherein said determining is performed prior to said generating the hardware description.

5. The method of claim 4, wherein said determining comprises:

totaling the amount of gates utilized with regard to each element being used in the graphical program, and determining if the programmable hardware element has sufficient capacity to implement the graphical program based on the amount of gates.

6. The method of claim 1, further comprising:

determining how fast the graphical program will execute in the programmable hardware element, wherein said determining is performed prior to said generating the hardware description.

7. The method of claim 1, further comprising:

receiving user input regarding desired execution time of the hardware implementation of the graphical program;

determining if the hardware implementation can execute according to the desired execution time, wherein said determining utilizes the execution times of each of the elements;

displaying information to the user indicating whether the graphical program satisfies user input regarding time of execution.

8. The method of claim 1, further comprising:

storing in the memory of the computer system a plurality of components, wherein said plurality of components include a first component of a first type and a second component of the first type, wherein the first component requires a first number of gates and wherein the second component requires a second larger number of gates;

wherein said generating the hardware description includes selecting either said first component or said second component.

9. The method of claim 8, wherein either said first component or said second component is selected based on said estimating.

10. The method of claim 8, further comprising receiving user input indicating desired execution information;

wherein either said first component or said second component is selected based on said user input.

11. The method of claim 10, wherein said desired execution information includes one or more of number of gates comprised in the programmable hardware element and a desired time of execution.

12. The method of claim 8, further comprising:

storing in the memory of the computer system a library of components, wherein said library of components includes slower, less complex versions of components and faster, more complex versions of components;

wherein said generating includes selecting among said slower, less complex versions of components and said faster, more complex versions of components.

13. The method of claim 1, wherein the instrument is selected based on one or more of the size and cost of the hardware implementation of the graphical program.

14. A computer-implemented method for configuring an instrument to perform measurement functions, wherein the instrument includes a programmable hardware element, the method comprising:

creating a graphical program, wherein the graphical program implements a measurement function, wherein the graphical program manipulates one or more hardware resources of the instrument, wherein said creating includes displaying an indication of usage of said one or more hardware resources during creation of the graphical program;

generating a hardware description based on at least a portion of the graphical program, wherein the hardware description describes a hardware implementation of the at least a portion of the graphical program;

configuring the programmable hardware element in the instrument utilizing the hardware description to produce a configured hardware element, wherein the configured hardware element implements a hardware implementation of the at least a portion of the graphical program;

the instrument acquiring a signal from an external source after said configuring;

the programmable hardware element in the instrument executing to perform the measurement function on the signal, wherein said executing includes manipulating one or more of the hardware resources of the instrument.

15. The method of claim 14, wherein said one or more hardware resources comprise non-reusable hardware resources;

wherein said displaying an indication of usage of said one or more hardware resources during creation of the graphical program is designed to prevent a user from erroneously re-using said non-reusable hardware resources.

16. The method of claim 14, wherein said one or more hardware resources comprise non-reusable hardware esources;

wherein said displaying an indication of usage comprises displaying icons representing said one or more hardware resources on a palette during creation of the graphical program;

wherein said icons representing said one or more hardware resources disappear from said palette as said one or more hardware resources are used in the graphical program.

17. The method of claim 16, wherein, in said creating the graphical program, the icons representing said one or more hardware resources may be dragged from the palette into the graphical program.

18. The method of claim 14, wherein the one or more hardware resources include one or more of: A/D converters, D/A converters, timers, counters, clocks, input channels, output channels, and filters.

19. A computer-implemented method for configuring an instrument to perform measurement functions, wherein the instrument includes a programmable hardware element, the method comprising:

creating a graphical program, wherein the graphical program implements a measurement function, wherein the graphical program manipulates a non-reusable hardware resource of the instrument a plurality of times, wherein said creating the graphical program includes:

constructing sequencing in the graphical program, wherein said sequencing prevents the non-reusable hardware resource from being used simultaneously within the graphical program;

generating a hardware description based on at least a portion of the graphical program, wherein the hardware description describes a hardware implementation of the at least a portion of the graphical program;

configuring the programmable hardware element in the instrument utilizing the hardware description to produce a configured hardware element, wherein the configured hardware element implements a hardware implementation of the at least a portion of the graphical program;

the instrument acquiring a signal from an external source after said configuring;

the programmable hardware element in the instrument executing to perform the measurement function on the signal, wherein said executing includes manipulating the non-reusable resource of the instrument a plurality of times according to said sequencing.

20. The computer-implemented method of claim 19, wherein said constructing sequencing is performed using a sequence structure.

21. The method of claim 19, further comprising:

exporting at least a portion of the graphical program into a hardware description, wherein the hardware description describes a hardware implementation of the at least a portion of the graphical program;

wherein said exporting includes utilizing at least one multiplexer to multiplex control and data inputs to the non-reusable hardware resource with signals to guarantee that simultaneous accesses are impossible, as indicated by the sequencing.

22. A computer-implemented method for configuring a programmable hardware element to perform a function, the method comprising:

creating a graphical program, wherein the graphical program comprises a plurality of interconnected nodes which visually indicate functionality of the program, wherein the graphical program specifies a function;

[the] *a* computer system estimating one or more of size and cost of a hardware implementation of the graphical program;

the computer system displaying one or more of the size and cost of the hardware implementation of the graphical program to a user;

generating a hardware description based on at least a portion of the graphical program, wherein the hardware description describes a hardware implementation of the at least a portion of the graphical program; and configuring the programmable hardware element utilizing the hardware description to produce a configured programmable hardware element, wherein the configured programmable hardware element implements a hardware implementation of the at least a portion of the graphical program.

23. The method of claim 22, further comprising:

the configured programmable hardware element executing to perform the function.

24. The method of claim 22, wherein the programmable hardware element is comprised in a device, wherein the device includes an input for receiving a signal;

the method further comprising:

the device acquiring a signal from an external source after said configuring; and the configured programmable hardware element in the device executing to perform the function using the signal.

25. The method of claim 22, wherein the graphical program comprises a plurality of elements, the method further comprising:

storing a data structure including a listing of each of the elements and a corresponding cost of each element;

wherein said estimating uses said data structure.

26. The method of claim 25, wherein the data structure stores cost in terms of one or more of gates and time of execution.

27. The method of claim 22, further comprising:

determining if the programmable hardware element has sufficient capacity to implement the graphical program in response to said estimating, wherein said determining is performed prior to said generating the hardware description.

28. The method of claim 27, wherein said determining comprises:

totaling the amount of gates utilized with regard to each element being used in the graphical program; and determining if the programmable hardware element has sufficient capacity to implement the graphical program based on the amount of gates.

29. The method of claim 22, further comprising:

determining how fast the graphical program will execute in the programmable hardware element, wherein said determining is performed prior to said generating the hardware description.

30. The method of claim 22, further comprising:

receiving user input regarding desired execution time of the hardware implementation of the graphical program;

determining if the hardware implementation can execute according to the desired execution time, wherein said determining utilizes the execution times of each of the elements;

displaying information to the user indicating whether the graphical program satisfies the user input regarding time of execution.

31. The method of claim 22, further comprising:

storing in the memory of the computer system a plurality of components, wherein said plurality of components include a first component of a first type and a second component of the first type, wherein the first component requires a first number of gates and wherein the second component requires a second larger number of gates;

wherein said generating the hardware description includes selecting either said first component or said second component.

32. The method of claim 31, wherein either said first component or said second component is selected based on said estimating.

33. The method of claim 31, further comprising:

receiving user input indicating desired execution information;

wherein either said first component or said second component is selected based on said user input.

34. The method of claim 33, wherein said desired execution information includes one or more of number of gates comprised in the programmable hardware element and a desired time of execution.

35. The method of claim 31, further comprising:

storing in the memory of the computer system a library of components, wherein said library of components includes slower, less complex versions of components and faster, more complex versions of components;

wherein said generating includes selecting among said slower, less complex versions of components and said faster, more complex versions of components.

36. The method of claim 22, wherein the graphical program comprises a data flow diagram.

37. A computer-implemented method for configuring a device to perform a function, wherein the device includes a programmable hardware element, wherein the device also includes one or more hardware resources, the method comprising:

creating a graphical program, wherein the graphical program comprises a plurality of interconnected nodes which visually indicate functionality of the program, wherein the graphical program implements a function, wherein the graphical program manipulates one or more hardware resources of the device, wherein said creating includes displaying an indication of usage of said one or more hardware resources during creation of the graphical program;

generating a hardware description based on at least a portion of the graphical program, wherein the hardware description describes a hardware implementation of the at least a portion of the graphical program;

configuring the programmable hardware element in the device utilizing the hardware description to produce a configured programmable hardware element, wherein the configured programmable hardware element implements a hardware implementation of the at least a portion of the graphical program;

the device executing, wherein the device executing includes the configured programmable hardware element in the device executing to perform the function, wherein said executing includes manipulating one or more of the hardware resources of the device.

38. The method of claim 37, further comprising:

the device acquiring a signal from an external source after said configuring;

the configured programmable hardware element in the device executing to perform the function on the signal, wherein said executing includes manipulating one or more of the hardware resources of the device.

39. The method of claim 37, wherein said one or more hardware resources comprise non-reusable hardware resources;

wherein said displaying an indication of usage of said one or more hardware resources during creation of the graphical program is designed to prevent a user from erroneously re-using said non-reusable hardware resources.

40. The method of claim 37, wherein said displaying an indication of usage of said one or more hardware resources during creation of the graphical program is designed to prevent a user from creating the graphical program to use a hardware resource two or more time simultaneously during execution of the graphical program.

41. The method of claim 37, wherein said displaying an indication of usage comprises displaying icons representing said one or more hardware resources on a palette during creation of the graphical program;

wherein said icons representing said one or more hardware resources disappear from said palette as said one or more hardware resources are used in the graphical program.

42. The method of claim 37, further comprising:

displaying a palette comprising icons representing said one or more hardware resources during creation of the graphical program;

wherein, in said creating the graphical program, the icons representing said one or more hardware resources may be dragged from the palette into the graphical program.

43. The method of claim 37, wherein said displaying an indication of usage comprises displaying icons representing said one or more hardware resources on a palette during creation of the graphical program;

wherein said displaying comprises altering said icons in said palette to visually indicate the one or more hardware resources being used in the graphical program.

44. The method of claim 37, wherein the one or more hardware resources include one or more of: A/D converters, D/A converters, timers, counters, clocks, input channels, output channels, and filters.

45. The method of claim 37, wherein the graphical program comprises a data flow diagram.

46. A computer-implemented method for configuring a device, wherein the device includes a programmable hardware element, wherein the device also includes at least one hardware resource, the method comprising:

creating a graphical program, wherein the graphical program implements a function, wherein the graphical program manipulates a first hardware resource of the device a plurality of times, wherein said creating the graphical program includes:

constructing sequencing in the graphical program, wherein said sequencing prevents the first hardware resource from being used two or more times simultaneously within the graphical program;

generating a hardware description based on at least a portion of the graphical program, wherein the hardware description describes a hardware implementation of the at least a portion of the graphical program;

configuring the programmable hardware element in the device utilizing the hardware description to produce a configured programmable hardware element, wherein the configured programmable hardware element implements a hardware implementation of the at least a portion of the graphical program.

47. The method of claim 46, further comprising:

the configured programmable hardware element in the device executing, wherein said executing includes manipulating the first hardware resource of the device a plurality of times according to said sequencing.

48. The method of claim 46, further comprising:

the device acquiring a signal from an external source after said configuring;

the configured programmable hardware element in the device executing to perform a function on the signal, wherein said executing includes manipulating the first hardware resource of the device a plurality of times according to said sequencing.

49. The method of claim 46, wherein said generating a hardware description includes utilizing at least one multiplexer to multiplex control and data inputs to the first hardware resource with signals to provide that simultaneous accesses are not performed, as indicated by the sequencing.

50. The method of claim 46, wherein the graphical program comprises a data flow diagram; and wherein said constructing sequencing operates to specify a sequence of execution of portions of the data flow diagram.

51. The computer-implemented method of claim 46, wherein said constructing sequencing is performed using a sequence structure.

52. The computer-implemented method of claim 51, wherein the sequence structure comprises a plurality of frames, wherein each of the frames includes a portion of graphical code that utilizes the first hardware resource;

wherein the sequence structure specifies a sequencing of the frames to prevent simultaneous execution of the portions of graphical code comprised within the frames.

53. The computer-implemented method of claim 51, wherein the graphical program comprises a data flow diagram;

wherein the sequence structure comprises a plurality of frames, wherein each of the frames includes a portion of the data flow diagram that utilizes the first hardware resource;

wherein the sequence structure specifies a sequencing of the frames to prevent simultaneous execution of the portions of the data flow diagram comprised within the frames.

54. A memory medium comprising program instructions for configuring a programmable hardware element to perform a function, wherein the memory medium stores a graphical program, wherein the graphical program comprises a plurality of interconnected nodes which visually indicate functionality of the program, wherein the graphical program specifies a function;

wherein the program instructions are executable to implement:

estimating one or more of size and cost of a hardware implementation of the graphical program;

displaying one or more of the size and cost of the hardware implementation of the graphical program to a user;

generating a hardware description based on at least a portion of the graphical program, wherein the hardware description describes a hardware implementation of the at least a portion of the graphical program; and configuring the programmable hardware element utilizing the hardware description to produce a configured programmable hardware element, wherein the configured programmable hardware element implements a hardware implementation of the at least a portion of the graphical program.

55. The memory medium of claim 54, wherein the configured programmable hardware element is operable to execute to perform the function.

56. The memory medium of claim 54, wherein the programmable hardware element is comprised in a device, wherein the device includes an input for receiving a signal;

wherein the device is operable to acquire a signal from an external source after being configured; and wherein the configured programmable hardware element in the device is operable to execute to perform the function using the signal.

57. The memory medium of claim 54, wherein the graphical program comprises a plurality of elements;

wherein the program instructions comprise a data structure including a listing of each of the elements and a corresponding cost of each element;

wherein said estimating uses said data structure.

58. The memory medium of claim 57, wherein the data structure stores cost in terms of one or more of gates and time of execution.

59. The memory medium of claim 54, wherein the program instructions are further executable to implement:

determining if the programmable hardware element has sufficient capacity to implement the graphical program in response to said estimating, wherein said determining is performed prior to said generating the hardware description.

60. The memory medium of claim 59, wherein said determining comprises:

totaling the amount of gates utilized with regard to each element being used in the graphical program; and determining if the programmable hardware element has sufficient capacity to implement the graphical program based on the amount of gates.

61. The memory medium of claim 54, wherein the program instructions are further executable to implement:

determining how fast the graphical program will execute in the programmable hardware element, wherein said determining is performed prior to said generating the hardware description.

62. The memory medium of claim 54, wherein the program instructions are further executable to implement:

receiving user input regarding desired execution time of the hardware implementation of the graphical program;

determining if the hardware implementation can execute according to the desired execution time, wherein said determining utilizes the execution times of each of the elements;

displaying information to the user indicating whether the graphical program satisfies the user input regarding time of execution.

63. The memory medium of claim 54, wherein the memory medium stores a plurality of components, wherein said plurality of components include a first component of a first type and a second component of the first type, wherein the first component requires a first number of gates and wherein the second component requires a second larger number of gates;

wherein said generating the hardware description includes selecting either said first component or said second component.

64. The memory medium of claim 63, wherein either said first component or said second component is selected based on said estimating.

65. The memory medium of claim 63, wherein the program instructions are further executable to implement:

receiving user input indicating desired execution information;

wherein either said first component or said second component is selected based on said user input.

66. The memory medium of claim 65, wherein said desired execution information includes one or more of number of gates comprised in the programmable hardware element and a desired time of execution.

67. The memory medium of claim 63, wherein the memory medium stores a library of components, wherein said library of components includes slower, less complex versions of components and faster, more complex versions of components;

wherein said generating includes selecting among said slower, less complex versions of components and said faster, more complex versions of components.

68. The memory medium of claim 54, wherein the graphical program comprises a data flow diagram.

69. A memory medium comprising program instructions for configuring a device to perform a function, wherein the device includes a programmable hardware element, wherein the device also includes one or more hardware resources, wherein the program instructions are executable to implement:

creating a graphical program, wherein the graphical program comprises a plurality of interconnected nodes which visually indicate functionality of the program, wherein the graphical program implements a function, wherein the graphical program manipulates one or more hardware resources of the device, wherein said creating includes displaying an indication of usage of said one or more hardware resources during creation of the graphical program;

generating a hardware description based on at least a portion of the graphical program, wherein the hardware description describes a hardware implementation of the at least a portion of the graphical program;

configuring the programmable hardware element in the device utilizing the hardware description to produce a configured programmable hardware element, wherein the configured programmable hardware element implements a hardware implementation of the at least a portion of the graphical program.

70. The memory medium of claim 69, wherein the device is operable to execute, wherein execution of the device includes the configured programmable hardware element in the device executing to perform the function, wherein during execution the configured programmable hardware element manipulates one or more of the hardware resources of the device.

71. The memory medium of claim 69, wherein said one or more hardware resources comprise non-reusable hardware resources;

wherein said displaying an indication of usage of said one or more hardware resources during creation of the graphical program is designed to prevent a user from erroneously re-using said non-reusable hardware resources.

72. The memory medium of claim 69, wherein said displaying an indication of usage of said one or more hardware resources during creation of the graphical program is designed to prevent a user from configuring the graphical program to simultaneously accessing a hardware resource from two or more locations in the graphical program.

73. The memory medium of claim 69, wherein said displaying an indication of usage comprises displaying icons representing said one or more hardware resources on a palette during creation of the graphical program;

wherein said icons representing said one or more hardware resources disappear from said palette as said one or more hardware resources are used in the graphical program.

74. The memory medium of claim 73, wherein, in said creating the graphical program, the icons representing said one or more hardware resources may be dragged from the palette into the graphical program.

75. The memory medium of claim 69, wherein said displaying an indication of usage comprises displaying icons representing said one or more hardware resources on a palette during creation of the graphical program;

wherein said displaying comprises altering said icons in said palette to visually indicate the one or more hardware resources being used in the graphical program.

76. The memory medium of claim 69, wherein the program instructions are further executable to implement:

displaying a palette comprising icons representing said one or more hardware resources during creation of the graphical program;

wherein, in said creating the graphical program, the icons representing said one or more hardware resources may be dragged from the palette into the graphical program.

77. The memory medium of claim 69, wherein the one or more hardware resources include one or more of: A/D converters, D/A converters, timers, counters, clocks, input channels, output channels, and filters.

78. The memory medium of claim 69, wherein the graphical program comprises a data flow diagram.

79. A memory medium comprising program instructions for configuring a device, wherein the device includes a programmable hardware element, wherein the device also includes at least one hardware resource, the memory medium comprising:

creating a graphical program, wherein the graphical program implements a function, wherein the graphical program manipulates a first hardware resource of the device a plurality of times, wherein said creating the graphical program includes:

constructing sequencing in the graphical program, wherein said sequencing prevents the first hardware resource from being used two or more times simultaneously within the graphical program;

generating a hardware description based on at least a portion of the graphical program, wherein the hardware description describes a hardware implementation of the at least a portion of the graphical program; and configuring the programmable hardware element in the device utilizing the hardware description to produce a configured programmable hardware element, wherein the configured programmable hardware element implements a hardware implementation of the at least a portion of the graphical program.

80. The memory medium of claim 79, wherein the configured programmable hardware element in the device is executable to manipulate the first hardware resource of the device a plurality of times according to said sequencing.

81. The memory medium of claim 79, wherein the device is operable to acquire a signal from an external source after said configuring;

wherein the configured programmable hardware element in the device is executable to perform a function on the signal, wherein said executing includes manipulating the first hardware resource of the device a plurality of times according to said sequencing.

82. The memory medium of claim 79, wherein the graphical program comprises a data flow diagram.

83. The memory medium of claim 82, wherein said constructing sequencing operates to specify a sequence of execution of portions of the data flow diagram.

84. The computer-implemented memory medium of claim 79, wherein said constructing sequencing is performed using a sequence structure.

85. The computer-implemented memory medium of claim 84, wherein the sequence structure comprises a plurality of frames, wherein each of the frames includes a portion of graphical code that utilizes the first hardware resource;

wherein the sequence structure specifies a sequencing of the frames to prevent simultaneous execution of the portions of graphical code comprised within the frames.

86. The computer-implemented memory medium of claim 84, wherein the graphical program comprises a data flow diagram;

wherein said constructing sequencing is performed using a sequence structure, wherein the sequence structure comprises a plurality of frames, wherein each of the frames includes a portion of the data flow diagram that utilizes the first hardware resource;

wherein the sequence structure specifies a sequencing of the frames to prevent simultaneous execution of the portions of the data flow diagram comprised within the frames.

87. The memory medium of claim 79, wherein said generating a hardware description includes utilizing at least one multiplexer to multiplex control and data inputs to the first hardware resource with signals to provide that simultaneous accesses are not performed, as indicated by the sequencing.

* * * * *